US008902635B2

United States Patent
Kawahara et al.

(10) Patent No.: US 8,902,635 B2
(45) Date of Patent: Dec. 2, 2014

(54) VARIABLE RESISTANCE NONVOLATILE MEMORY DEVICE AND METHOD OF WRITING THEREBY

(71) Applicant: Panasonic Corporation, Osaka (JP)

(72) Inventors: Akifumi Kawahara, Kyoto (JP); Ryotaro Azuma, Osaka (JP); Kazuhiko Shimakawa, Osaka (JP); Kouhei Tanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 13/990,280

(22) PCT Filed: Nov. 26, 2012

(86) PCT No.: PCT/JP2012/007569
§ 371 (c)(1),
(2), (4) Date: May 29, 2013

(87) PCT Pub. No.: WO2013/080511
PCT Pub. Date: Jun. 6, 2013

(65) Prior Publication Data
US 2014/0112055 A1    Apr. 24, 2014

(30) Foreign Application Priority Data
Nov. 29, 2011   (JP) .................. 2011-261019

(51) Int. Cl.
*G11C 13/00*   (2006.01)
(52) U.S. Cl.
CPC ............ *G11C 13/0069* (2013.01); *G11C 13/00* (2013.01); *G11C 13/0002* (2013.01)
USPC ........................................................ 365/148
(58) Field of Classification Search
None
See application file for complete search history.

(56) References Cited

U.S. PATENT DOCUMENTS

| 6,587,371 B1 | 7/2003 | Hidaka |
| 6,680,862 B2 | 1/2004 | Hidaka |
| 7,218,570 B2 | 5/2007 | So et al. |

(Continued)

FOREIGN PATENT DOCUMENTS

| JP | 2002-260378 | 9/2002 |
| JP | 2008-52781 | 3/2008 |

(Continued)

OTHER PUBLICATIONS

International Search Report issued Jan. 8, 2013 in International Application No. PCT/JP2012/007569.

*Primary Examiner* — James G Norman
(74) *Attorney, Agent, or Firm* — Wenderoth, Lind & Ponack, LLP

(57) ABSTRACT

Provided is a variable resistance nonvolatile memory device that achieves, in multi-bit simultaneous writing for increasing a writing speed, writing with little variation caused by positions of memory cells in multi-bit simultaneous writing. The variable resistance nonvolatile memory device includes bit lines, word lines, memory cells, a first write circuit (e.g., a write circuit (60-0)), a second write circuit (e.g., a write circuit (60-k-1)), a first selection circuit (e.g., a selection circuit (S0_0)), a second selection circuit (e.g., a selection circuit (S0_k-1)), and a first word line drive circuit (a word line drive circuit (40-1)), wherein the first selection circuit (e.g., an NMOS transistor (TS0_0_0 to TS0_0_m-1) included in the selection circuit) has a greater ON resistance than the second selection circuit (e.g., an NMOS transistor (TS0_k-1_0 to TS0_k-1_m-1) included in the selection circuit) does.

16 Claims, 48 Drawing Sheets

(56) References Cited

U.S. PATENT DOCUMENTS

| | | |
|---|---|---|
| 7,542,326 B2 | 6/2009 | Yoshimura et al. |
| 8,085,576 B2 | 12/2011 | Hosono et al. |
| 8,194,434 B2 | 6/2012 | Toda |
| 8,295,070 B2 | 10/2012 | Fukano |
| 8,338,816 B2 | 12/2012 | Kanzawa et al. |
| 8,345,466 B2 | 1/2013 | Maejima et al. |
| 2003/0202407 A1 | 10/2003 | Hidaka |
| 2006/0133125 A1 | 6/2006 | So et al. |
| 2008/0049487 A1 | 2/2008 | Yoshimura et al. |
| 2010/0188884 A1 | 7/2010 | Mitani et al. |
| 2010/0207094 A1 | 8/2010 | Kanzawa et al. |
| 2010/0214820 A1* | 8/2010 | Hosono et al. ............... 365/148 |
| 2011/0032746 A1 | 2/2011 | Maejima et al. |
| 2011/0044088 A1 | 2/2011 | Muraoka et al. |
| 2011/0051492 A1 | 3/2011 | Toda |
| 2011/0164444 A1 | 7/2011 | Fukano |

FOREIGN PATENT DOCUMENTS

| | | |
|---|---|---|
| JP | 4469022 | 5/2010 |
| JP | 2010-198687 | 9/2010 |
| JP | 4545823 | 9/2010 |
| JP | 4555397 | 9/2010 |
| JP | 2011-54246 | 3/2011 |
| JP | 2011-54259 | 3/2011 |
| JP | 4712204 | 6/2011 |
| JP | 2011-142186 | 7/2011 |
| WO | 2010/021134 | 2/2010 |

* cited by examiner

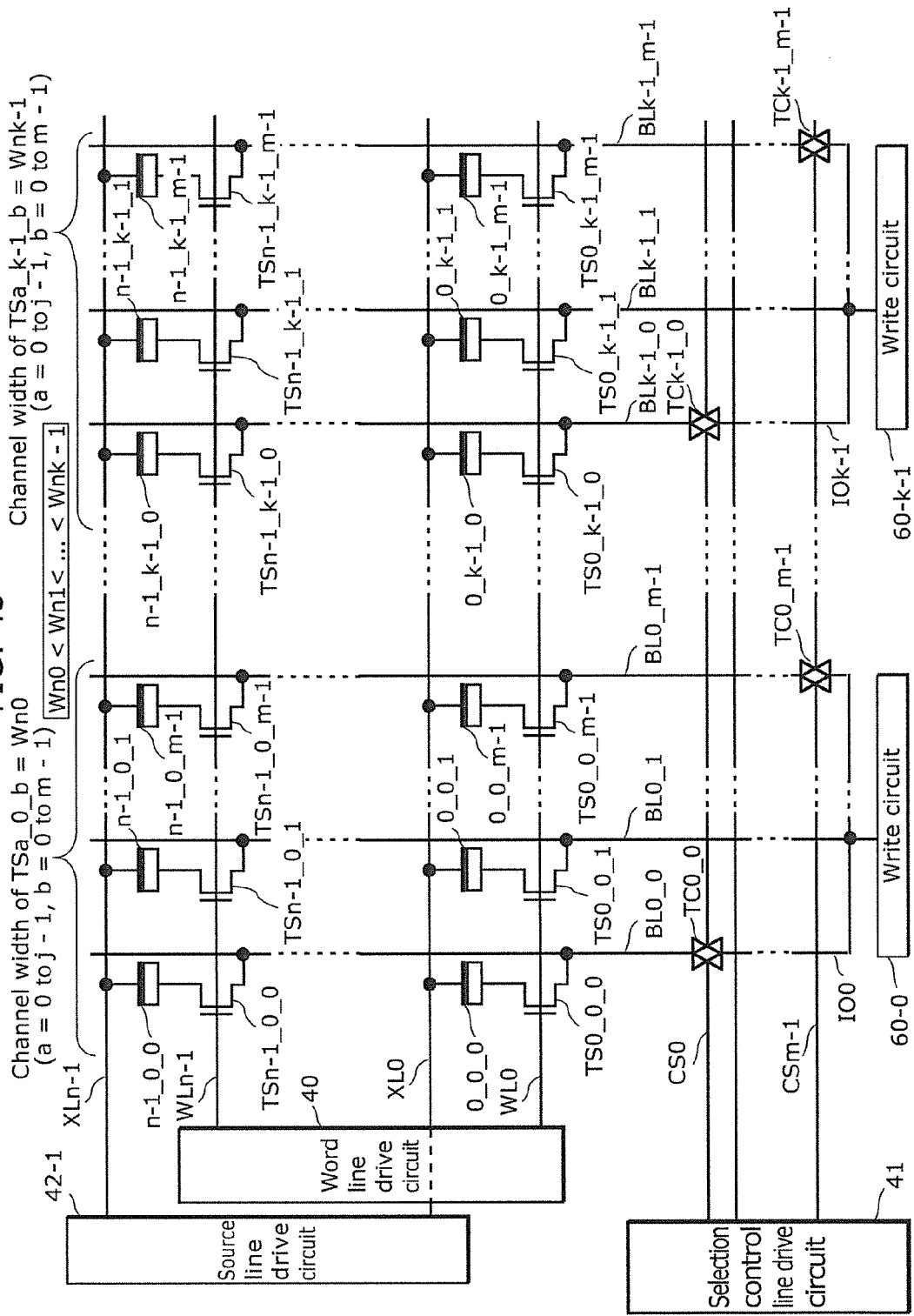

VARIABLE RESISTANCE NONVOLATILE MEMORY DEVICE AND METHOD OF WRITING THEREBY

TECHNICAL FIELD

The present invention relates to a nonvolatile memory device having memory cells including variable resistance elements, and so on.

BACKGROUND ART

In recent years, research and development are conducted on a nonvolatile memory device (hereinafter also referred to as a "variable resistance nonvolatile memory device" or simply as a "nonvolatile memory device") having memory cells including variable resistance elements. A variable resistance element is an element that has a property that a resistance value changes (changes between a high resistance state and a low resistance state) according to an electrical signal and enables information to be written through this change in resistance value.

Examples of a structure of memory cells including variable resistance elements include two types: 1T1R structure and cross point structure. In the 1T1R structure, memory cells each of which includes one variable resistance element and one selection transistor for selecting the memory cell using a word line are connected between bit lines and source lines arranged to cross each other. On the other hand, in the cross point structure, each memory cell is placed at a different one of cross points of bit lines and word lines arranged to cross each other, so as to be provided between a bit line and a word line. Various types of such variable resistance nonvolatile memory devices are developed in recent years (see Patent Literatures (PTLs) 1 to 3, for instance).

PTL 1 discloses a nonvolatile memory device including memory cells having the 1T1R structure. In PTL 1, drive positions of a bit line and a source line are placed at opposite sides across a memory cell array with a view to reducing a variation in memory cell current (i.e., current flowing through a memory cell) at a time of reading regardless of a position of a selected memory cell, and achieving stable reading. In addition, PTL 1 discloses that the both lines are formed in the same layer and the same shape and of the same material to have the same sheet resistance, thereby keeping constant a sum of resistances of the source line and the bit line in a path of a memory cell current regardless of a position of a memory cell and achieving the stable reading.

PTL 2 discloses a nonvolatile memory device including memory cells having the cross point structure, and has an object to remove an influence of a voltage drop caused by a wiring resistance (i.e., parasitic resistance) of a word line and a bit line on each memory cell, and to ensure a write operation margin and a read operation margin. PTL 2 also discloses, as a structure of a power circuit that generates a bias in writing and reading, successfully compensating a voltage drop due to a difference in position between a far end and a near end from a drive circuit of a memory cell to be accessed, by setting a reference current value for determining an applied voltage value or a memory cell current to a memory cell so that the voltage drop caused by the wiring resistance is compensated for each position of word line drive circuits or bit line drive circuits to be activated (i.e., selected) based on an address of a selected memory cell.

PTL 3 discloses a technique of increasing, for an upper layer, a channel width of a drive circuit that drives bit lines and word lines, so as to reduce a voltage drop of upper-layer memory cells caused by resistance of vias for connecting bit lines and word lines, and to minimize an increase of a drive circuit region in a nonvolatile memory device including memory cells having a multilayer cross point structure.

According to PTLs 1 to 3 described above, it is possible to reduce characteristic variation of memory cells at a time of writing, by offsetting dependency of characteristics and operation of a nonvolatile memory device on positions of the memory cells. (Hereinafter the dependency is also referred to as "memory cell position dependency.")

In contrast, already proposed is a method of enhancing a parallel degree of writing and throughput by simultaneously writing bits on a selected source line or word line (hereinafter such writing is also referred to as "mufti-bit simultaneous writing") so that writing whose speed is faster than existing flash memories is achieved by taking advantage of high-speed resistance change which is a feature of memory cells including variable resistance elements.

CITATION LIST

Patent Literature

[PTL 1]
  Japanese Patent No. 4712204 (FIG. 2)
[PTL 2]
  U.S. Pat. No. 7,218,570 Specification (FIG. 1)
[PTL 3]
  Japanese Unexamined Patent Application Publication No. 2011-142186 (FIG. 19)

SUMMARY OF INVENTION

Technical Problem

Enhancement of a parallel degree by multi-bit simultaneous writing is one of effective methods for increasing a write transfer speed. However, the multi-bit simultaneous writing has a problem caused by wiring resistance of a word line or a source line. For example, in the mufti-bit simultaneous writing, simultaneous writing is performed on memory cells connected to a common word line, but each of the memory cells is placed at a different one of corresponding positions having different distances from a word line drive circuit (i.e., wiring resistance). For this reason, in the multi-bit simultaneous writing using the common word line, a variation in memory cell current occurring in the memory cells causes a failure of resistance change in the memory cells and so on, which reduces reliability in the multi-bit simultaneous writing.

To solve this problem, at a time of writing, it is necessary to remove, for instance, memory cell position dependency of a memory cell current flowing at a time of low resistance writing.

Here, PTLs 1 to 3 disclose a technique of reducing characteristic variation at a time of reading and at a time of writing, in terms of ensuring an operation margin.

However, the structure of PTL 1 requires that a VL application source for writing and a 0V application source be placed on opposite sides across a memory cell, and thus has significant limitations of layout. In addition, in PTL 1, memory cell position dependency of a potential in one word line as described in this example is not considered, and thus a memory cell current varies in a low resistance state at a time of multi-bit simultaneous writing. As a result, it is difficult to employ multi-bit simultaneous writing as a measure to increase a writing speed.

In PTL 2, although a reference current value for determining an applied voltage value or a memory cell current to a memory cell to be accessed is adjusted depending on a position of the memory cell, when low resistance writing is simultaneously performed on plural bits (memory cells) on one word line, it is necessary to simultaneously output an optimal applied voltage or reference current for each of positions of the memory cells, and for this reason an increase of circuit and an increase of layout concur.

In PTL 3, in comparison with a case where the number of bits to be simultaneously written is provided from one word line, a response to (change in) processing is required, because, to increase a writing speed, it is necessary to stack as many layers as the number of bits to be simultaneously written, and thus it is extremely difficult to apply the technique of PTL 3 to the multi-bit simultaneous writing.

As stated above, it is difficult to apply any of the techniques of PTLs 1 to 3 to the multi-bit simultaneous writing, or such application causes a harmful effect of some kind.

The present invention intends to solve the problems in the conventional techniques, and an object of the present invention is to provide a variable resistance nonvolatile memory device that has almost no limitation in terms of layout, design, and processing, and successfully achieves, in multi-bit simultaneous writing for increasing a writing speed, writing with little variation caused by positions of memory cells, and so on.

Solution to Problem

In order to solve the conventional problems, a variable resistance nonvolatile memory device according to an aspect of the present invention includes: a plurality of bit lines; a plurality of word lines that cross the bit lines; a plurality of memory cells at cross points of the bit lines and the word lines, the memory cells each including at least a variable resistance element and reversibly changing at least between a first resistance state and a second resistance state; a first write circuit that applies a write voltage to a first bit line that is at least one of the bit lines, where, among the memory cells, memory cells connected to the first bit line are grouped together as a first memory cell array; a second write circuit that applies a write voltage to a second bit line that is at least one of the bit lines and is different from the first bit line, where, among the memory cells, memory cells connected to the second bit line are grouped together as a second memory cell array; a first selection circuit that connects or disconnects at least one of the first write circuit and the first bit line; a second selection circuit that connects or disconnects at least one of the second write circuit and the second bit line; and a first word line drive circuit that selectively drives the word lines, wherein the memory cells include a memory cell for data storage and a memory cell not for data storage, the first write circuit and the second write circuit simultaneously apply the write voltage to the first bit line and the second bit line, respectively, memory cells to which the first write circuit and the second write circuit simultaneously write include the memory cell for data storage and the memory cell not for data storage that are on a same word line, the first memory cell array is placed closer to the first word line drive circuit than the second memory cell array is, and a first ON resistance is greater than a second ON resistance, the first ON resistance being a resistance value of the first selection circuit when the first selection circuit connects the first write circuit and the first bit line, and the second ON resistance being a resistance value of the second selection circuit when the second selection circuit connects the second write circuit and the second bit line.

Moreover, in order to solve the conventional problems, a method for calculating an ON resistance of a selection circuit in a variable resistance nonvolatile memory device according to another aspect of the present invention includes, where, in the variable resistance nonvolatile memory device having a k number of memory cell arrays commonly connected to a plurality of word lines and placed in order from a word line drive circuit, a wiring resistance of each of word lines in respective (k−1) blocks obtained by dividing the word lines by the k memory cell arrays is RWL, an ON resistance of a first selection circuit is R(1), and a current that flows through the selected memory cell has a first low resistance switching current IO, the first selection circuit connecting a write circuit and a selected memory cell that is a memory cell selected in a first memory cell array closest to the word line drive circuit, and the current flowing when the selected memory cell changes from a second resistance state to a first resistance state in which the selected memory cell has a resistance value less than a resistance value of the selected memory cell in the second resistance state, setting ON resistances of first to k-th selection circuits and causing first to k-th low resistance switching currents to be approximately equal to each other, by calculating, as a sum of voltage drops in the word lines in the respective blocks, a voltage drop VW(h) in the word lines between the word line drive circuit and an h-th (1≤h≤k) memory cell array, using at least a product of IO and RWL and a variable h, and by calculating an ON resistance R(h) of an h-th selection circuit that connects the write circuit and a memory cell selected in the h-th memory cell array, using at least IO, R(1), and VW(h), the first to k-th selection circuits respectively corresponding to first to k-th memory cell arrays, and the first to k-th low resistance switching currents respectively corresponding to the first to k-th memory cell arrays.

Furthermore, in order to solve the conventional problems, a method for writing for a variable resistance nonvolatile memory device according to still another aspect of the present invention includes: selectively driving, by the first word line drive circuit, the word lines; and simultaneously writing, by the first write circuit and the second write circuit, to the first memory cell included in the first memory cell array and the second memory cell included in the second memory cell array, by simultaneously applying, by the first write circuit and the second write circuit, a write voltage to the first bit line and the second bit line, respectively.

Moreover, in order to solve the conventional problems, a 1T1R variable resistance nonvolatile memory device according to yet another aspect of the present invention includes: a plurality of bit lines; a plurality of word lines and a plurality of source lines that cross the bit lines; a plurality of memory cells at cross points of the bit lines and the source lines, the memory cells each including a variable resistance element and a selection element whose ON-OFF control is performed by each of the word lines, and reversibly changing at least between a first resistance state and a second resistance state; a first write circuit that applies a write voltage to a first bit line that is at least one of the bit lines, where, among the memory cells, memory cells connected to the first bit line are grouped together as a first memory cell array; a second write circuit that applies a write voltage to a second bit line that is at least one of the bit lines and is different from the first bit line, where, among the memory cells, memory cells connected to the second bit line are grouped together as a second memory cell array; a first selection circuit that connects or disconnects at least one of the first write circuit and the first bit line; a second selection circuit that connects or disconnects at least one of the second write circuit and the second bit line; a first source line drive circuit that drives the source lines; and a word line drive circuit that selectively drives the word lines, wherein the memory cells include a memory cell for data storage and a memory cell not for data storage, the first write circuit and the second write circuit simultaneously apply the write voltage to the first bit line and the second bit line, respectively, memory cells to which the first write circuit and the second write circuit simultaneously write include the memory cell for data storage and the memory cell not for data storage that are on a same word line, the first memory cell array is placed closer to the first source line drive circuit than the second memory cell array is, and a first ON resistance is greater than a second ON resistance, the first ON resistance being a resistance value when a first selection element that is the selection element included in the first memory cell array is ON, and the second ON resistance being a resistance value when a second selection element that is the selection element included in the second memory cell array is ON.

Furthermore, in order to solve the conventional problems, a method for writing for a 1T1R variable resistance nonvolatile memory device according to still yet another aspect of the present invention includes: selectively driving, by the first source line drive circuit, the source lines; selectively driving, by the word line drive circuit, among the word lines, word lines corresponding to the source lines driven in the selectively driving of the source lines; and simultaneously writing, by the first write circuit and the second write circuit, to the first memory cell included in the first memory cell array and the second memory cell included in the second memory cell array, by simultaneously applying, by the first write circuit and the second write circuit, a write voltage to the first bit line and the second bit line, respectively.

Advantageous Effects of Invention

The present invention produces an advantageous effect of successfully reducing a variation in memory cell current depending on positions of memory cells at a time of multi-bit simultaneous writing, to achieve highly stable write characteristics in a cross point variable resistance nonvolatile memory device and a 1T1R variable resistance nonvolatile memory device.

Moreover, the present invention enables a simpler circuit and processing to obtain this advantageous effect by optimizing, with a channel width or a channel length, a current drive capability of a selection transistor for steering a memory cell current at a time of low resistance writing depending on positions of memory cells that are write targets.

BRIEF DESCRIPTION OF DRAWINGS

FIG. 45 is a block diagram of a 1T1R memory cell array according to Embodiment 5 of the present invention.

DESCRIPTION OF EMBODIMENTS (Underlying Knowledge Forming Basis of the Present Invention)

First, the following describes a problem (memory cell position dependency) with multi-bit simultaneous writing, with reference to the drawings.

[Structure of Cross Point Memory Cell]

Figure 1A:
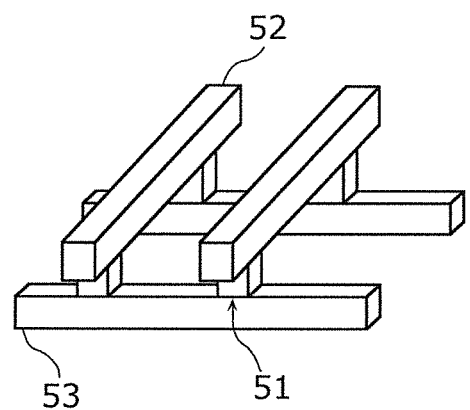
FIG. 1A is a three-dimensional structure of a single-layer cross point memory cell array.

FIG. 1A is a three-dimensional structure of a single-layer cross point memory cell array. Specifically, FIG. 1A shows: memory cells 51; word lines 52 (e.g., second layer wirings) that are arranged in a given direction and in parallel with each other; and bit lines 53 (e.g., first layer wirings) that are arranged in one direction and in parallel with each other so as to be orthogonal to the word lines 52. Each of the memory cells 51 is placed at a different one of cross points of the word lines 52 and the bit lines 53 so as to be provided between a corresponding one of the word lines 52 and a corresponding one of the bit lines 53.

Figure 1B:
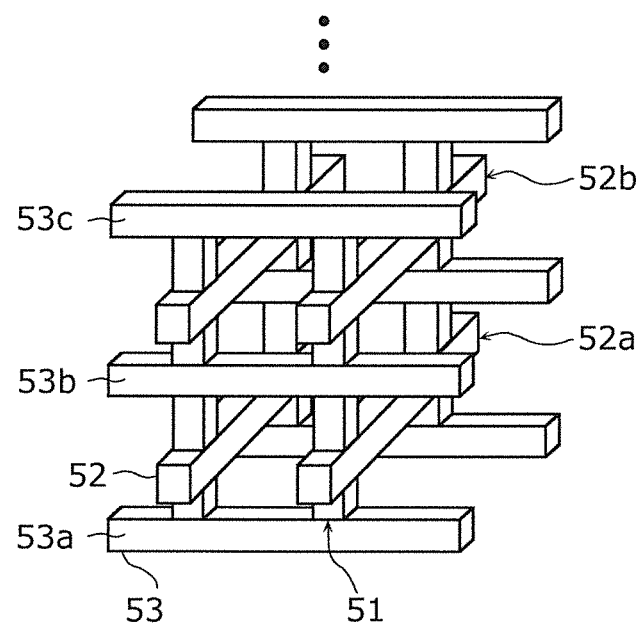
FIG. 1B is a three-dimensional structure of a multilayer cross point memory cell array.

FIG. 1B is a three-dimensional structure of a multilayer cross point memory cell array. Specifically, FIG. 1B shows a multilayer structure including stacked layers in which: bit lines 53 (first layer bit lines 53a) are placed in a first wiring layer; word lines 52 (first layer word lines 52a) are placed in a second wiring layer above the first wiring layer so as to be orthogonal to the bit lines 53; bit lines 53 (second layer bit lines 53b) are placed in a third wiring layer above the second wiring layer so as to be orthogonal to the word lines 52; word lines 52 (second layer word lines 52b) are placed in a fourth wiring layer above the third wiring layer so as to be orthogonal to the bit lines 53; and bit lines 53 (third layer bit lines 53c) are placed in a fifth wiring layer above the fourth wiring layer so as to be orthogonal to the word lines 52. Each memory cell 51 is placed at a different one of cross points of the word lines 52 and the bit lines 53 so as to be provided between a corresponding one of the word lines 52 and a corresponding one of the bit lines 53.

Thus, a cross point nonvolatile memory device achieves a reduction in memory cell area per unit area without relying on miniaturization, by vertically stacking simple structures in each of which memory cells are placed at cross points of wires. Hence, the cross point nonvolatile memory device is known as a structure suitable for high integration.

Figure 2:
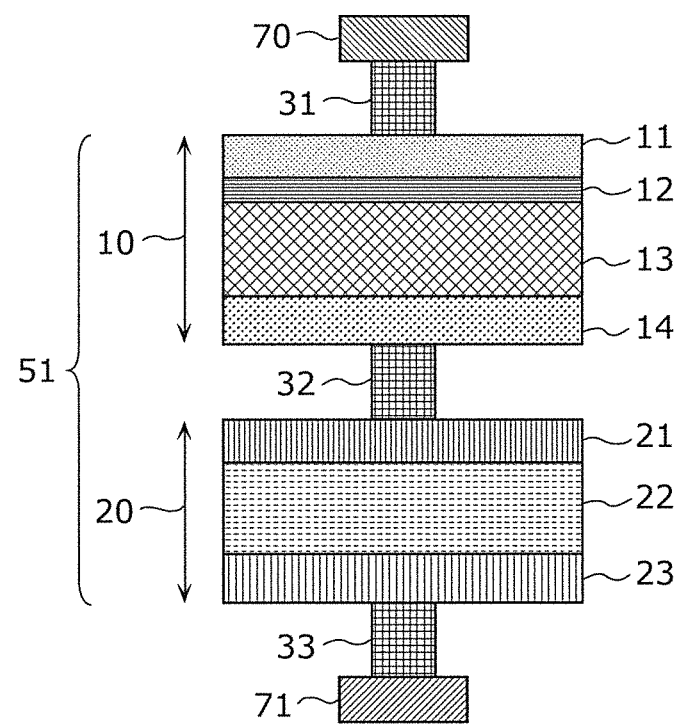
FIG. 2 is a cross section of a memory cell used for a cross point nonvolatile memory device.

FIG. 2 is a cross section of a memory cell 51 used for a cross point nonvolatile memory device.

The memory cell 51 is a 1-bit memory cell including a variable resistance element 10 and a current steering element 20 that are connected in series with each other.

The variable resistance element 10 has the following structure. Oxygen-deficient first tantalum oxide ($TaO_x$, $0 \leq x \leq 2.5$) is formed on a lower electrode 14 comprising, for instance, tantalum nitride (TaN), as a first variable resistance layer 13 (a first region included in a variable resistance layer). An upper interface of the first variable resistance layer 13 is irradiated with oxygen plasma at 300° C. and 200 W for 20 seconds, thereby forming a thin second variable resistance layer 12 (a second region included in a variable resistance layer) comprising $TaO_y$ ($x<y$) having an oxygen concentration higher than that of $TaO_x$ of the first variable resistance layer 13. An upper electrode 11 comprising platinum (Pt) is formed on the second variable resistance layer 12. The term "oxygen-deficient" means a composition state of a metal oxide that is lower in oxygen content than a metal oxide ($Ta_2O_5$ in the case of tantalum) having a stoichiometric composition typically exhibiting an insulating property, and exhibits a semiconducting electric property. Moreover, although the upper electrode that is an electrode in contact with the second variable resistance layer 12 comprises platinum (Pt), because a material (e.g., Pt and Ir) having a standard electrode potential higher than those of a material (here, tantalum (Ta)) comprised in the first variable resistance layer 13 and a material (here, tantalum nitride (TaN)) comprised in the lower electrode 14 allows a favorable resistance change operation, using such a material is desirable.

In the case of such a structure of the variable resistance element 10 shown in FIG. 2, a resistance change occurs in the second variable resistance layer 12 that is in contact with the upper electrode 11 comprising platinum (Pt) and comprises $TaO_y$ having a higher oxygen concentration. The variable resistance element 10 is changed into a high resistance state when a voltage of the upper electrode 11 that is increased to a predetermined voltage or more relative to a voltage of the lower electrode 14 is applied to the variable resistance element 10, and conversely the variable resistance element 10 is changed into a low resistance state when a voltage of the lower electrode 14 that is increased to a predetermined voltage or more relative to a voltage of the upper electrode 11 is applied to the variable resistance element 10.

The more detailed structure of the variable resistance element 10 is as follows.

A variable resistance layer (a layer including the first variable resistance layer 13 and the second variable resistance layer 12) is a layer which is disposed between the lower electrode 14 and the upper electrode 11, and whose resistance value reversibly changes based on an electrical signal provided between the lower electrode 14 and the upper electrode 11. For example, the variable resistance layer is a layer that reversibly changes between the high resistance state and the low resistance state according to a polarity of a voltage applied between the lower electrode 14 and the upper electrode 11. The variable resistance layer is formed by stacking at least two layers of the first variable resistance layer 13 connected to the lower electrode 14 and the second variable resistance layer 12 connected to the upper electrode 11.

The first variable resistance layer 13 comprises a first metal oxide that is oxygen-deficient, and the second variable resistance layer 12 comprises a second metal oxide having a degree of oxygen deficiency lower than that of the first metal oxide. In the second variable resistance layer 12 of the variable resistance element 10, a tiny localized region whose degree of oxygen deficiency reversibly changes due to application of electrical pulse. The localized region is thought to contain a filament including an oxygen-deficient site.

The term "degree of oxygen deficiency" refers to a proportion of deficient oxygen to an amount of oxygen of an oxide having a stoichiometric composition (a stoichiometric composition having the highest resistance value when stoichiometric compositions are present) of a metal oxide. A metal oxide having a stoichiometric composition has a resistance value that is more stable and higher than those of metal oxides having other compositions.

For example, when a metal is tantalum (Ta), an oxide having a stoichiometric composition according to the above definition is $Ta_2O_5$, which can be expressed as $TaO_{2.5}$. A degree of oxygen deficiency of $TaO_{2.5}$ is 0%, and a degree of oxygen deficiency of $TaO_{1.5}$ is calculated as a degree of oxygen deficiency=(2.5−1.5)/2.5=40%. Moreover, an oxygen-excess metal oxide has a negative value of a degree of oxygen deficiency. It is to be noted that in the Description, unless otherwise specifically noted, the degree of oxygen deficiency includes a positive value, 0, and a negative value.

An oxide having a low degree of oxygen deficiency has a high resistance value because such an oxide is more similar to an oxide having a stoichiometric composition, and an oxide having a high degree of oxygen deficiency has a low resistance value because such an oxide is more similar to a metal included in an oxide.

The term "oxygen content atomic percentage" refers to a ratio of oxygen atoms to a total number of atoms. For instance, an oxygen content atomic percentage of $Ta_2O_5$ is calculated according to a ratio of oxygen atoms to a total number of atoms (O/(Ta+O)), that is, 71.4 atm %. Thus, an oxygen-deficient tantalum oxide has an oxygen content atomic percentage greater than 0 and less than 71.4 atm %. For example, when a metal comprised in the first metal oxide layer and a metal comprised in the second metal oxide layer are of the same type, an oxygen content atomic percentage has a correspondence relationship with a degree of oxygen deficiency. In other words, when the second metal oxide has an oxygen content atomic percentage smaller than that of the first metal oxide, the second metal oxide has a degree of oxygen deficiency lower than that of the first metal oxide.

A variable resistance layer may comprise a metal other than tantalum. A transition metal or aluminum (Al) may be used as the metal comprised in the variable resistance layer. Tantalum (Ta), titanium (Ti), hafnium (Hf), zirconium (Zr), niobium (Nb), tungsten (W), nickel (Ni), or the like may be used as the variable resistance layer. Since the transition metal can take a plurality of oxidation states, this can provide different resistance states by an oxidation-reduction reaction.

For instance, a resistance value of the variable resistance layer can be stably changed at high speed in the case where a hafnium oxide is used so that the first metal oxide has a composition expressed as $HfO_x$ and the second metal oxide has a composition expressed as $HfO_y$, where x is at least 0.9 and at most 1.6, and y is larger than x in value. In this case, the second metal oxide may have a film thickness from 3 nm to 4 nm.

Moreover, a resistance value of the variable resistance layer can be stably changed at high speed in the case where a zirconium oxide is used so that the first metal oxide has a composition expressed as $ZrO_x$ and the second metal oxide has a composition expressed as $ZrO_y$, where x is at least 0.9 and at most 1.4, and y is larger than x in value. In this case, the second metal oxide may have a film thickness from 1 nm to 5 nm.

A first metal comprised in the first metal oxide and a second metal comprised in the second metal oxide may be different in material from each other. In this case, the second metal oxide has a degree of oxygen deficiency lower than that of the first metal oxide, that is, may have a high resistance. With this configuration, a voltage applied between the lower electrode 14 and the upper electrode 11 when a resistance change occurs is divided more to the second metal oxide, which causes the oxidation-reduction reaction to easily occur in the second metal oxide.

Moreover, when the first metal comprised in the first metal oxide that is to be the first variable resistance layer 13 and the second metal comprised in the second metal oxide that is to be the second variable resistance layer 12 are different in material from each other, the second metal may have a standard electrode potential lower than that of the first metal. The standard electrode potential having a larger value represents a property of being more difficult to oxidize. Accordingly, the oxidation-reduction reaction is prone to occur in the second metal oxide having a relatively low standard electrode potential. Here, it is considered that in a resistance change phenomenon, the oxidation-reduction reaction in the tiny localized region formed in the second metal oxide having a high resistance changes the filament (conductive path), thereby changing a resistance value (a degree of oxygen deficiency) of the second metal oxide layer.

For instance, a stable resistance change operation is achieved by using an oxygen-deficient tantalum oxide ($TaO_x$) for the first metal oxide and a titanium oxide ($TiO_2$) for the second metal oxide. Titanium (with the standard electrode potential=−1.63 eV) is a material having a standard electrode potential lower than that of tantalum (with the standard electrode potential=−0.6 eV). As above, the oxidation-reduction reaction is more prone to occur in the second metal oxide when a metal oxide having a standard electrode potential lower than that of the first metal oxide is used for the second metal oxide. As another combination, an aluminum oxide ($Al_2O_3$) may be used for the second metal oxide that is to be a high resistance layer. For example, the oxygen-deficient tantalum oxide ($TaO_x$) may be used for the first metal oxide, and the aluminum oxide ($Al_2O_3$) may be used for the second metal oxide.

It is considered that in the resistance change phenomenon in a variable resistance layer having a stack structure, the oxidation-reduction reaction in the tiny localized region formed in the second metal oxide having a high resistance changes the filament (conductive path) in the localized region, thereby changing a resistance value of the second metal oxide.

To put it another way, when a positive voltage is applied to the upper electrode 11 connected to the second metal oxide with reference to the lower electrode 14, oxygen ions in the variable resistance layer are attracted toward the second metal oxide. With this, oxidation reaction occurs in the tiny localized region formed in the second metal oxide, and the degree of oxygen deficiency is reduced. As a result, it is considered that it becomes more difficult to maintain a connection to the filament in the localized region, and the resistance value increases.

In contrast, when a negative voltage is applied to the upper electrode 11 connected to the second metal oxide with reference to the lower electrode 14, the oxygen ions in the second metal oxide are thrust towards the first metal oxide. With this, reduction reaction occurs in the tiny localized region formed in the second metal oxide, and the degree of oxygen deficiency is increased. As a result, it is considered that it becomes easier to get a connection to the filament in the localized region, and the resistance value decreases.

The upper electrode 11 connected to the second metal oxide having a lower degree of oxygen deficiency comprises a material having a standard electrode potential higher than those of the metal comprised in the second metal oxide and the material comprised in the lower electrode 14, such as platinum (Pt), iridium (Ir), and palladium (Pd). Moreover, the lower electrode 14 connected to the first metal oxide having a higher degree of oxygen deficiency may comprise a material having a standard electrode potential lower than that of the metal comprised in the first metal oxide, such as tungsten (W), nickel (Ni), tantalum (Ta), titanium (Ti), aluminum (Al), tantalum nitride (TaN), and titanium nitride (TiN). The standard electrode potential having a larger value represents a property of being more difficult to oxidize.

Stated differently, a standard electrode potential $V_2$ of the second electrode, a standard electrode potential $V_{r2}$ of the metal comprised in the second metal oxide, a standard electrode potential $V_{r1}$ of the metal comprised in the first metal oxide, and a standard electrode potential $V_1$ of the first electrode may satisfy $V_{r2}<V_2$ and $V_1<V_2$. In addition, $V_{r1} \geq V_1$ may be satisfied with $V_2>V_{r2}$.

With this configuration, an oxidation-reduction reaction selectively occurs in the second metal oxide near the interface between the upper electrode 11 and the second metal oxide, and a stable resistance change phenomenon can be achieved.

The current steering element 20 is a diode element having nonlinear current-voltage characteristics in both positive and negative directions of an applied voltage, and has, for instance, a structure (MSM structure) obtained by providing a current steering layer 22 comprising nitrogen-deficient silicon nitride between a lower electrode 23 and an upper electrode 21 comprising tantalum nitride (TaN) or the like. Here, the nitrogen-deficient silicon nitride refers to silicon nitride that has an amount of nitrogen smaller than that of silicon nitride ($Si_3N_4$) having a stoichiometric composition, and indicates semiconducting characteristics. Moreover, the bidirectional nonlinear current-voltage characteristics are such characteristics of the current steering element 20 that is in the high resistance (OFF) state in a predetermined voltage range where an applied voltage is a predetermined voltage and that is in the low resistance (ON) state in a range outside the predetermined voltage range. That is, the current steering element 20 is in the high resistance (OFF) state when the applied voltage has an absolute value less than or equal to a predetermined value, and is in the low resistance (ON) state when the applied voltage has an absolute value greater than the predetermined value.

The memory cell 51 shown in FIG. 2 is a memory cell formed by connecting the variable resistance element 10 and the current steering element 20 in series by a via 32. Here, the upper electrode 11 of the variable resistance element 10 is connected to an upper wire 70 (corresponding to one of a bit line 53 and a word line 52) by a via 31. In contrast, the lower electrode 23 of the current steering element 29 is connected to a lower wire 71 (corresponding to the other of the bit line 53 and the word line 52) by a via 33. It is to be noted that, in FIG. 2, the current steering element 20 and the variable resistance element 10 may be vertically reversed with each other. Moreover, the memory cell 51 may have a structure from which the via 32 is omitted as shown in FIG. 3.

Figure 3:
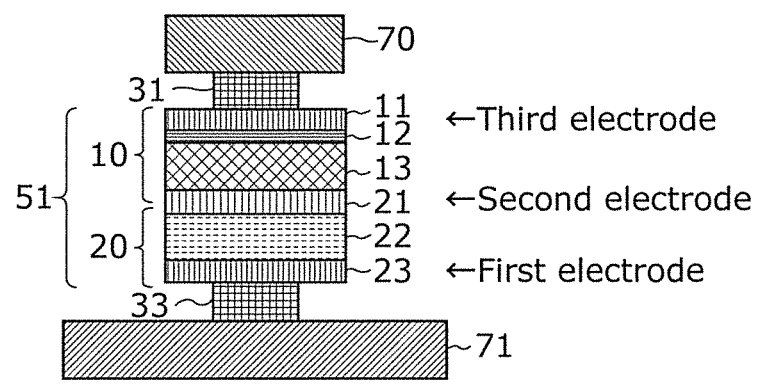
FIG. 3 is a cross section of a memory cell used for a cross point nonvolatile memory device from which a via between a variable resistance element and a current steering element is removed.

FIG. 3 is a cross section of the memory cell 51 included in a cross point nonvolatile memory device from which the via 32 between the variable resistance element 10 and the current steering element 20 is removed.

The memory cell 51 has a structure formed by sequentially stacking, for instance, a first electrode 23 comprising tantalum nitride (TaN), a current steering layer 22 comprising nitrogen-deficient silicon nitride, a second electrode comprising TaN, a first variable resistance layer 13 comprising oxygen-deficient tantalum oxide ($TaO_x$), a second variable resistance layer 12 that is formed by oxidizing the first variable resistance layer 13 in an oxygen plasma atmosphere and comprises $TaO_y$ (x<y) having an oxygen concentration higher than that of $TaO_x$, and a third electrode 11 comprising platinum (Pt). A lower wire 71 made of aluminum (Al) is provided below the memory cell 51 and connected to the first electrode 23 of the memory cell 51 by a first via 33. In contrast, an upper wire 70 made of aluminum (Al) is provided above the memory cell 51 and connected to the third electrode 11 of the memory cell 51 by a third via 31. In addition, the lower wire 71 and the upper wire 70 are arranged so as to be orthogonal to each other.

In the structure of the memory cell 51 as shown in FIG. 3, the current steering element 20 includes the first electrode 23, the current steering layer 22, and the second electrode 21, and at the same time the variable resistance element 10 includes the second electrode 21, the first variable resistance layer 13, the second variable resistance layer 12, and the third electrode 11. In other words, the memory cell 51 includes: the variable resistance element 10 that reversibly changes at least between the low resistance state and the high resistance state when voltages having different polarities are applied to the variable resistance element 10; and the current steering element 20 that is connected in series with the variable resistance element 10.

Here, the second electrode 21 also serves as an electrode of one of the variable resistance element 10 and the current steering element 20. Moreover, as described with the structure shown in FIG. 2, in the structure of the memory cell 51, a resistance change occurs in the second variable resistance layer 12 that is in contact with the third electrode comprising a material (here, platinum (Pt)) having a standard electrode potential higher than those of tantalum comprised in the first variable resistance layer 13 and TaN comprised in the second electrode 21 corresponding to the lower electrode of the variable resistance element 10, and comprises $TaO_y$ having an oxygen concentration higher than that of the first variable resistance layer 13. When a voltage higher than or equal to a predetermined voltage is applied to the upper wire 70 with respect to the lower wire 71, the variable resistance element 10 changes to the high resistance state. When a voltage higher than or equal to a predetermined voltage is applied to the lower wire 71 with respect to the upper wire 70, the variable resistance element 10 changes to the low resistance state. That is, the variable resistance element 10 includes the second electrode 21, the first variable resistance layer 13, the second variable resistance layer 12, and the third electrode 11 that are stacked in the Z direction (stacking direction) so that the first variable resistance layer 13 and the second variable resistance layer 12 are provided between the second electrode 21 and the third electrode 11; is asymmetrical in that the variable resistance element 10 differs in structure between when viewed in a direction from the second electrode 21 to the third electrode 11 and when viewed in a direction from the third electrode 11 to the second electrode 21; and has characteristics of changing to the high resistance state when a positive voltage higher than or equal to a predetermined voltage is applied to the third electrode 11 with respect to the second electrode 21 and changing to the low resistance state when a positive voltage higher than or equal to a predetermined voltage is applied to the second electrode 21 with respect to the third electrode 11.

Figure 4:
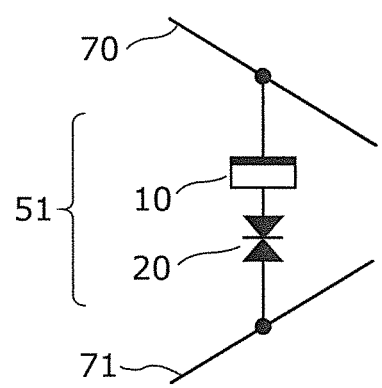
FIG. 4 is an equivalent circuit diagram of a memory cell used for a cross point nonvolatile memory device.

FIG. 4 is a circuit diagram showing a connection relationship corresponding to the structure of the variable resistance element 10 shown in FIG. 3, that is, an equivalent circuit diagram corresponding to the memory cell 51. To specify a direction of the second variable resistance layer 12 located on the side of the upper electrode 11, the equivalent circuit diagram of the variable resistance element 10 represents the direction by the solid part.

[Structure of 1T1R Memory Cell]

Figure 5:
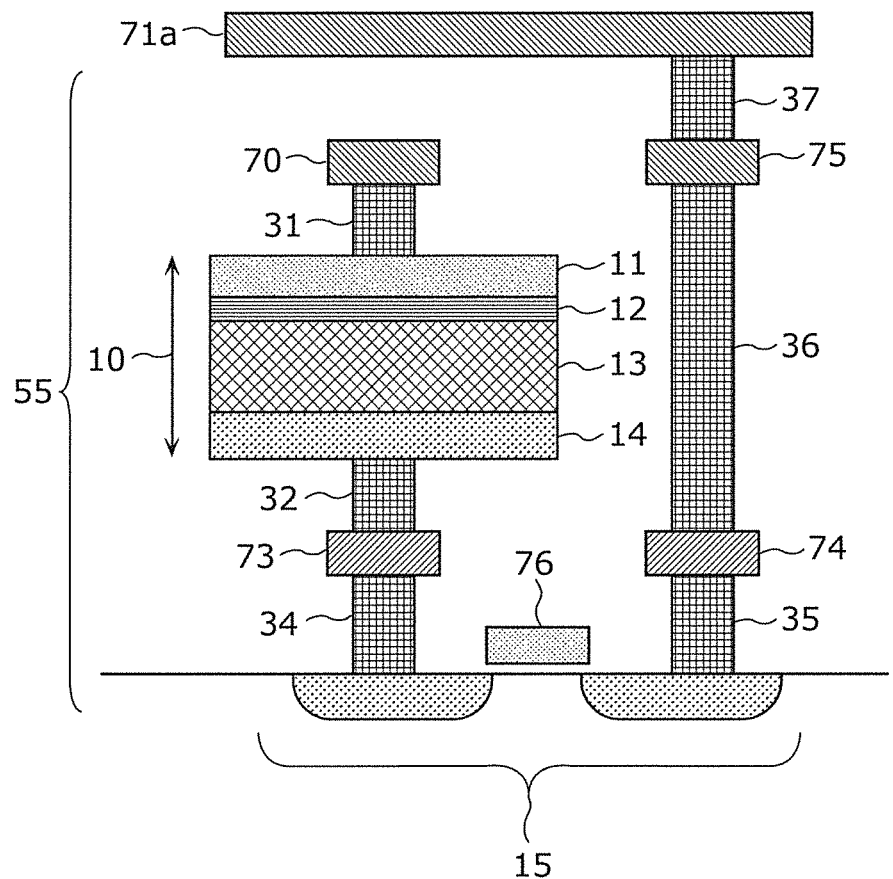
FIG. 5 is a cross section of a memory cell used for a 1T1R nonvolatile memory device.

FIG. 5 is a cross section (1-bit configuration) of a 1T1R memory cell 55 including a variable resistance element 10 and a NMOS transistor 15, a selection transistor (i.e., an exemplary switching element), that are connected in series.

As shown in FIG. 5, the variable resistance element 10 is formed by stacking a lower electrode 14, a first tantalum oxide layer ($TaO_x$, $0 \leq x \leq 2.5$) 13 that comprises an oxygen-deficient Ta oxide and has a low resistance, a second tantalum oxide layer ($TaO_y$, $x<y$) 12 having a high resistance, and an upper electrode 11. An upper wire 70 (a source line) is connected to the upper electrode 11 of the variable resistance element 10 by a via 31, and at the same time a lower wire 73 is connected to the lower electrode 14 by a via 32. Furthermore, the lower wire 73 is connected to a source (N+ diffusion) region of the NMOS transistor 15 by a contact 34. A drain (N+ diffusion) region of the NMOS transistor 15 is connected to an upper layer wire 71a (a bit line) through wire layers 74 and 75 by a contact 35 and vias 36 and 37.

Moreover, the NMOS transistor 15 has a gate terminal connected to a polysilicon wire 76 (a word line), and a substrate is connected to a ground potential.

Here, the second variable resistance layer 12 having the high resistance is placed at the side of the upper electrode 11 which is opposite to the NMOS transistor 15.

As with the cross point structure, in the case of this structure (the 1T1R structure), a resistance change occurs in the second variable resistance layer 12 that is in contact with the upper electrode 11 and comprises $TaO_y$ having a higher oxygen concentration, and when a voltage higher than or equal to a predetermined voltage is applied to the upper electrode 11 with respect to the lower electrode 14, the variable resistance element 10 changes to the high resistance state, and conversely when a voltage higher than or equal to a predetermined voltage is applied to the lower electrode 14 with respect to the upper electrode 11, the variable resistance element 10 changes to the low resistance state.

Figure 6:
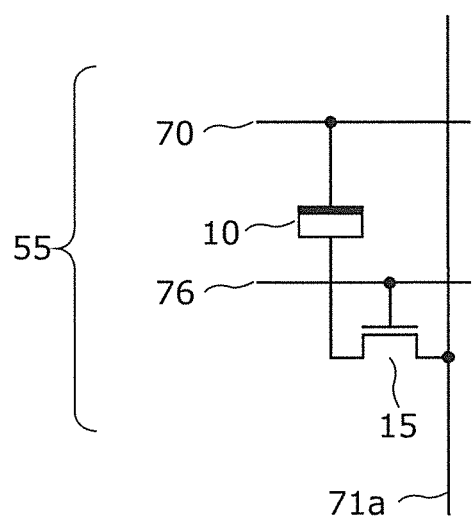
FIG. 6 is an equivalent circuit diagram of a memory cell used for a 1T1R nonvolatile memory device.

FIG. 6 is a circuit diagram showing a connection relationship corresponding to the structure of the variable resistance element 10 shown in FIG. 5, that is, an equivalent circuit diagram corresponding to the memory cell 55. To specify a direction of the second variable resistance layer 12 located on the side of the upper electrode 11, the equivalent circuit diagram of the variable resistance element 10 represents the direction by the solid part.

[Memory Cell Characteristics]

Figure 7:
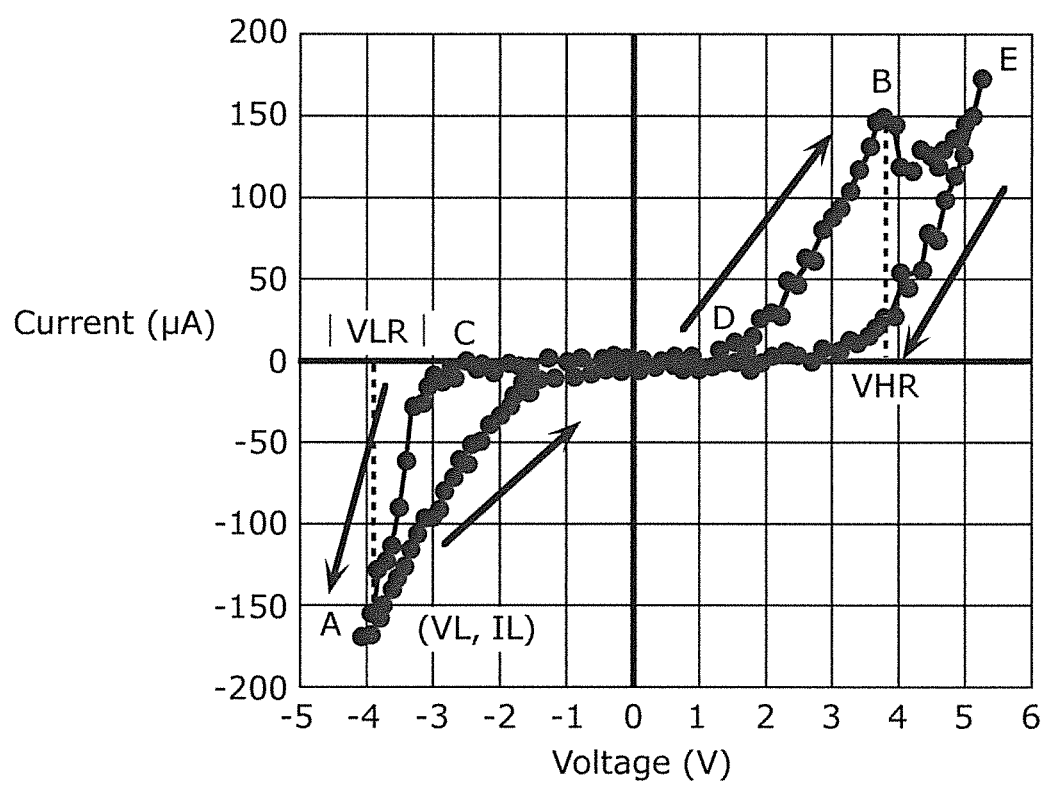
FIG. 7 is a resistance change (IV) characteristic graph for a cross point memory cell.

The following describes an operation of a cross point memory cell 51, with reference to FIG. 7. FIG. 7 is a characteristic graph obtained by actually measuring a relationship (i.e., resistance change characteristics or I-V characteristic) between a voltage applied to the memory cell 51 and a current flowing through the memory cell 51 in the case of applying, to the memory cell 51 having the structure shown in FIG. 2, a positive-polarity voltage when the upper wire 70 has a voltage higher than that of the lower wire 71.

Suppose the memory cell 51 is initially in the high resistance state. When a negative-polarity voltage that causes the lower wire 71 to be higher in potential than the upper wire 70 is gradually increased and applied to the memory cell 51, starting from an applied voltage of 0V, a current begins to flow at a point near approximately −2.5 V (point C), and the variable resistance element 10 starts to change from the high resistance state to the low resistance state when the voltage slightly exceeds −3.0 V. Although the voltage is further increased to −4.0 V (point A) and applied to the memory cell 51, the memory cell 51 is rapidly changing to the low resistance state according to the applied voltage. Subsequently, the voltage is gradually decreased and applied until it reaches 0 V, while the variable resistance element is in the low resistance state.

After this, when the positive-polarity voltage that causes the upper wire 70 to be higher in potential than the lower wire 71 is gradually increased and applied to the memory cell 51, a current begins to flow at a point near approximately 1.5 V (point D), and the variable resistance element 10 starts to change from the low resistance state to the high resistance state at a point near 3.9 V (point B) where the voltage is substantially point-symmetrical to a voltage (point A) at which the low resistance state is reached. When the voltage is further applied up to 5.1 V, a current increases. Subsequently, the current is lower when the applied voltage is decreased than when the applied voltage is increased, which indicates that the variable resistance element has changed to the high resistance state.

That is, the actual measurement data shown by FIG. 7 indicates, for the memory cell 51 having the structure shown in FIG. 2, (i) bidirectional resistance change characteristics of changing to the low resistance state when the voltage of the lower wire 71 is higher than or equal to a predetermined voltage VLR with respect to the voltage of the upper wire 70 and changing to the high resistance state when the voltage of the upper wire 70 is higher than or equal to a predetermined voltage VHR with respect to the voltage of the lower wire 71, and (ii) a current-voltage relationship in which the applied voltage in the low resistance state (point A) and the voltage at which the change to the high resistance state starts (point B) are substantially symmetrical. Thus, it is required that the variable resistance element 10 be driven with a current greater than or equal to a high resistance writing voltage or a low resistance writing voltage.

Moreover, when the variable resistance element 10 of the memory cell 51 is changed from the high resistance state to the low resistance state, a resistance value of the low resistance state changes to a low resistance value corresponding to a value of a current flowing through the variable resistance element 10, by applying, to the memory cell 51, a predetermined voltage that causes a resistance change in the variable resistance element 10.

Figure 8:
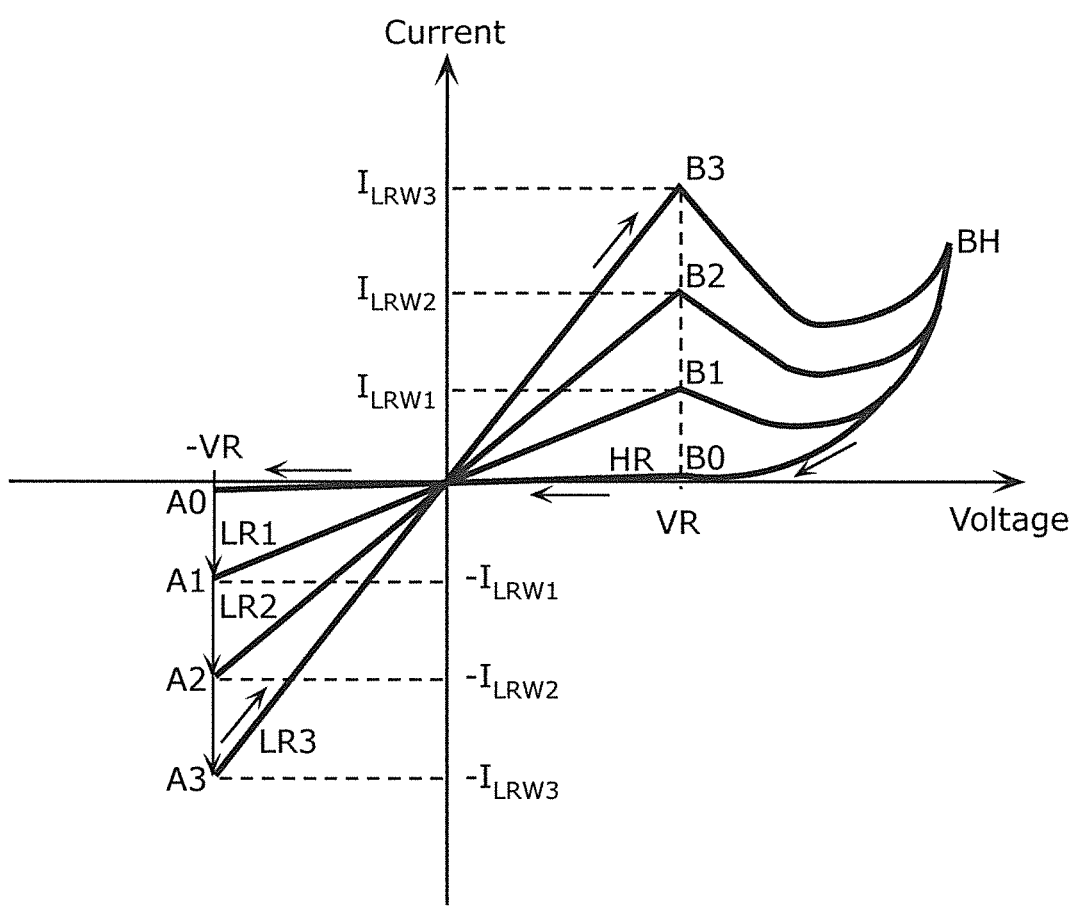
FIG. 8 is a resistance change (IV) characteristic graph for a variable resistance element used for a cross point memory cell and a 1T1R memory cell.

The following describes in detail setting of a low resistance value with reference to FIG. 8.

FIG. 8 is a diagram showing resistance change characteristics (I-V characteristic) of the variable resistance element 10. The horizontal axis represents a voltage applied across the variable resistance element 10, and the vertical axis represents a current that flows through the variable resistance element 10 when a voltage is applied across the variable resistance element 10.

Assuming that the variable resistance element 10 is initially in the high resistance state, its characteristics are represented by a characteristic line BH-B0-A0 when an applied voltage is greater than −VR with reference to the lower electrode 14. When a voltage applied to the variable resistance element 10 with reference to the lower electrode 14 becomes −VR, low resistance writing is started, and a current flowing through the variable resistance element 10 increases. A resistance value of the variable resistance element 10 varies according to an amount of current flowing through the variable resistance element 10 so that a magnitude of voltage between terminals of the variable resistance element 10 is constantly |VR|. In other words, when the maximum current −|I$_{LRW1}$| indicated by point A1 flows through the variable resistance element 10 while −VR is being applied to the variable resistance element 10, the variable resistance element 10 is set to a low resistance value having a characteristic slope LR1; when the maximum current −|I$_{LRW2}$| indicated by point A2 flows through the variable resistance element 10 while −VR is being applied to the variable resistance element 10, the variable resistance element 10 is set to a low resistance value having a characteristic slope LR2; and when the maximum current −|I$_{LRW3}$| indicated by point A3 flows through the variable resistance element 10 while −VR is being applied to the variable resistance element 10, the variable resistance element 10 is set to a low resistance value having a characteristic slope LR3.

In this regard, a resistance change starting point from the low resistance state (LR1, LR2, LR3) to the high resistance state is one of the following: point B1 that is origin symmetrical to the voltage and the current of point A1 at which the variable resistance element 10 is set to the low resistance value in the LR1 state; point B2 that is origin symmetrical to the voltage and the current of point A2 at which the variable resistance element 10 is set to the low resistance value in the LR2 state; and point B3 that is origin symmetrical to the voltage and the current of point A3 at which the variable resistance element 10 is set to the low resistance value in the LR3 state.

In this phenomenon, it is possible to confirm that the same characteristics are also present in the memory cell 51 connected in series with the current steering element 20 that shows point-symmetrical characteristics in application of positive and negative voltages (refer to a symmetry between points A and B in FIG. 7).

From the above, to perform stable resistance change operation, it is required that, in the low resistance writing, a predetermined low resistance state be achieved by performing current control (current steering) to a predetermined current value, whereas it is required that, in the high resistance writing, a voltage be applied in a direction opposite to a direction in the low resistance writing, and higher-current operation than that of the low resistance writing be performed.

It is to be noted that a voltage section between 0 V and point C at a time of the low resistance writing (i.e., the high resistance state) and a voltage section between 0 V and point D at a time of the high resistance writing (i.e., the low resistance state) are a voltage zone in which a current does not clearly flow even when a voltage is applied to the memory cell 51 in FIG. 7.

Points C and D correspond to a summed voltage of a threshold voltage of the current steering element 20 and a resistance change voltage of the variable resistance element 10. In the cross point memory cell array, a voltage greater than or equal to the summed voltage is applied to a selected memory cell, a leak current to unselected memory cells is reduced by performing control so that an operating point is between points C and D, thereby performing an operation of reading from or writing to the cross point memory cell array.

[Cross Point Memory Cell Array and Array Equivalent Circuit]

The following describes an array equivalent circuit of a cross point memory cell array.

Figure 9:
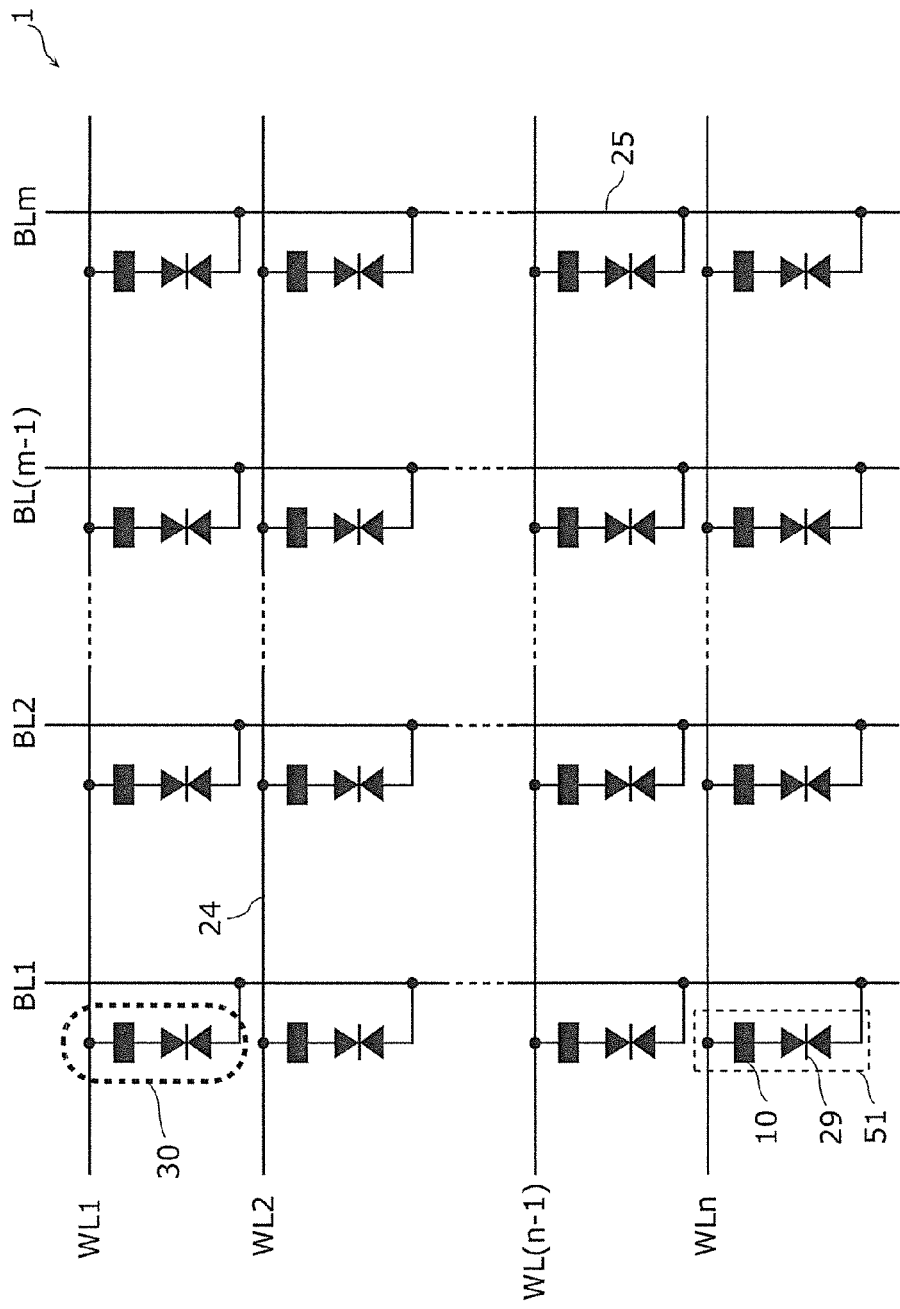
FIG. 9 is a diagram showing a memory cell array in which memory cells are arranged in a matrix.

FIG. 9 is an exemplary diagram showing a memory cell array in which memory cells 51 are arranged in a matrix in the same manner as in FIG. 1.

In FIG. 9, each reference sign 24 indicates a line formed by placing an n number of wires WL1 to WLn in parallel with each other, and each reference sign 25 indicates a bit line that is formed by placing a m number of wires BL1 to BLm in parallel with each other and is orthogonal to the word line in a non-contact manner (three-dimensionally). Each memory cell 51 in which the variable resistance element 10 and the current steering element 29 are connected in series is placed at a different one of cross points of the word lines 24 and the bit lines 25. The variable resistance element 10 has one end connected to a corresponding one of the word lines 24, and the current steering element 29 has one end connected to a corresponding one of the bit lines 25. To put it another way, a memory cell array 1 shown in FIG. 9 includes n memory cells 51 arranged in a direction of each bit line 25 and m memory cells 51 arranged in a direction of each word line 24, that is, n×m memory cells 51.

In the case of a cross point memory cell array, a shape of a memory cell array which minimizes disturbing influence on unselected memory cells when writing to a selected memory cell of 1 bit in the memory cell array is square (m=n in FIG. 9).

On the other hand, in the 1-bit writing, the leakage current flowing through the unselected memory cells is reduced in proportion as the size of the memory cell array becomes smaller.

For this reason, although, for instance, the memory cell array needs to be square in shape and reduced in size in order to minimize the disturbing influence and reduce the leakage current, when the memory cell array having such a small size and a squire bit shape is mounted on each of mats, and 1-bit by 1-bit writing is performed on a mat basis, decoder circuits and driver circuits for rows and columns are required for each of the memory cell array, which results in increase of a peripheral circuitry area accounting for a total area of a semiconductor chip on which such a cross point variable resistance nonvolatile memory device is mounted.

In view of this, for example, memory cell arrays are arranged each of which has a rectangular shape (e.g., m>n in FIG. 9) as an array shape for preventing the area from increasing by reducing overhead of the peripheral circuitry and reducing the increase in the size of the memory cell array.

Figure 10:
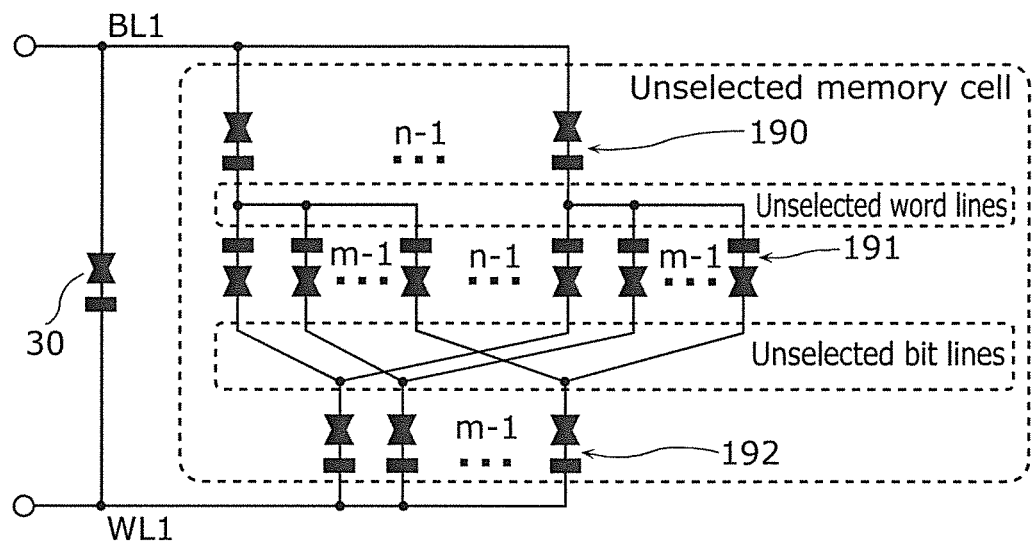
FIG. 10 is a diagram showing development of a memory cell array into an array equivalent circuit.

FIG. 10 is a diagram schematically showing a connection relationship between a selected memory cell and unselected memory cells that are included between a selected bit line and a selected word line, with reference to the selected bit line and the selected word line, in order to describe the development of the memory cell array 1 shown in FIG. 9 into the array equivalent circuit. Stated differently, FIG. 10 is a diagram showing the equivalent circuit of FIG. 7 which illustrates the configuration of FIG. 9 in terms of a selected memory cell 30 and unselected memory cells.

The selected memory cell 30 shown in FIG. 9 is connected to a selected bit line BL1 and a selected word line WL1. In FIG. 10, the selected memory cell 30 has one end connected to the selected bit line BL1, and the other end connected to the selected word line WL1. The other unselected memory cells include (1) first unselected memory cells 190 including (n−1) memory cells 51 each having one end connected to the selected bit line BL1, (2) third unselected memory cells 192 including (m−1) memory cells 51 each having one end connected to the selected word line WL1, and (3) second unselected memory cells 191 including (n−1)×(m−1) memory cells 51 each of which is (i) connected via a corresponding one of unselected word lines to the other end of a corresponding one of the (n−1) memory cells 51 included in the first unselected memory cells 190 and (ii) connected via a corresponding one of unselected bit lines to the other end of a corresponding one of the (m−1) memory cells 51 included in the third unselected memory cells 192.

One of the (m−1) memory cells 51 included in the first unselected memory cells 190 has the other end connected to one ends of the (m−1) memory cells 51 included in the second unselected memory cells 191. As many as (n−1) such connection relationships between the first unselected memory cells 190 and the second unselected memory cells 191 are present. One of the (n−1) memory cells 51 included in the third unselected memory cells 192 has the other end connected to the other ends of the (n−1) memory cells 51 included in the second unselected memory cells 191. As many as (m−1) such connection relationships between the third unselected memory cells 192 and the second unselected memory cells 191 are present.

Since as many states in each of which one of the (n−1) memory cells 51 included in the first unselected memory cells 190 is connected to the (m−1) memory cells 51 included in the second unselected memory cells 191 as the relationships each between the first unselected memory cells 190 and the second unselected memory cells 191 are present, each node of the unselected word lines has the substantially same voltage. Moreover, since as many states in each of which one of the (m−1) memory cells 51 included in the third unselected memory cells 192 as the relationships each between the third unselected memory cells 192 and the second unselected memory cells 191 are present, each node of the unselected bit lines has the substantially same voltage.

Figure 11:
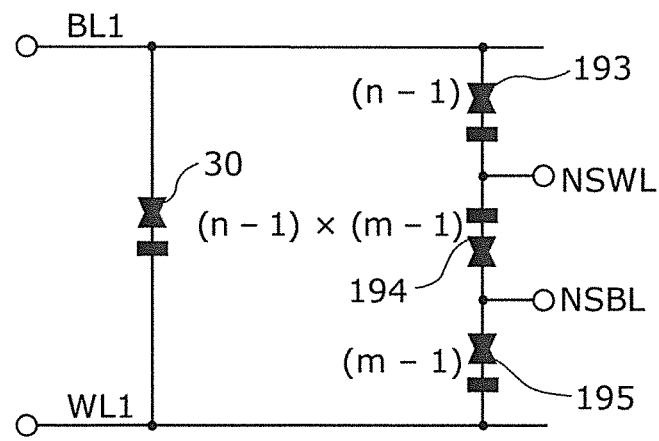
FIG. 11 is a reduced equivalent circuit diagram of a memory cell array.

Thus, in the equivalent circuit shown in FIG. 10, it is possible to reduce all the nodes of the unselected word lines and all the nodes of the unselected bit lines to respective single lines. FIG. 11 shows an equivalent circuit thus reduced.

In FIG. 11, the selected memory cell 30 has one end connected to the selected bit line BL1, and the other end connected to the selected word line WL1. A first unselected memory cell 193 is equivalent to the first unselected memory cells 190, and has (n−1) parallels. A second unselected memory cell 194 is equivalent to the second unselected memory cells 191, and has (n−1)×(m−1) parallels. A third unselected memory cell 195 is equivalent to the third unselected memory cells 192, and has (m−1) parallels. The first unselected memory cell 193, the second unselected memory cell 194, and the third unselected memory cell 195 are connected in series. The first unselected memory cell 193 has a terminal that is not connected to the second unselected memory cell 194 but connected to the selected bit line BL1, and the third unselected memory cell 195 has a terminal that is not connected to the second unselected memory cell 194 but connected to the selected word line WL1. An intermediate node that connects the first unselected memory cell 193 and the second unselected memory cell 194 is referred to as an unselected word line NSWL, and an intermediate node that connects the second unselected memory cell 194 and the third unselected memory cell 195 is referred to as an unselected bit line NSBL.

As stated above, the equivalent circuit, which shows the relationship between the selected memory cell and the unselected memory cells of the cross point memory cell array 1 shown in FIG. 9, is reduced as shown in FIG. 11. Hereinafter, an I-V characteristic of any selected memory cell of the cross point memory cell array and an I-V characteristic of a leakage current flowing through unselected memory cells are touched on in connection with a write characteristic of the selected memory cell. The I-V characteristic of such a memory cell array is described below with reference to the equivalent circuit shown in FIG. 11, for the sake of simplicity.

[Equivalent Circuit and I-V Characteristic at Time of Writing]

Figure 12:
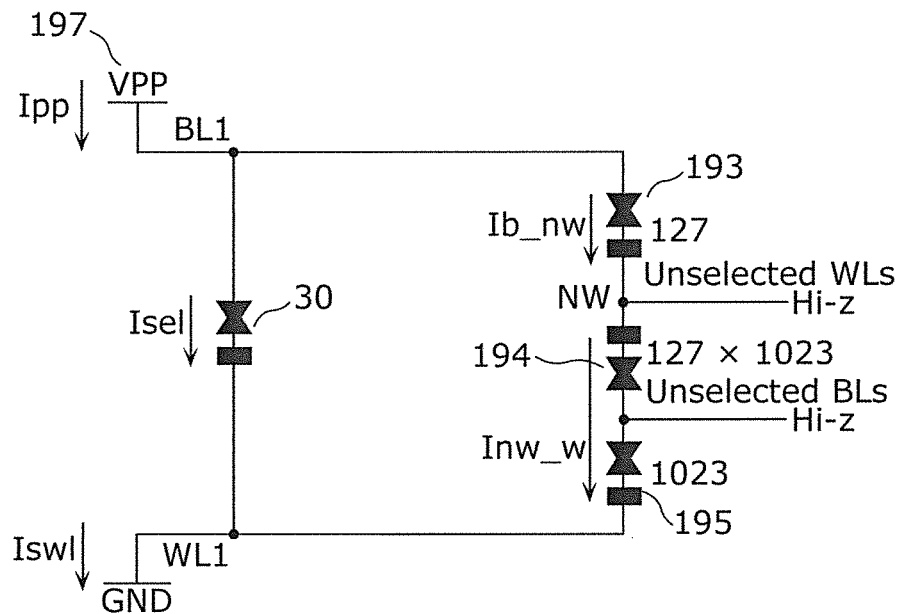
FIG. 12 is an equivalent circuit diagram illustrating a state of 1-bit writing when unselected lines are in Hi-z.
Figure 13:
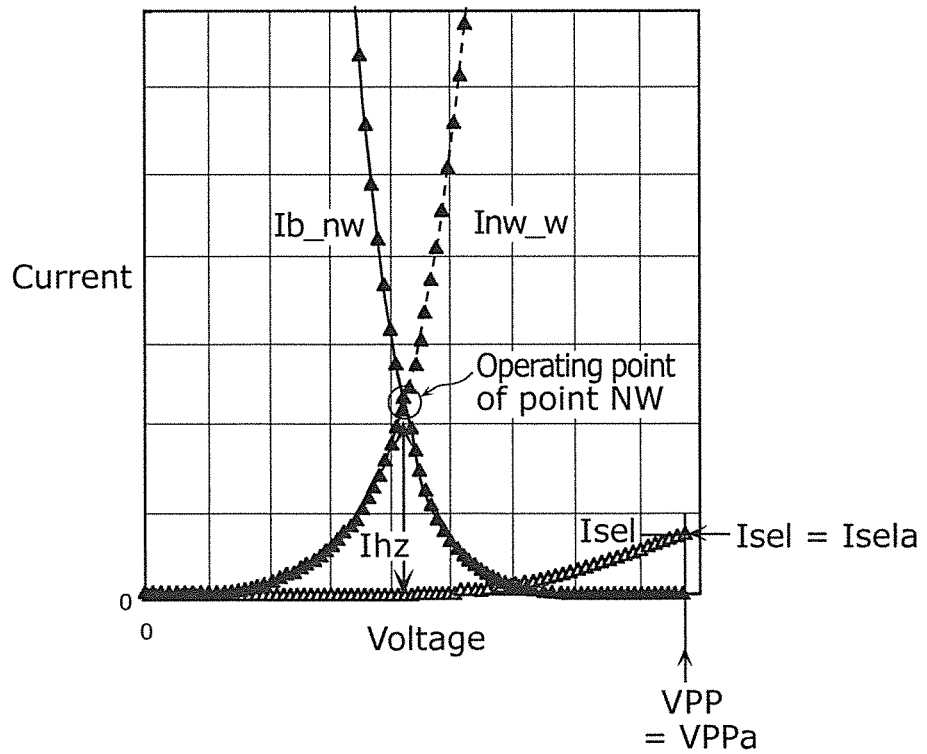
FIG. 13 is an I-V characteristic graph for a memory cell array at a time of 1-bit writing.

The following describes, using the equivalent circuit shown in FIG. 11, a conventional write (here, low resistance writing) operation and its characteristics, with reference to FIG. 12 and FIG. 13.

FIG. 12 is a diagram showing a state of a case where a selected 1-bit memory cell 30 is written to by changing the memory cell 30 to the low resistance (LR) state when unselected word lines and unselected bit lines are in a high impedance state (hereinafter, referred to as Hi-z state) in the equivalent circuit of the memory cell array shown in FIG. 11.

In FIG. 12, a write power source 197 is a power source that generates a voltage at a time of writing (write voltage) VPP, and has an output terminal electrically connected to the selected bit line BL1 in this selection state. A ground (GND) voltage 0 V is electrically connected to the selected word line WL1. The unselected word lines (WLs) that connect the first unselected memory cell 193 and the second unselected memory cell 194 are referred to as NW point. The unselected word lines are in the Hi-z state, and the unselected bit lines (BLs) that connect the second unselected memory cell 194 and the third unselected memory cell 195 are also in the Hi-z state. It goes without saying that the selected memory cell 30 has one end connected to the selected bit line BL1, and the other end connected to the selected word line WL1. Moreover, the write voltage VPP is applied from the write power source 197 to the selected bit line BL1 of FIG. 12, and a GND potential is applied to the selected word line WL1. In this state, a LR writing current Isel flows through the selected memory cell 30 from the selected bit line BL1 to the selected word line WL1, a current Ib_nw flows through the first unselected memory cell 193 from the selected bit line BL1, and a current Inw_w flows through the second unselected memory cell 194 and the third unselected memory cell 195 to the selected word line WL1. A current Ipp that is a sum of the current Isel flowing through the selected memory cell 30 and the current Ib_nw flowing through the first unselected memory cell 193 flows through the write power source 197, and a current Iswl that is a sum of the current Isel flowing through the selected memory cell 30 and the current Inw_w flowing through the second unselected memory cell 194 and the third unselected memory cell 195 flows through a GND terminal.

In other words, the current Ipp that flows from the write power source 197 and the current Iswl that flows through the GND terminal are expressed by Equation 1 and Equation 2, respectively.

$$Ipp = Isel + Ib\_nw \quad \text{(Equation 1)}$$

$$Iswl = Isel + Inw\_w \quad \text{(Equation 2)}$$

Here, since both of the unselected WLs and the unselected BLs are in the Hi-z state, the following equation holds.

$$Ib\_nw = Inw\_w \quad \text{(Equation 3)}$$

Thus, the current Ipp of the write power source 197 and the GND current Iswl are identical to each other.

Considering that a size of the memory cell array 1 is defined by 128 bits (n=128) on the same bit line and 1024 bits (m=1024) on the same word line, a bit count of each of the unselected memory cells shown in FIG. 12 is calculated as follows: the first unselected memory cell 193 has n−1=127 bits; the second unselected memory cell 194 has (n−1)×(m−1)=127×1023 bits; and the third unselected memory cell 195 has m−1=1023 bits.

FIG. 13 shows a current-voltage characteristic (I-V characteristic) at a time of low resistance (LR) writing in the case of the above array size. In FIG. 13, the horizontal axis represents a voltage applied to each memory cell, and the vertical axis represents a current flowing through each memory cell. Here, three characteristic lines are described which respectively correspond to the current Isel (white triangle) flowing through the selected memory cell 30, the current Ib_nw (black triangle) flowing through the first unselected memory cell 193, and the current Inw_w (black triangle) flowing through the second unselected memory cell 194 and the third unselected memory cell 195.

In FIG. 13, in order to set, to RI, a low resistance value of a variable resistance element 10 of the selected memory cell 30, when a magnitude of the voltage across the variable resistance element 10 in the low resistance state in the characteristics shown in FIG. 8 is expressed as VR, a current Isela flowing through the variable resistance element 10 in the low resistance state is calculated as Isela=VR/RI, and thus it is necessary to apply, as the write voltage VPP at the time of low resistance writing, a voltage VPPa with which such a current flows. From FIG. 13, VPPa is applied as the write voltage VPP here in order to satisfy the conditions. (At this time the current Isel flowing through the selected memory cell 30 becomes Isela.)

Assuming that a voltage is the write voltage VPP and that a current has a point of Ib_nw=0 A as a starting point, the characteristics of the current Ib_nw flowing through the first unselected memory cell 193 become Ib_nw characteristics shown in FIG. 13. Moreover, assuming that a voltage is 0V and that a current has a point of Inw_w=0 A as a starting point, the characteristics of the current Inw_w flowing through the second unselected memory cell 194 and the third unselected memory cell 195 become Inw_w characteristics shown in FIG. 13. When the write voltage VPP=VPPa is applied, a current flowing through the second unselected memory cell 194 and the third unselected memory cell 195 is a current at an intersection point (operating point of point NW) of each characteristics where Ib_nw=Inw_w, and a magnitude of the current is Ihz.

As described above, in the memory cell array 1 having the above array size, when the current Isela for the low resisting writing flows through the selected memory cell 30, the leakage current Ihz flows through the unselected memory cells accordingly. Thus, the current flowing from the write power source 197 is calculated as Ipp=Isela+Ihz. Where a proportion of the current Isela flowing through the selected memory cell 30 to the power supply current Ipp is defined as writing efficiency, writing efficiency K is expressed by the following equation.

Writing efficiency $K = Isel/Ipp \times 100$ (%)

When the writing efficiency K is calculated from the current value, the following equation holds.

$$K = Isela/(Isela + Ihz)$$

In the example shown in FIG. 13, it is clear that approximately a mere quarter or less of the applied current contributes to writing, and the remaining three quarters or more wastefully flow as the leakage current.

In this manner, most of the applied current from the write power source 197 is wasted as the leakage current flowing through the unselected memory cells, and thus a consumption current at the time of writing increases significantly. Increasing the proportion of the current flowing through the selected memory cell to the applied current, that is, the writing efficiency, leads to reduction in the consumption current.

The inventors have found one access method that successfully solves the above problem, that is, successfully increases writing efficiency.

[Increasing Efficiency by Multi-Bit Simultaneous Writing]

Figure 14:
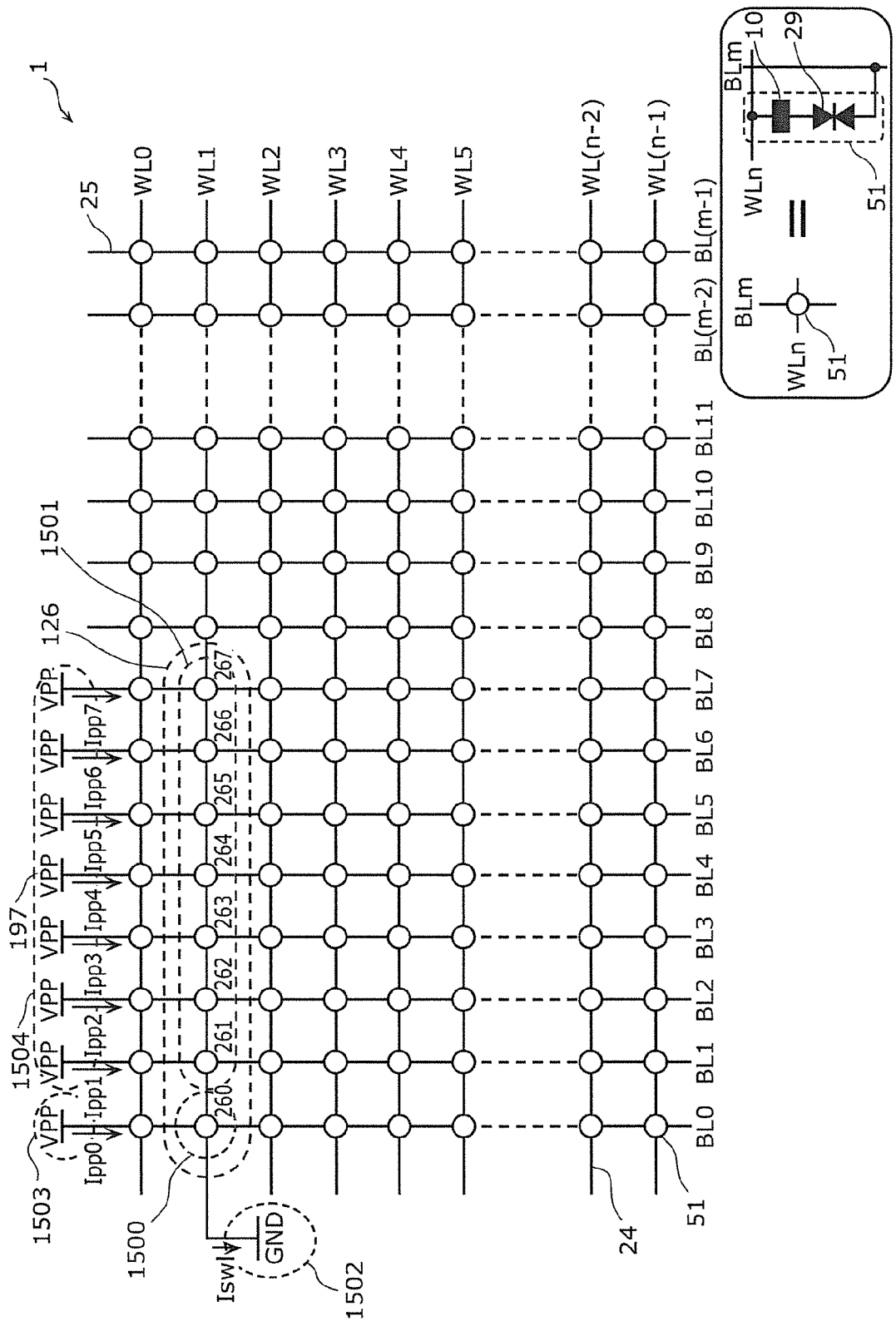
FIG. 14 is a conceptual diagram showing selection of memory cells at a time of multi-bit simultaneous writing.

In FIG. 14, each of memory cells 51 has the same configuration as shown in FIG. 4, and is placed at a different one of cross points of word lines 24 and bit lines 25, so as to form a matrix. A memory cell array 1 includes: WL0 to WL(n−1), an n number of word lines 24, arranged in parallel with each other in X direction; BL0 to BL(m−1), a m number of bit lines 25, arranged in parallel with each other to be orthogonal to the word lines 24 in Y direction; and each memory cell 51 placed at a different one of cross points of the word lines 24 and the bit lines 25. Here, logically, the memory cell array 1 includes: first memory cells for data storage each of which is connected to a different one of bits; and second memory cells that are connected to the same word lines WL0 to WL(n−1) as those connected to the first memory cells and are connected to other bit lines (an A number of bit lines). The following describes a case where simultaneous writing is performed on memory cells placed at cross points of (an (A+1) number of) selected bit lines and one selected word line in such a configuration.

In FIG. 14, a word line write circuit 1502 applies a ground (GND) voltage to WL1 as a selected word line, a first bit line write circuit 1503 applies a write voltage VPP of a power source to at least one BL0 as a selected bit line, to store data, and a memory cell 260 placed at a cross point of the selected word line WL1 and the selected bit line BL0 is selected as a memory cell (i.e., a memory cell included in first memory cells 1500) for data storage (intended for data storage), thereby performing a write operation. On the other hand, at the same time, a second bit line write circuit 1504 applies a write voltage VPP of the power source to seven bits (an A number of exemplary selected bit lines) of BL1 to BL7 as bit lines selected for data storage or for performing a write operation not for data storage, and 7-bit memory cells 261 to 267 each placed at a different one of cross points of the selected word line WL1 and the selected bit lines BL1 to BL7 are selected as memory cells (i.e., memory cells included in second memory cells 1501) for data storage or for write operation not for data storage, thereby performing the same write operation as that of the selected memory cell 260.

Consequently, the write operation is performed using at least 1 bit for data storage and the other bits for data storage or not for data storage, and thus the eight bits (exemplary (1+A) bits) on the same word line are selected as write operation target bits (selected 8-bit memory cells 126).

It is to be noted that a "memory cell for data storage" is a memory cell used for data storage and has a data retention function. In contrast, a "memory cell not for data storage" is a memory cell not used for data storage and being merely a data write target, and does not need to have a data retention function. As will be described, the "memory cell not for data storage" is used as a dummy when the same data ("1 (the low resistance state)" or "0 (the high resistance state)") is written to a fixed number (e.g., 8 bits) of memory cells. For instance, in the case of always performing 8-bit simultaneous writing, when it is intended to write "1" to three memory cells, "1" is simultaneously written to eight memory cells including three "memory cells for data storage" and five "memory cells not for data storage." The "memory cell not for data storage" is used in such a manner.

It is to be noted that the selected memory cells 126 in this example merely represent examples of the simultaneously selected 8-bit memory cells 260 to 267, and thus are exemplary memory cells when eight memory cells each placed at a different one of cross points of the one selected word line WL1 and the eight consecutive selected bit lines BL0 to BL7 are selected, and are not necessarily adjacent memory cells.

A write power source 197 is a power source that generates a voltage at a time of writing (write voltage) VPP. The write power source 197 is electrically connected to the eight selected bit lines BL0 to BL7 that is included in the first bit line write circuit 1503 and the second bit line write circuit 1504 or generates the voltage VPP through the first bit line write circuit 1503 and the second bit line write circuit 1504 and further through a first bit line selection circuit (not shown) between the first bit line write circuit 1503 and BL0 and a second bit line selection circuit (not shown) between the second bit line write circuit 1504 and BL1 to BL7. It is to be noted that the first bit line selection circuit is a circuit that selects one of bit lines of first memory cells as a first bit line. It is also to be noted that the second bit line selection circuit is a circuit that selects A (A is an integer greater than or equal to 1) bit lines of second memory cells as at least one second bit line.

On the other hand, a ground (GND) voltage 0V is electrically connected to the one selected word line WL1 through the word line write circuit 1502 and a word line selection circuit (not shown). Other unselected bit lines and unselected word lines are electrically blocked by the first bit line selection circuit, the second bit line selection circuit, and the word line selection circuit, and thus are in the high impedance (Hi-z) state. To put it another way, the first bit line selection circuit and the second bit line selection circuit put the unselected bit lines into the high impedance state. It is to be noted that the word line selection circuit is a circuit that selects one of word lines as a selected word line for a memory cell array, and puts the other unselected word lines into the high impedance state.

Thus, among two terminals of each selected memory cell, the write voltage VPP is applied to one terminal connected to a current steering element 29, and the GND voltage is applied to the other terminal connected to a variable resistance element 10. This allows a low resistance writing operation to be simultaneously performed on eight bits.

It is to be noted that in high resistance writing when a current flows from a selected word line to a selected bit line contrary to when a current flows from a selected bit line to a selected word line, an 8-bit (i.e., (1+A)-bit) simultaneous high resistance writing operation is successfully performed by electrically applying a low voltage such as the ground (GND) voltage to unselected bit lines and a high voltage such as the write voltage VPP to one selected word line.

It is to be noted that the diagram shown in FIG. 14 is a diagram showing the concept, and shows, as an example of the concept, a state where, when writing is performed on a write target memory cell of one bit (the first memory cells 1500), a write operation is being performed on memory cells of seven bits (the second memory cells 1501) on the same word line under the same bias conditions as those of the write target memory cell of one bit. Thus, as long as the selected memory cells on which the write operation is performed are on the same word line, the selected memory cells may not be adjacent to each other.

It is to be noted that the first bit line selection circuit and the second bit line selection circuit each are a circuit that functions in the same manner as NMOS transistors TS0_0_0 to TS0_0_m−1 that are first selection elements in a first selection circuit S0_0 shown in FIG. 20 to be described later.

The inventors have found that such multi-bit simultaneous writing to bits connected on the same word line is a method of writing that successfully increases writing efficiency.

Figure 15:
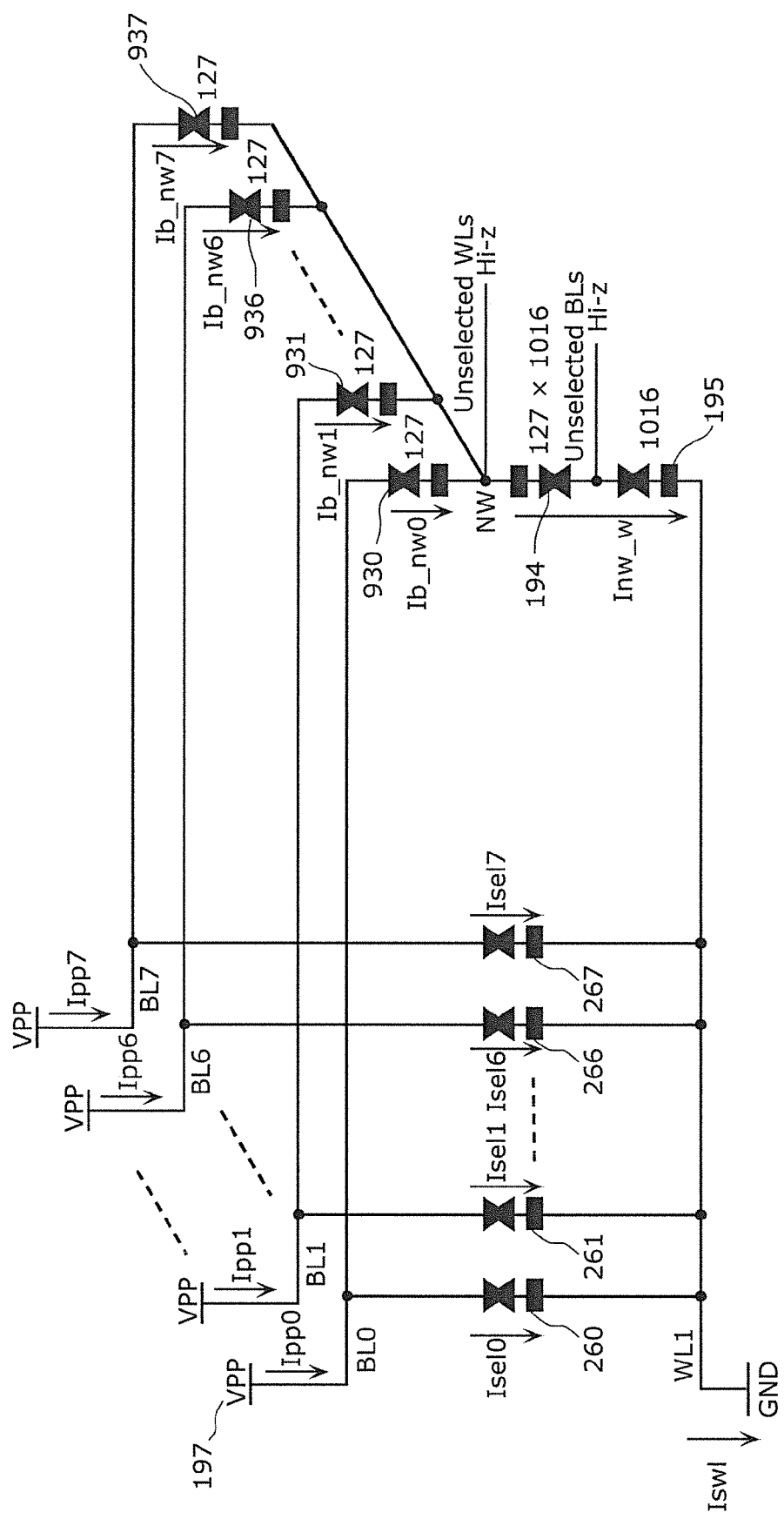
FIG. 15 is an equivalent circuit diagram illustrating a state of multi-bit simultaneous writing.
(a) in FIG. 16 is an I-V characteristic graph for a memory cell array at a time of 1-bit writing, and (b) in FIG. 16 is an I-V characteristic graph for a memory cell array at a time of multi-bit simultaneous writing.
Figure 16:
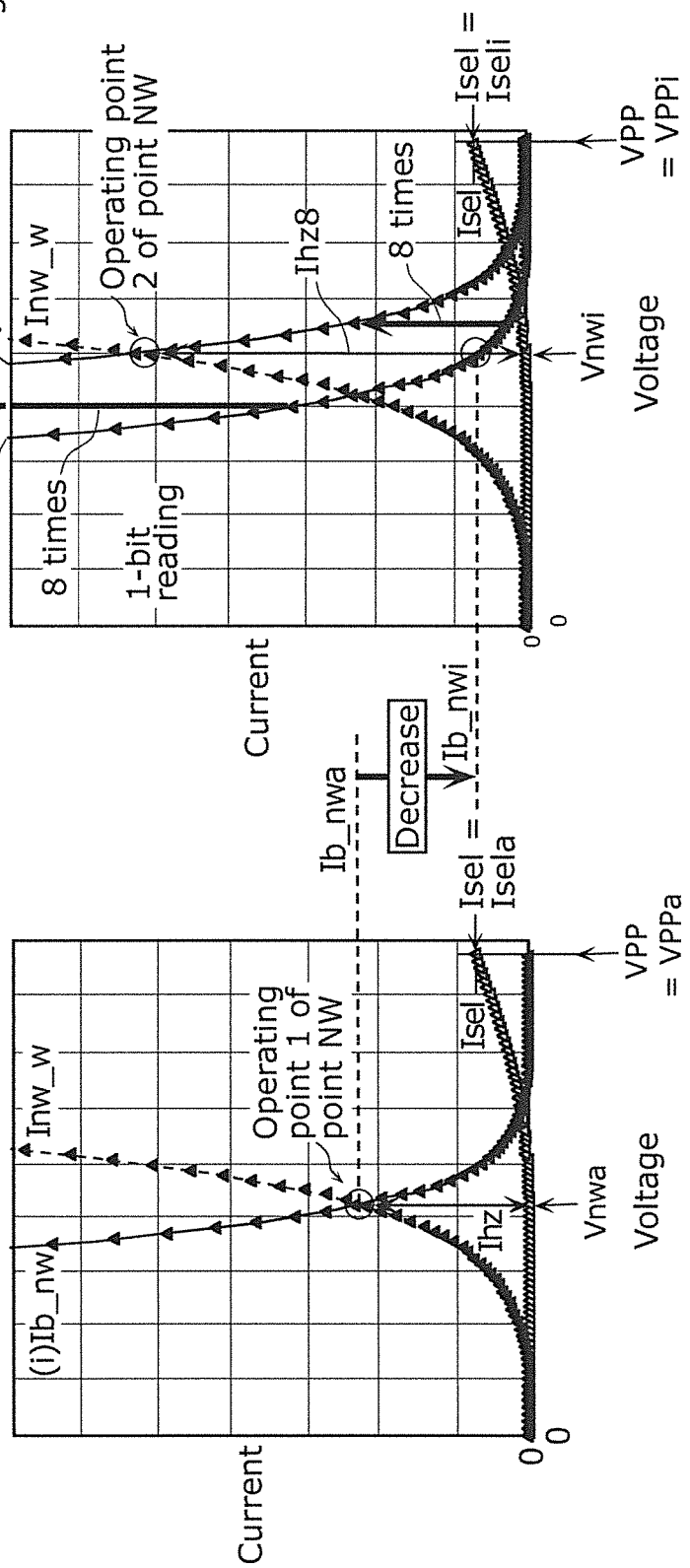

The following describes reasons for the increase in efficiency by the method, with reference to an equivalent circuit shown in FIG. 15 and graphs each showing an I-V characteristic of a memory cell array shown in FIG. 16.

FIG. 15 is a diagram showing a relationship among an array equivalent circuit of the selected 8-bit memory cells 260 to 267 and the other unselected memory cells shown in FIG. 14, a low resistance writing power source 197 (a write voltage VPP), and a GND power source (0 V).

In FIG. 15, a selected memory cell 260 has one terminal connected to a selected word line WL1, and the other terminal connected to a selected bit line BL0. Likewise, a second selected memory cell 261 has one terminal connected to the selected word line WL1, and the other terminal connected to the selected bit line BL1. Similarly, a seventh selected memory cell 266 has one terminal connected to the selected word line WL1, and the other terminal connected to the selected bit line BL6. In the same way, an eighth selected memory cell 267 has one terminal connected to the selected word line WL1, and the other terminal connected to the selected bit line BL7. It is to be noted that, although not shown in the figure, third to sixth selected memory cells similarly have the other terminals connected to the selected bit lines BL2 to BL5, respectively.

Moreover, a tenth unselected memory cell 930 has one terminal connected to unselected word lines NW, and the other terminal connected to the selected bit line BL0. Likewise, an eleventh unselected memory cell 931 has one terminal connected to the unselected word lines NW, and the other terminal connected to the selected bit line BL1. Similarly, a sixteenth unselected memory cell 936 has one terminal connected to the unselected word lines NW, and the other terminal connected to the selected bit line BL6. In the same way, a seventeenth unselected memory cell 937 has one terminal connected to the unselected word lines NW, and the other terminal connected to the selected bit line BL7. It is to be noted that, although not shown in the figure, twelfth to fifteenth unselected memory cells similarly have the other terminals connected to the selected bit lines BL2 to BL5, respectively.

A second unselected memory cell 194 is a memory cell provided between unselected WLs and unselected BLs. A third unselected memory cell 195 is a memory cell provided between unselected BLs and the selected word line WL1. A target number of each of second unselected memory cells 194 and third unselected memory cells 195 slightly varies depending on the number of selected memory cells. A write power source 197 is electrically connected to each of the selected bit lines BL0 to BL7. The selected word line WL1 is electrically connected to a ground (GND) power source (0V). It is to be noted that unselected bit lines (corresponding to unselected BLs in FIG. 15) and unselected word lines (corresponding to unselected WLs in FIG. 15) are in the high impedance (Hi-z) state.

(a) and (b) in FIG. 16 show operating point diagrams each for an I-V characteristic of the memory cell array shown in FIG. 15 with reference to unselected word lines (point NW) in the case of the multi-bit simultaneous writing operation in the memory cell array, comparing 1-bit writing and simultaneous writing to eight bits on the same word line. (a) in FIG. 16 is a characteristic diagram at a time of 1-bit writing and the same as FIG. 13. (b) in FIG. 16 is a characteristic diagram obtained by adding, to (a) in FIG. 16, a sum (corresponding to $Ib\_nw \times 8$) of currents $Ib\_nw0$ to $Ib\_nw7$ flowing through the tenth to seventeenth unselected memory cells 930 to 937 at a time of 8-bit simultaneous writing.

In (a) in FIG. 16 (and (b) in FIG. 16), the horizontal axis represents a voltage applied to each memory cell, the vertical axis represents a current flowing through each memory cell, and the following currents are described as three characteristic lines: a current Isel (white triangle, corresponding to Iseli (where i is an integer from 0 to 7) in FIG. 13 and Isel0 to Isel7) flowing through a selected memory cell 30 (corresponding to the selected memory cells 260 to 267 in FIG. 13); a current $Ib\_nw$ (black triangle, corresponding to $Ib\_nwi$ (where i is an integer from 0 to 7) in FIG. 13 and $Ib\_nw0$ to $Ib\_nw7$) flowing through the tenth to seventeenth unselected memory cells 930 to 937; and a current $Inw\_w$ (black triangle) flowing through the second unselected memory cell 194 and the third unselected memory cell 195.

In order to perform the low resistance writing, VPPa (VPPi in (b) in FIG. 16, VPPi=VPPa) is applied as the write voltage VPP. Here, the current Isel flowing through the selected memory cell 30 becomes Isela (Iseli in (b) in FIG. 16, Iseli=Isela).

Assuming that a voltage is the write voltage VPP and that a current has a point of $Ib\_nw=0$ A as a starting point, the characteristics of the current $Ib\_nw$ (corresponding to $Ib\_nw0$ to $Ib\_nw7$) flowing through the tenth to seventeenth unselected memory cells 930 to 937 become $Ib\_nw$ characteristics (i) shown in (a) and (b) in FIG. 16. Moreover, assuming that a voltage is 0 V and that a current has a point of $Inw\_w=0$ A as a starting point, the characteristics of the current $Inw\_w$ flowing through the second unselected memory cell 194 and the third unselected memory cell 195 become $Inw\_w$ characteristics shown in (a) and (b) in FIG. 16. In (a) in FIG. 16, a current that flows when the write voltage VPP=VPPa is applied is a current at an intersection point (operating point of point NW) of each characteristics where $Ib\_nw=Inw\_w$, and a magnitude of the current is Ihz. Thus, the current flowing from the write power source 197 is calculated as Ipp=Isela+Ihz. In the example shown in (a) in FIG. 16, a proportion of the current Isela flowing through the selected memory cell to the power supply current Ipp, that is, writing efficiency K is approximately 25%.

Moreover, here, an operating voltage at point NW is Vnwa in (a) in FIG. 16.

In contrast, when simultaneous writing is performed on the eight memory cells on the same selected word line, the write voltage VPP is applied from the write power source 197 to each selected bit line. The currents flow through the unselected WLs through the tenth to seventeenth unselected memory cells 930 to 937, and a sum of the currents is eight times as much as the time of 1-bit writing. In view of this, a current ($Ib\_nw \times 8$ shown in (ii) in (b) in FIG. 16) that is eight times as much as a current (i) $Ib\_nw$ at the time of 1-bit writing flows at point NW, and thus an intersection point (operation point 2 of point NW) of a characteristic line (ii) shown in (b) in FIG. 16 and the current $Inw\_w$ flowing through the second unselected memory cell 194 and the third unselected memory cell 195 is an operating point at the time of 8-bit simultaneous writing. A current concentrated at point NW here is Ihz8, and a voltage at point NW here rises to Vnwi (Vnwi>Vnwa).

Each of the currents $Ib\_nw0$ to $Ib\_nw7$ flowing through the tenth to seventeenth unselected memory cells 930 to 937 connected to the respective bit lines at the time of the 8-bit simultaneous writing corresponds to a current when the voltage at point NW is Vnwi, and thus is $Ib\_nwi$. In other words, the current $Ib\_nwa$ at the time of the 1-bit writing is reduced to $Ib\_nwi$ by the 8-bit simultaneous writing.

Thus, the current Ipp flowing from the write power source 197 to one selected bit line is calculated as below.

$Ipp=Iseli+Ib\_nwi$

A proportion of the current Iseli flowing through the selected memory cell to the current Ipp, that is, writing efficiency K is calculated as below.

$K=Iseli/(Iseli+Ib\_nwi)$

In the example shown in (b) in FIG. 16, the writing efficiency K is approximately 50%.

To put it another way, the writing efficiency for the one selected memory cell is approximately 25% at the time of the 1-bit writing and approximately 50% at the time of the simultaneous writing to eight bits on the same word line. It is clear that such a method of writing successfully increases the writing efficiency by approximately two times.

As described above, the method of simultaneously writing to the memory cells on the same word line successfully reduces the leakage current flowing through the unselected memory cells at the time of writing, and further successfully reduces the consumption current at the time of writing.

It is to be noted that although the simultaneous writing to the bits on the same word line has been described as the example using the low resistance writing performed on the selected memory cell, the high resistance writing in which a high voltage is applied to a selected word line and a low voltage is applied to a selected bit line is also expected to produce the same effect.

It is to be noted that although the exemplary mode in which the voltage is applied to the selected word line in the above configuration has been described, it goes without saying that a mode in which a constant current is applied to a selected word line is also expected to produce the same effect. The following describes the effect of multi-bit simultaneous writing in writing by the application of the constant current.

[Effect of Multi-Bit Simultaneous Writing in Writing by Application of Constant Current]

In terms of characteristics of a resistance change of the variable resistance element 10 in the memory cell 51, as described with reference to FIG. 8, to perform a stable resistance change operation to change to the low resistance state, it is necessary to perform current control (current steering) so that a predetermined amount of a current flows through the selected memory cell 51. It is to be noted that in the case of voltage control, a current steering element 29 has non-linear characteristics and significantly large fluctuation in current vis-a-vis fluctuation in voltage, and thus it is difficult to control a resistance value determined by an amount of a flowing current.

From the above, the following describes influence on and effect of the method of simultaneous writing to bits on the same word line when the current control is performed in the low resistance writing.

Figure 17:
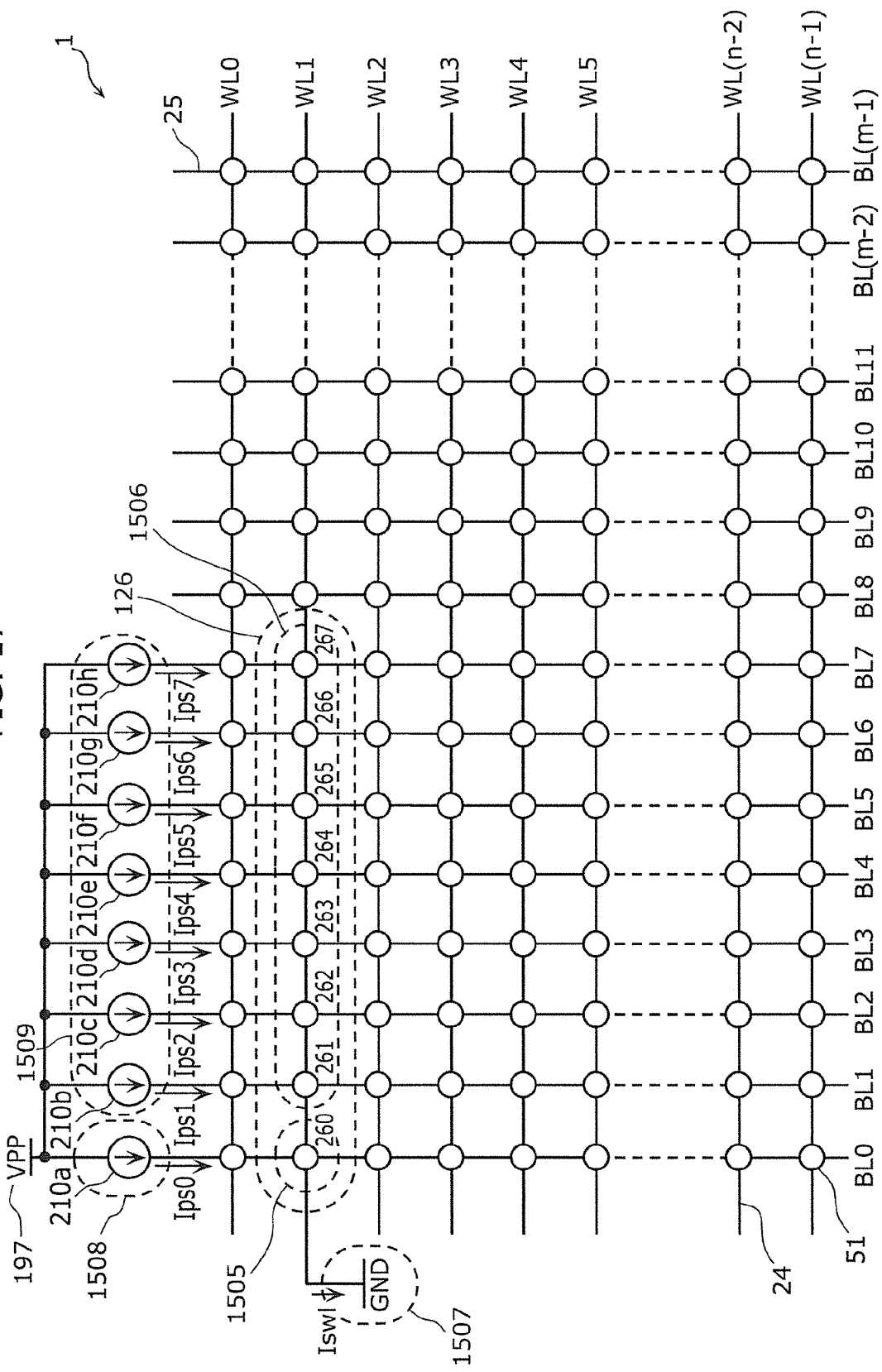
FIG. 17 is a conceptual diagram showing selection of memory cells at a time of multi-bit simultaneous writing by application of a constant current.

FIG. 17 is a configuration diagram showing a memory cell array 1 when multi-bit simultaneous writing is performed by application of a constant current. It is to be noted that FIG. 17 shows a state of 8-bit simultaneous writing. FIG. 17 differs from FIG. 14 only in that write constant current sources 210*a* to 210*h* are inserted into the memory cell configuration diagram shown in FIG. 12 as structural elements connected to selected bit lines BL0 to BL7, in addition to the write power source 197. Thus, only the part of FIG. 17 that is different from FIG. 14 is described below.

In FIG. 17, a word line write circuit 1507 applies a ground (GND) voltage to WL1 as a selected word line, a first bit line write circuit 1508 applies a write constant current Ips0 to at least one BL0 as a selected bit line, to store data, and a memory cell 260 placed at a cross point of the selected word line WL1 and the selected bit line BL0 is selected as a memory cell (i.e., a memory cell included in first memory cells 1505) for data storage (intended for data storage), thereby performing a write operation. On the other hand, at the same time, a second bit line write circuit 1509 applies write constant currents Ips1 to Ips7 to seven bits (the A number of the exemplary selected bit lines) of BL1 to BL7 as bit lines selected for data storage or for performing a write operation not for data storage, and 7-bit memory cells 261 to 267 each placed at a different one of cross points of the selected word line WL1 and the selected bit lines BL1 to BL7 are selected as memory cells (i.e., memory cells included in second memory cells 1506) for data storage or for write operation not for data storage, thereby performing the same write operation as that of the selected memory cell 260.

Consequently, the write operation is performed using at least one bit for data storage and the other bits for data storage or not for data storage, and thus the eight bits on the same word line are selected as write operation target bits (selected 8-bit memory cells 126).

It is to be noted that the selected memory cells 126 in this example merely represent examples of the simultaneously selected 8-bit memory cells 260 to 267, and thus are exemplary memory cells when eight memory cells each placed at a different one of cross points of the one selected word line WL1 and the eight consecutive selected bit lines BL0 to BL7 are selected, and are not necessarily adjacent memory cells.

The write constant current sources 210*a* to 210*h* are power sources that generate the currents (write currents) Ips0 to Ips7 at a time of writing. The current sources are electrically connected to the eight selected bit lines BL0 to BL7 that are included in the first bit line write circuit 1508 and the second bit line write circuit 1509 or generate the currents Ips0 to Ips7 through the first bit line write circuit 1508 and the second bit line write circuit 1509, and further through a first bit line selection circuit (not shown) between the first bit line write circuit 1508 and BL0, and a second bit line selection circuit (not shown) between the second bit line write circuit 1509 and BL1 to BL7.

It is to be noted that the currents Ips0 to Ips7 supplied from the write constant current sources 210*a* to 210*h* have the substantially same amount.

On the other hand, a ground (GND) voltage 0 V is electrically connected to the one selected word line WL1 through a word line write circuit 1507 and a word line selection circuit (not shown), and other unselected bit lines and unselected word lines are electrically blocked by the word line selection circuit and thus are in the high impedance (Hi-z) state.

Thus, among two terminals of each selected memory cell, the write currents Ips0 to Ips7 are applied to one terminal connected to the current steering element 29, and the GND voltage is applied to the other terminal connected to a variable resistance element 10. This allows a low resistance writing operation to be simultaneously performed on eight bits.

It is to be noted that in high resistance writing when a current flows from a selected word line to a selected bit line contrary to when a current flows from a selected bit line to a selected word line, an 8-bit simultaneous high resistance writing operation is successfully performed by electrically applying a sink constant current to unselected bit lines and a high voltage such as the write voltage VPP to one selected word line.

It is to be noted that the diagram shown in FIG. 17 is a diagram showing a the concept, and shows, as an example of the concept, a state where, when writing is performed on a write target memory cell of 1 bit (the first memory cells), a write operation is performed on memory cells of 7 bits (the second memory cells) on the same word line under the same bias conditions as those of the write target memory cell of 1 bit. Thus, as long as the selected memory cells on which the write operation is performed are on the same word line, the selected memory cells may not be adjacent to each other.

It is to be noted that the first bit line selection circuit and the second bit line selection circuit each are the circuit that functions in the same manner as the NMOS transistors TS0_0_0 to TS0_0_m−1 that are the first selection elements in the first selection circuit S0_0 shown in FIG. 20 to be described later.

Figure 18:
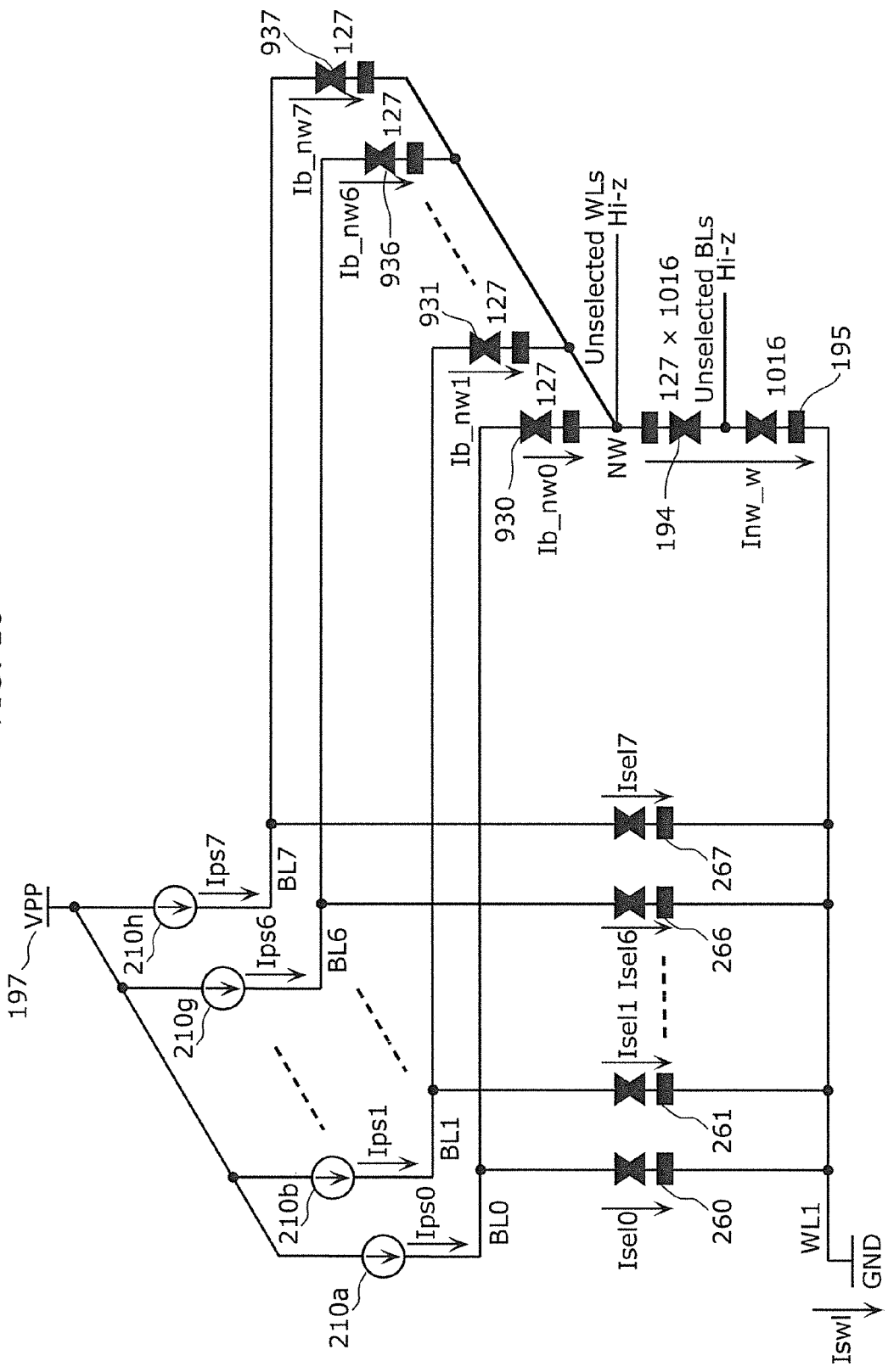
FIG. 18 is an equivalent circuit diagram illustrating a state of multi-bit simultaneous writing by application of a constant current.

FIG. 18 represents the configuration diagram shown in FIG. 17 as a memory cell array equivalent circuit. FIG. 18 also differs from FIG. 15 only in that write constant current sources are inserted to the memory cell array equivalent circuit shown in FIG. 15 as structural elements connected to selected bit lines BL0 to BL7, in addition to the write power source 197.

As described in terms of the effect produced by the multibit simultaneous writing, the simultaneous writing to the bits on the same word line has the higher writing efficiency than that of the 1-bit writing, that is, the proportion of the current flowing through the selected memory cell to the current flowing through the selected bit lines increases, and thus it is expected that a set resistance value will differ depending on the number of bits simultaneously written, when the low resistance writing in which a resistance value is determined according to an amount of flowing current is performed.

To verify this, a writing simulation using the memory cell array equivalent circuit shown in FIG. 18 is performed. A variable resistance element mode in which when a voltage VR applied to a selected variable resistance element 10 reaches a predetermined voltage, a resistance value of the variable resistance element 10 is determined according to VR and an amount of a current flowing through the variable resistance element 10 (i.e., the resistance value is calculated as VR/the amount of the current) is used for a simulation method. In this manner, a current flowing through the variable resistance element 10 and a resistance value of the variable resistance element 10 are calculated in connection with the number of bits simultaneously written.

Figure 19A:
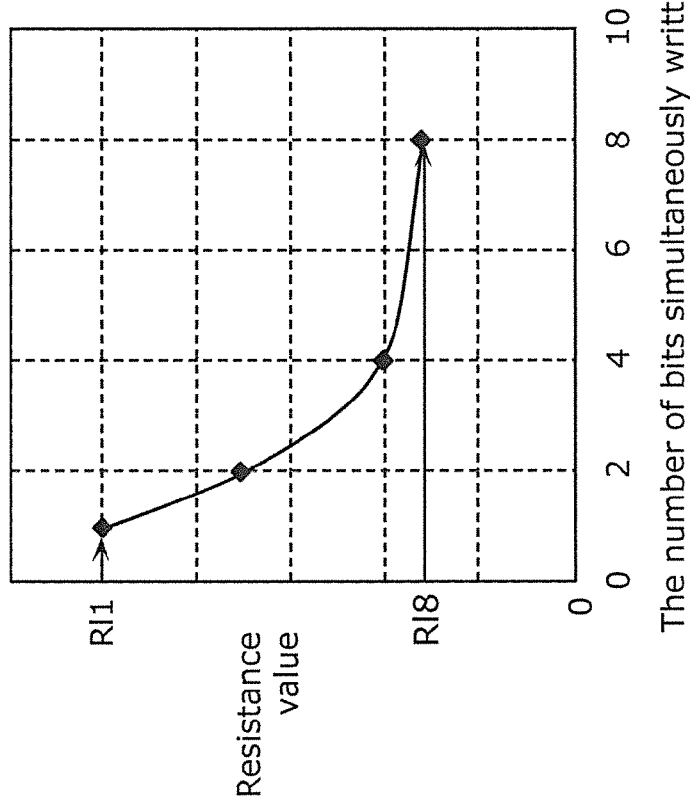
FIG. 19A is a graph showing dependency of a selected memory cell current on the number of bits simultaneously written by application of a constant current.
Figure 19B:
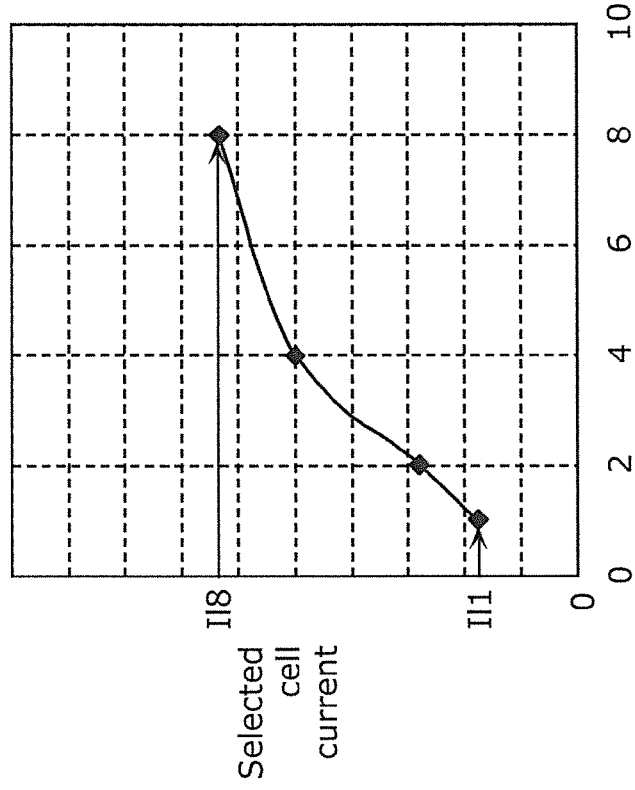
FIG. 19B is a graph showing dependency of a set resistance value of a selected memory cell on the number of bits simultaneously written by application of a constant current.

FIG. 19A and FIG. 19B each are a graph showing a calculation result.

FIG. 19A is a graph whose horizontal axis represents the number of bits simultaneously written and vertical axis represents a current flowing through a selected memory cell that is a target of the low resistance writing. According to the graph of FIG. 19A, whereas a current flowing through a selected memory cell is Il1 in the 1-bit writing, a cell current increases as the number of bits on the same word line that are simultaneously written increases, and increases to Il8 in the 8-bit simultaneous writing.

FIG. 19B is a graph obtained by plotting, based on the current values in FIG. 19A, low resistance set values according to the calculation method.

FIG. 19B is a graph whose horizontal axis represents the number of bits simultaneously written and vertical axis represents a set resistance value of a variable resistance element that is a target of the low resistance writing. According to the graph of FIG. 19B, although a current flowing through a selected memory cell is Il1 in the 1-bit writing, a voltage VR applied to the variable resistance element does not reach a threshold voltage necessary for resistance change, and thus a resistance change (low resistance writing) fails to occur, and the resistance value is Rl1 corresponding to the high resistance (HR) state. The resistance change (low resistance writing) of the variable resistance element occurs when the number of bits simultaneously written is greater than or equal to two bits. The set resistance value decreases as the number of bits simultaneously written increases, and decreases to Rl8 in the 8-bit simultaneous writing.

As stated above, the method of simultaneously writing to memory cells on the same word line makes it possible to efficiently set the low resistance writing (i.e., to control a resistance value of the variable resistance element 10 in the low resistance state) when the variable resistance element 10 of the selected memory cell is changed to the low resistance state, in addition to the low power consumption effect by the increase in the writing efficiency.

To summarize, in the cross point variable resistance nonvolatile memory device, the following method is considered as a programming method when simultaneous writing is performed on memory cells on the same word line.

In the case where memory cells that constitute a memory cell array include memory cells of two groups that share a word line, that is, (i) first memory cells for data storage and (ii) second memory cells for data storage or not for data storage, when one or more predetermined memory cells of the first memory cells are written to by changing the one or more predetermined memory cells to a first resistance state (the high resistance state/low resistance state), a word line write circuit provides a first voltage or a first current to a selected word line, a first bit line write circuit provides a third voltage or a third current to one bit line of the first memory cells, and a second bit line write circuit provides the third voltage or the third current to the A bit line or lines of the second memory cells.

Specifically, the word line write circuit provides the first voltage to one selected word line, and the first bit line write circuit and the second bit line write circuit provide the third voltage to selected bit lines, thereby simultaneously writing to selected memory cells each placed at a different one of cross points of the selected bit lines and the one selected word line, by changing the selected memory cells to the first resistance state.

Alternatively, the word line write circuit provides the first voltage to one selected word line, and the first bit line write circuit and the second bit line write circuit provide the third current to selected bit lines, thereby simultaneously writing to selected memory cells each placed at a different one of cross points of the selected bit lines and the one selected word line, by changing the selected memory cells to the first resistance state.

In contrast, when one or more predetermined memory cells of the first memory cells are written to by changing the one or more predetermined memory cells to a second resistance state (the high resistance state/low resistance state), the word line write circuit provides a second voltage or a second current to a selected word line, the first bit line write circuit provides a fourth voltage or a fourth current to one bit line of the first memory cells, and the second bit line write circuit provides the fourth voltage or the fourth current to the A bit line or lines of the second memory cells.

Specifically, the word line write circuit provides the second voltage to one selected word line, and the first bit line write circuit and the second bit line write circuit provide the fourth voltage to selected bit lines, thereby simultaneously writing to selected memory cells each placed at a different one of cross points of the selected bit lines and the one selected word line, by changing the selected memory cells to the second resistance state.

Alternatively, the word line write circuit provides the second voltage to one selected word line, and the first bit line write circuit and the second bit line write circuit provide the fourth current to selected bit lines, thereby simultaneously writing to selected memory cells each placed at a different one of cross points of the selected bit lines and the one selected word line, by changing the selected memory cells to the second resistance state.

In particular, it is possible to set a resistance value of a variable resistance element in the low resistance state to be a desired value by writing to a memory cell by applying a constant current to the memory cell.

Here, when the first bit line write circuit and the second bit line write circuit apply a voltage to the selected bit lines, for instance, a voltage of approximately the same (substantially the same) level is applied. Moreover, when the first bit line write circuit and the second bit line write circuit apply a current to the selected bit lines, for example, a current having approximately the same (substantially the same) amount is applied. In this way, the voltage or the current applied to variable resistance elements included in memory cells is adjusted to be the same value, any variable resistance element included in a corresponding one of the memory cells is set to approximately the same high resistance state or low resistance state, thereby achieving stable writing.

[Write Operation for Cross Point Memory Cell Array]

As stated above, in order to stabilize the low resistance state, the memory cells not for data storage are provided in addition to the memory cells for data storage, and the write operation is performed on these memory cells to simultaneously apply the write voltage and the write current to the fixed number of the bits on the same word line.

Here, in order to explain a problem in the multi-bit simultaneous writing as presented above, a write operation for a cross point memory cell array is described focusing on a distance from a word line drive circuit to each of bits to be written simultaneously.

Figure 20:
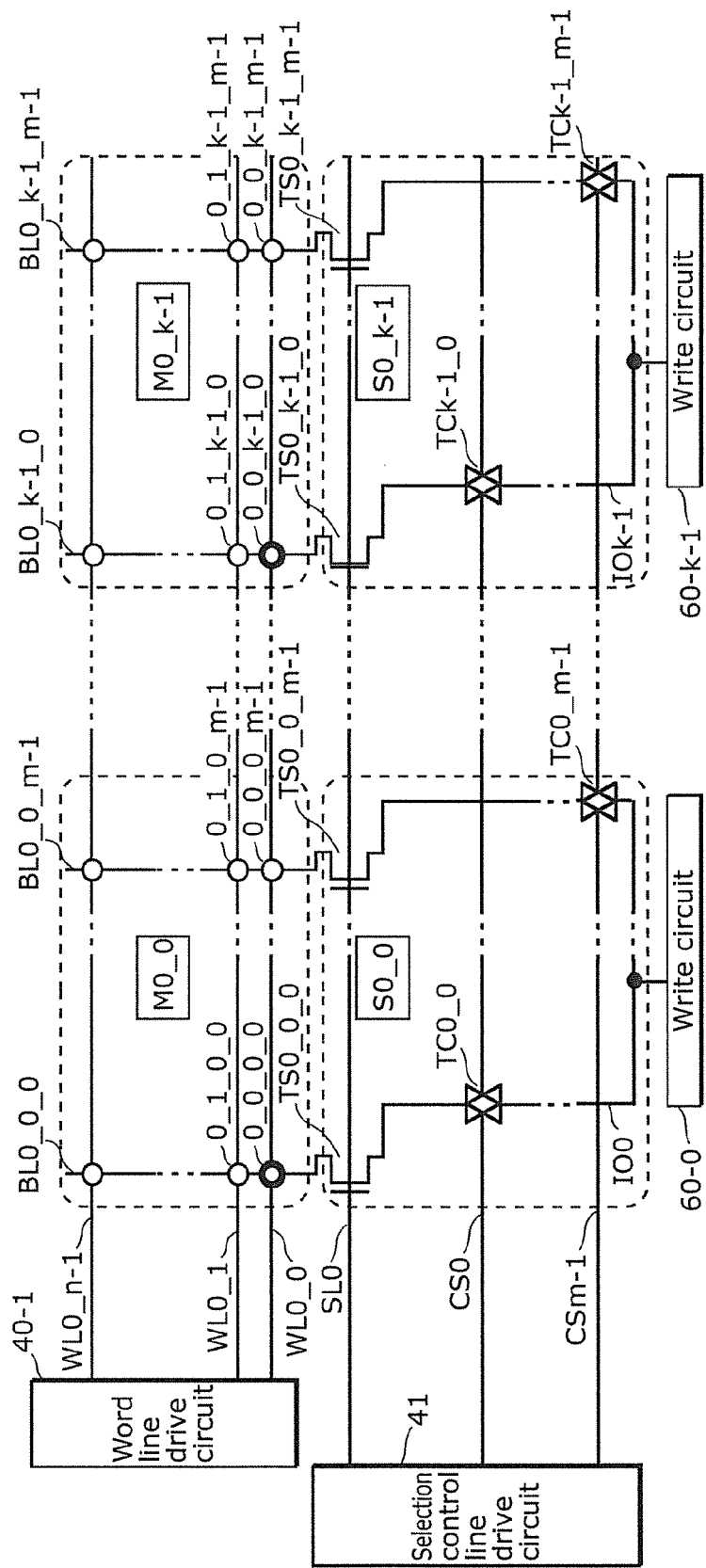
FIG. 20 is a block diagram of a memory cell array including cross point memory cells.

FIG. 20 is an exemplary block diagram of a memory cell array in which the memory cells 51 as shown in FIG. 1A or FIG. 1B are arranged in a matrix.

The memory cell array shown in FIG. 20 includes an n number of word lines WL0_0 to WL0_n−1 driven by a word line drive circuit 40-1, and a k×m number of bit lines BL0_0_0 to BL0_k−1_m−1 that cross the word lines in a contactless manner. The memory cell array is divided into a k number of blocks (memory cell array blocks M0_0 to M0_k−1) in a word line direction. In the mufti-bit simultaneous writing, one bit line is selected for each of the memory cell array blocks M0_0 to M0_k−1, and k bits in total are simultaneously written.

The following describes a configuration of the memory cell array blocks M0_0 to M0_k−1, using the memory cell array block memory cell array block M0_0 as an example.

Figure 21A:
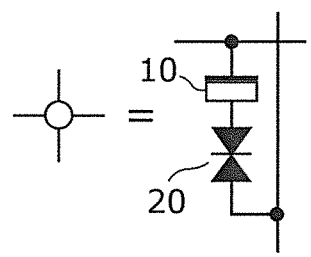
FIG. 21A is a circuit diagram of a cross point memory cell.

The memory cell array block M0_0 includes an n number of word lines WL0_0 to WL0_n−1 and an m number of bit lines BL0_0_0 to BL0_0_m−1. The memory cell array block M0_0 includes: memory cells 0_0_0_0 to 0_n−1_0_m−1 in each of which a variable resistance element 10 and a current steering element 20 shown in FIG. 21A are connected in series, and each of which is placed at a corresponding one of cross points of the word lines WL0_0 to WL0_n−1 and the bit lines BL0_0_0 to BL0_0_m−1; the variable resistance elements 10 each having one end connected to a corresponding one of the word lines; and the current steering elements 20 each having one end connected to a corresponding one of the bit lines.

It is to be noted that in the expression "memory cell a_b_c_d," the subscript a is an identifier of a layer in a stack structure, the subscript b is an identifier of a word line, the subscript c is an identifier of a bock, and the subscript d is an identifier of a bit line. Moreover, in the expression "word line WLa_b," the subscript a is an identifier of a layer in a stack structure, and the subscript b is an identifier of a word line. Furthermore, in the expression "bit line BLa_b_c," the subscript a is an identifier of a layer in a stack structure, the subscript b is an identifier of a block, and the subscript c is an identifier of a bit line.

Figure 21B:
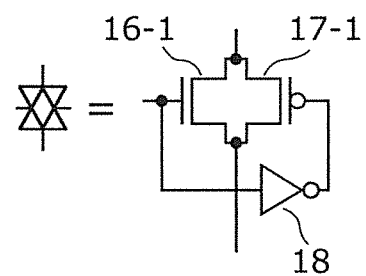
FIG. 21B is a circuit diagram of a transfer gate.

Moreover, in the memory cell array block M0_0, the m bit lines BL0_0_0 to BL0_0_m−1 are connected to respective transfer gates TC0_0 to TC0_m−1 through NMOS transistors TS0_0_0 to TS0_0_m−1 that are first selection elements in a first selection circuit S0_0, according to a sub bit line selection control signal SL0 driven by a selection control line drive circuit 41. The m number of the transfer gates TC0_0 to TC0_m−1 each include, as shown in FIG. 21B, an NMOS transistor 16-1, a PMOS transistor 17-1, and a logic inverter gate 18, and selectively connect the NMOS transistors TS0_0_0 to TS0_0_m−1, the first selection elements, to a data line IO0.

Furthermore, the other memory cell array blocks M0_1 to M0_k−1 are connected to the memory cell array block M0_0 through a common word line. The entire memory cell array includes a k number of data lines IO0 to IOk−1 as a bus width. A k number of write circuits 60-0 to 60-k−1 each corresponding to a different one of a k number of the memory cell array blocks M0_0 to M0_k−1 provide respective memory cells with a voltage necessary for resistance change through the data lines IO0 to IOk−1. With such a configuration, in the multi-bit simultaneous writing, the selection control line drive circuit 41 outputs the sub bit line selection control signal SL0 and main bit line selection control signals CS0 to CSm−1 to activate one bit line for each of the memory cell array blocks M0_0 to M0_k−1, thereby simultaneously writing the k bits.

In the mean time, it is important that the NMOS transistors (the NMOS transistors TS0_0_0 to TS0_0_m−1 in the case of the memory cell array block M0_0), the first selection elements, perform current control (are operated by source followers) for current steering in the low resistance writing for performing a stable resistance change operation, in the configuration of this memory cell array. The following describes in detail the current control by the NMOS transistors TS0_0_0 to TS0_0_m−1 in the memory cell array block M0_0.

Figure 22:
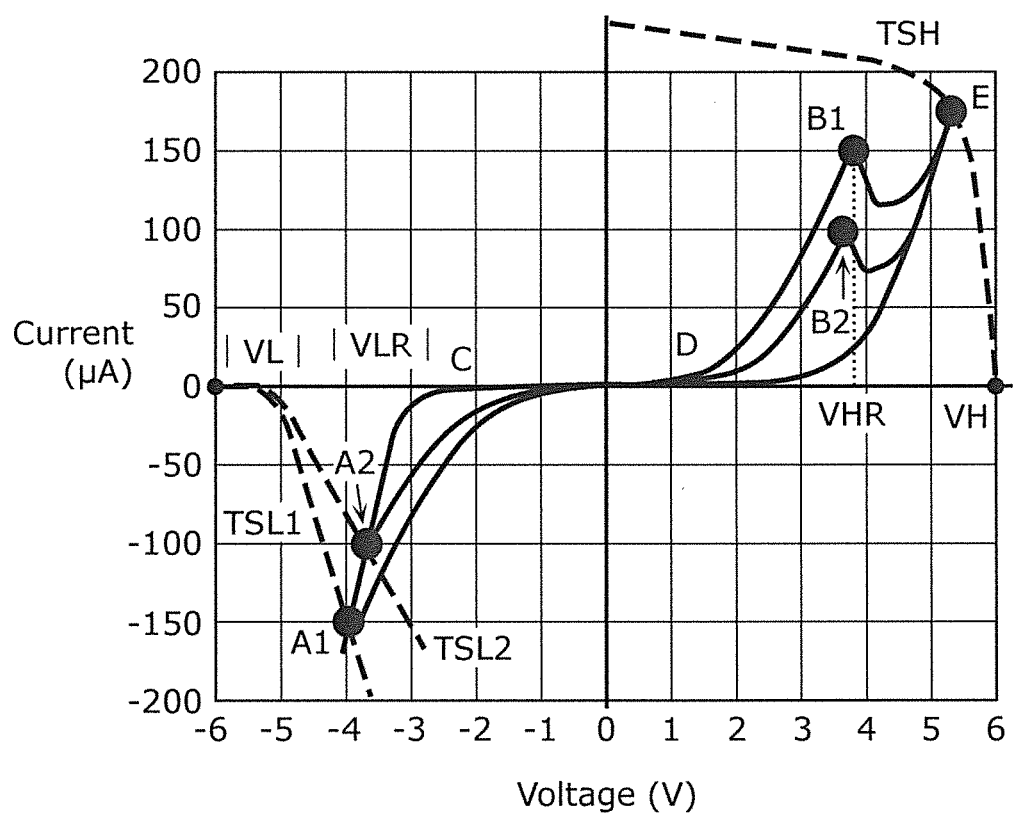
FIG. 22 is a graph showing operating points of a cross point memory cell.

FIG. 22 shows operating points at a time of low resistance writing, using the memory cells 0_0_0_0 to 0_n−1_0_m−1 indicated by the I-V characteristic of FIG. 7 and the I-V characteristic of the NMOS transistors TS0_0_0 to TS0_0_m−1. Here, in the memory cell array of FIG. 20, a selected word line is WL0_0, and selected memory cells are memory cells 0_0_0_0 to 0_0_k−1_0.

At the time of the low resistance writing, by setting voltages of the data lines IO0 to IOk−1 to be higher than a voltage of the word line WL0_0, a voltage of the lower wire 71 becomes higher than or equal to a predetermined voltage VLR with reference to a voltage of the upper wire 70 in the memory cell 51 having the structure of FIG. 2, and the variable resistance element 10 changes to the low resistance state.

In view of this, when a voltage VL is applied to the data line IO0, and the word line WL0_0 is biased at 0 V, as shown in FIG. 22, the I-V characteristic of the memory cell 0_0_0_0 and the I-V characteristic SL1 of the NMOS transistor TS0_0_0 are balanced at operating point A1, and the resistance value of the variable resistance element 10 is determined based on an amount of a current at the point, as described in FIG. 8. On the other hand, when the current supply capacity of the NMOS transistor TS0_0_0 is decreased, its I-V characteristic changes to a curve shown by TSL2, and the operating point moves to A2 to reduce the amount of the current. Thus, a resistance value in the low resistance state is higher than that at the operating point A1.

In this way, the NMOS transistor TS0_0_0 is operated by the source follower, thereby performing the current steering in the low resistance writing.

[Problem in Multi-Bit Write Operation]

The multi-bit simultaneous writing is one of effective methods to achieve both enhancement of a parallel degree for increasing a write transfer speed and stabilization of a resistance state. The following describes a problem caused by wiring resistance of a word line in the multi-bit simultaneous writing.

Figure 23:
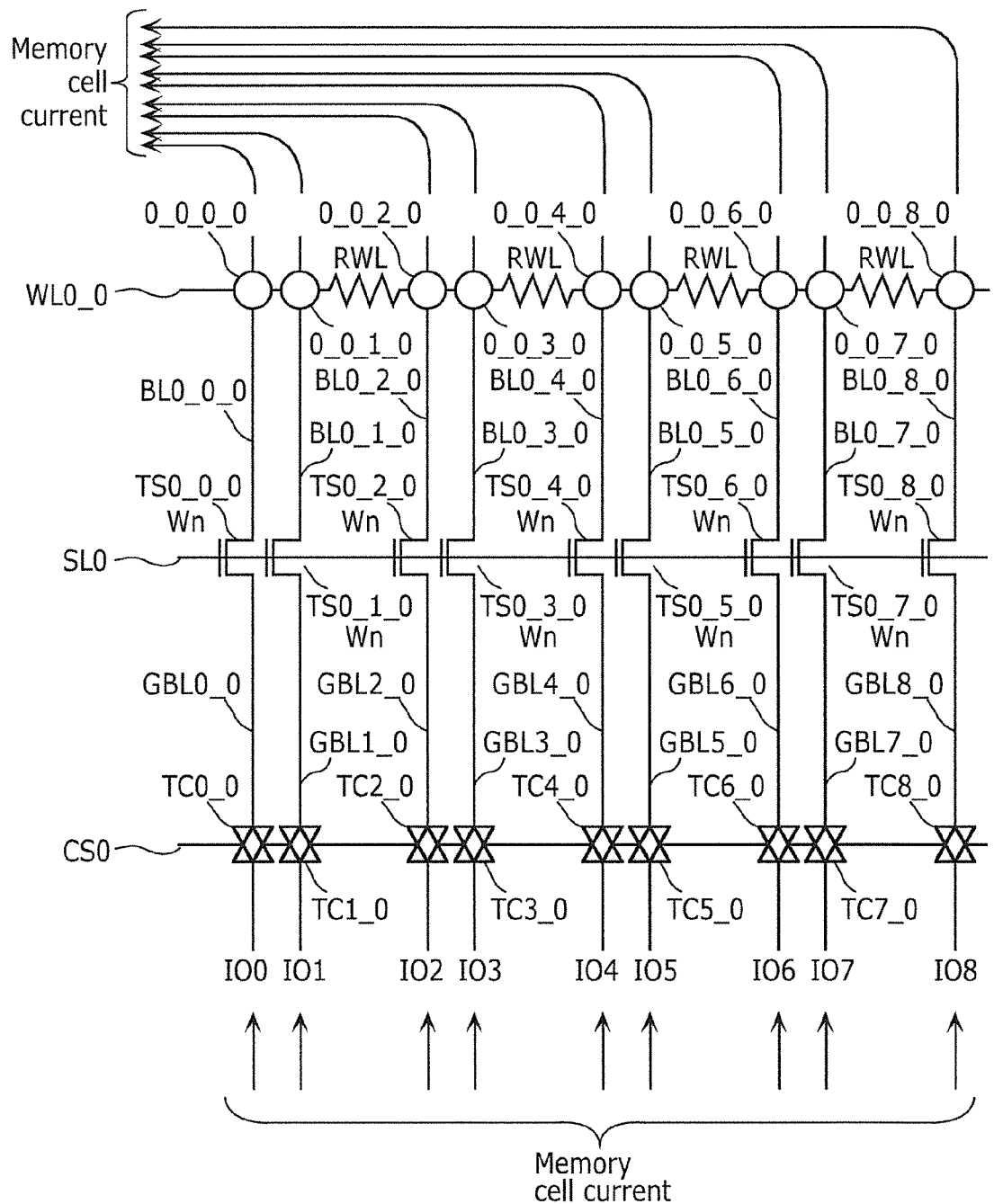
FIG. 23 is an equivalent circuit diagram of a cross point memory cell array.

FIG. 23 is an equivalent circuit of the memory cell array shown in FIG. 20.

Here, as the equivalent circuit of the memory cell array, k=9 (the number of blocks is 9), a selected word line is a word line WL0_0, and nine selected memory cells (nine memory cells each belonging to a corresponding one of nine blocks) arranged evenly on the selected word line are a circuit model in which the nine selected memory cells are gathered for every two memory cells by adjusting the wiring resistance of the word line. The word line is driven from the left end. It is to be noted that the expression "memory cells are gathered for every two memory cells" means ignoring (reducing to 0Ω) the resistance of the word line between two memory cells. Such "gathering" is for the convenience of description using a simulation to be discussed later, and does not limit the structure of the memory cell array included in the variable resistance nonvolatile memory device in the present invention.

At the time of the low resistance writing, currents flowing from data lines IO0 to IO8 to which high potentials are applied into the nine selected memory cells through transfer gates TC0_0 to TC8_0 and NMOS transistors TS0_0_0 to TS0_8_0 converge in the one word line WL0_0, and flow into the word line drive circuit 40-1 along with voltage drops caused by wiring resistances.

At this time, the wiring resistance of the word line to the word line drive circuit 40-1 is high in the memory cell 0_0_8_0 near the right end of the word line far from the word line drive circuit 40-1, an increase of a potential from 0 V (i.e., a voltage drop) becomes greatest since the voltage drops due to the currents flowing through other memory cells are accumulated, and thus an amount of the current flowing through the memory cell becomes smallest in comparison with the other memory cells.

Figure 24:
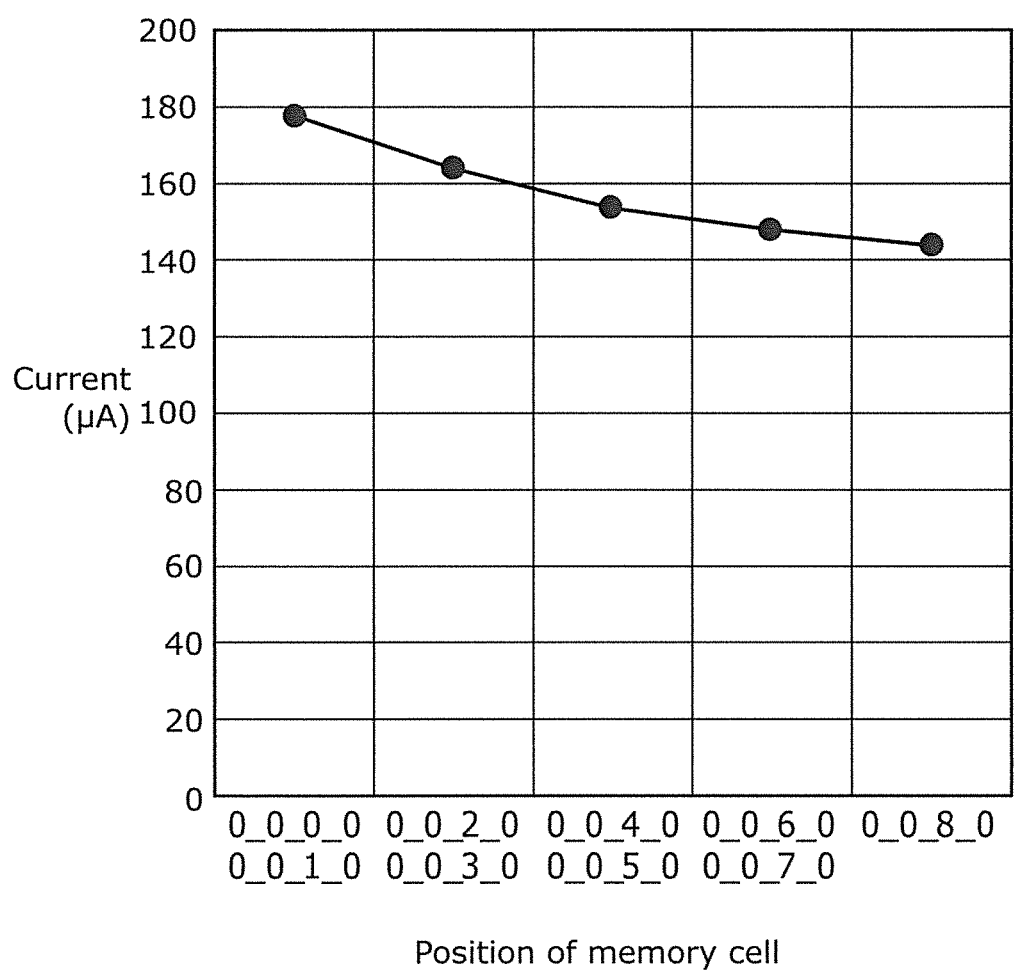
FIG. 24 is a graph showing a simulation result of memory cell position dependency of a memory cell current in a cross point memory cell array.

FIG. 24 shows a result of obtaining, through simulations, an amount of a current flowing through each of the nine memory cells 0_0_0_0 to 0_0_8_0 when a low resistance writing voltage is being simultaneously applied to each of the memory cells 0_0_0_0 to 0_0_8_0. Here, the nine memory cells include one or more memory cells for data storage and one or more memory cells not for data storage, and have the number of cells in any combination of these cells that is nine cells in total.

Here, channel widths Wn of all the NMOS transistors TS0_0_0 to TS0_8_0 have the same value, a low resistance writing voltage VL applied to an IO data line is adjusted to approximately 5 V to cause wiring resistance RWL of a word line to be 11.3Ω and a current value to be passed through the memory cells to be 140 μA, and a verification is performed.

As shown in the figure, it is clear that, since the memory cell at the right end of the word line has a current of approximately 140 μA, and the memory cell at the left end of the word line has a current of approximately 180 μA, the current variation of approximately 28% occurs, and it becomes more likely to cause reliability failure such as a failure of resistance change.

In response, the inventors have conceived a variable resistance nonvolatile memory device that has hardly any memory cell position dependency in the multi-bit simultaneous writing, as a result of intensive research. The variable resistance nonvolatile memory device in the present invention having such a function has almost no limitation in terms of layout, design, and processing, and successfully achieves, in the multi-bit simultaneous writing, writing with little variation caused by positions of memory cells.

In order to solve the conventional problems, a variable resistance nonvolatile memory device according to an aspect of the present invention includes: a plurality of bit lines; a plurality of word lines that cross the bit lines; a plurality of memory cells at cross points of the bit lines and the word lines, the memory cells each including at least a variable resistance element and reversibly changing at least between a first resistance state and a second resistance state; a first write circuit that applies a write voltage to a first bit line that is at least one of the bit lines, where, among the memory cells, memory cells connected to the first bit line are grouped together as a first memory cell array; a second write circuit that applies a write voltage to a second bit line that is at least one of the bit lines and is different from the first bit line, where, among the memory cells, memory cells connected to the second bit line are grouped together as a second memory cell array; a first selection circuit that connects or disconnects at least one of the first write circuit and the first bit line; a second selection circuit that connects or disconnects at least one of the second write circuit and the second bit line; and a first word line drive circuit that selectively drives the word lines, wherein the memory cells include a memory cell for data storage and a memory cell not for data storage, the first write circuit and the second write circuit simultaneously apply the write voltage to the first bit line and the second bit line, respectively, memory cells to which the first write circuit and the second write circuit simultaneously write include the memory cell for data storage and the memory cell not for data storage that are on a same word line, the first memory cell array is placed closer to the first word line drive circuit than the second memory cell array is, and a first ON resistance is greater than a second ON resistance, the first ON resistance being a resistance value of the first selection circuit when the first selection circuit connects the first write circuit and the first bit line, and the second ON resistance being a resistance value of the second selection circuit when the second selection circuit connects the second write circuit and the second bit line.

With this configuration, by adjusting ON resistances of selection circuits that connect bit lines and write circuits, it is possible to compensate a variation in potential resulting from voltage drops caused by wiring resistances of a word line, and keep a memory cell current constant without depending on positions in a memory cell array, at a time of writing.

Here, the memory cell position dependency is eliminated not by providing a special circuit or structure but by adjusting the characteristics of the bit line selection circuits. Thus, there is almost no limitation in terms of layout, design, and processing, and it is possible to perform writing with little variation caused by the positions of the memory cells, in the multi-bit simultaneous writing for increasing a writing speed.

Here, resistance values of the memory cells in the first resistance state may be less than resistance values of the memory cells in the second resistance state, and where a maximum current that flows through a first memory cell in the first memory cell array when the first memory cell changes from the second resistance state to the first resistance state has a first low resistance switching current, and a maximum current that flows through a second memory cell in the second memory cell array when the second memory cell changes from the second resistance state to the first resistance state has a second low resistance switching current, the first ON resistance may be set to be greater than the second ON resistance to cause the first low resistance switching current to be approximately equal to the second low resistance switching current.

With this, the memory cell position dependency is eliminated for low resistance writing current that affects the resistance change characteristics of the memory cells. Thus, it is possible to ensure more stable resistance change operation of the memory cells.

Moreover, the first selection circuit and the second selection circuit may each include an NMOS transistor or a PMOS transistor, a first current direction may be opposite to a second current direction, the first current direction being a direction of a current that flows through the first selection circuit and the second selection circuit when the memory cells change from the second resistance state to the first resistance state, and the second current direction being a direction of a current that flows through the first selection circuit and the second selection circuit when the memory cells change from the first resistance state to the second resistance state, and the first selection circuit and the second selection circuit may each be connected to corresponding ones of the memory cells in a positional relationship that enhances a body bias effect more in the first current direction than in the second current direction.

With this, the selection circuit is connected to the memory cells in the positional relationship that enhances the body bias effect, and when low resistance writing that requires current steering is performed on the memory cells, the transistor included in the selection circuit is operated by a source follower, and a current is passed in a state where the current steering is performed. Thus, it is possible to ensure the more stable resistance change operation of the memory cells.

Furthermore, a channel width of a transistor included in the first selection circuit may be smaller than a channel width of a transistor included in the second selection circuit.

With this, the ON resistance of the selection circuit is adjusted without adding a circuit.

Moreover, the first bit line and the second bit line may be provided in a same layer, the bit lines may include a third bit line and a fourth bit line each of which is at least a different one of the bit lines and provided in a layer different from the layer in which the first bit line and the second bit line are provided, the memory cells may include: memory cells that are connected to the third bit line and grouped together as a third memory cell array; and memory cells that are connected to the fourth bit line and grouped as a fourth memory cell array, the variable resistance nonvolatile memory device may further include: a third selection circuit that connects at least one of the first write circuit and the third bit line; and a fourth selection circuit that connects at least one of the second write circuit and the fourth bit line, the memory cells may be connected to the word lines and the bit lines in the first memory cell array and the second memory cell array to cause the memory cells to change to a higher resistance state when currents flow from the word lines to the bit lines through the memory cells, and the memory cells may be connected to the word lines and the bit lines in the third memory cell array and the fourth memory cell array to cause the memory cells to change to a higher resistance state when currents flow from the bit lines to the word lines through the memory cells, the first selection circuit and the second selection circuit may each include an NMOS transistor, and the third selection circuit and the fourth selection circuit may each include a PMOS transistor, the third memory cell array may be placed closer to the first word line drive circuit than the fourth memory cell array is, and a third ON resistance may be greater than a fourth ON resistance, the third ON resistance being a resistance value of the third selection circuit when the third selection circuit connects the first write circuit and the third bit line, and the fourth ON resistance being a resistance value of the fourth selection circuit when the fourth selection circuit connects the second write circuit and the fourth bit line.

With this, in a two-layer memory cell array in which a word line is common and lower-layer bit lines and upper-layer bit lines are used, the voltage drops caused by the wiring resistances of the word line are compensated, and the selection circuit passes a current in a state where the current steering is performed on the memory cells in the two layers by the source follower, at the time of the low resistance writing. Thus, it is possible to ensure the stable resistance change operation of the memory cells. In other words, a multilayer cross point structure formed through simple manufacturing processing in which a word line and bit lines are shared by upper-layer memory cells and lower-layer memory cells and variable resistance elements are formed in the same direction is expected to produce the same effect.

Furthermore, the bit lines may include a third bit line and a fourth bit line each of which is at least a different one of the bit lines, the memory cells may include: memory cells that are connected to the third bit line and grouped together as a third memory cell array; and memory cells that are connected to the fourth bit line and grouped as a fourth memory cell array, the variable resistance nonvolatile memory device may further include: a third selection circuit that connects at least one of the first write circuit and the third bit line; and a fourth selection circuit that connects at least one of the second write circuit and the fourth bit line, the third memory cell array may be placed closer to the first word line drive circuit than the fourth memory cell array is, the first memory cell array may be placed closer to the first write circuit than the third memory cell array is, the second memory cell array may be placed closer to the second write circuit than the fourth memory cell array is, a third ON resistance may be greater than a fourth ON resistance, the third ON resistance being a resistance value of the third selection circuit when the third selection circuit connects the first write circuit and the third bit line, and the fourth ON resistance being a resistance value of the fourth selection circuit when the fourth selection circuit connects the second write circuit and the fourth bit line, the third ON resistance may be less than the first ON resistance, and the fourth ON resistance may be less than the second ON resistance.

With this, not only voltage drops caused by wiring resistances of a word line but also voltage drops caused by wiring resistances of a bit line are compensated. As a result, it is possible to reduce a variation in write operation without depending on two-dimensional positions of memory cells. To put it another way, it is possible to perform more accurate adjustment by also setting, to be greater in a bit line direction, a current drive capability of a selection element of a memory cell at a far end from a write circuit.

Moreover, the variable resistance nonvolatile memory device may include: a third write circuit that applies a write voltage to a third bit line that is at least one of the bit lines, where, among the memory cells, memory cells connected to the third bit line are grouped together as a third memory cell array; a fourth write circuit that applies a write voltage to a fourth bit line that is at least one of the bit lines, where, among the memory cells, memory cells connected to the fourth bit line are grouped together as a fourth memory cell array; a third selection circuit that connects or disconnects at least one of the third write circuit and the third bit line; a fourth selection circuit that connects or disconnects at least one of the fourth write circuit and the fourth bit line; and a second word line drive circuit that selectively may drive the word lines, the first memory cell array, the second memory cell array, the fourth memory cell array, and the third memory cell array may be placed in this order in a direction from the first word line drive circuit toward the second word line drive circuit, and a third ON resistance may be greater than a fourth ON resistance, the third ON resistance being a resistance value of the third selection circuit when the third selection circuit connects the third write circuit and the third bit line, and the fourth ON resistance being a resistance value of the fourth selection circuit when the fourth selection circuit connects the fourth write circuit and the fourth bit line.

With this, even when the word line drive circuits are provided at the both ends of the word line, a current at the time of writing is kept constant without depending on a distance from one of the word line drive circuits at the both ends. Thus, it is possible to reduce a variation in write operation even in a large-scale memory cell array having a long word line. In addition, a method for driving a word line from both ends of a memory cell array makes it possible to reduce a set width of a current drive capability of a selection circuit, and intend to increase layout efficiency in the memory cell array.

Furthermore, the first selection circuit and the second selection circuit may each include: a bit line selection switch element that applies a write voltage to a corresponding bit line; and a current steering element that is connected in series with the bit line selection switch element and in which an N-type current steering element including an NMOS transistor and a P-type current steering element including a PMOS transistor are connected in parallel, one of the N-type current steering element and the P-type current steering element may be selectively turned ON when the other of the N-type current steering element and the P-type current steering element is turned OFF, and an ON resistance of one of the N-type current steering element and the P-type current steering element included in the first selection circuit may be greater than an ON resistance of one of the N-type current steering element and the P-type current steering element included in the second selection circuit, the ones of the N-type current steering elements and the P-type current steering elements being ON.

With this, the selection circuit includes a bit line selection switch element and a current steering element, and is achieved as an element capable of independently performing bit line selection and current steering. Consequently, it is possible to freely choose, for each memory cell array, an NMOS transistor or a PMOS transistor as the current steering element. Thus, it is possible to reduce the memory cell position dependency for a three- or more-layer variable resistance nonvolatile memory device.

Moreover, the memory cells may each include the variable resistance element and a current steering element that are connected in series, the current steering element having non-linear current-voltage characteristics.

With this, the cross point variable resistance nonvolatile memory device has almost no limitation in terms of layout, design, and processing, and it is possible to achieve, in the multi-bit simultaneous writing for increasing the writing speed, the writing with little variation caused by the positions of the memory cells.

Moreover, in order to solve the conventional problems, a method for calculating an ON resistance of a selection circuit in a variable resistance nonvolatile memory device according to another aspect of the present invention includes, where, in the variable resistance nonvolatile memory device having a k number of memory cell arrays commonly connected to a plurality of word lines and placed in order from a word line drive circuit, a wiring resistance of each of word lines in respective (k−1) blocks obtained by dividing the word lines by the k memory cell arrays is RWL, an ON resistance of a first selection circuit is R(1), and a current that flows through the selected memory cell has a first low resistance switching current IO, the first selection circuit connecting a write circuit and a selected memory cell that is a memory cell selected in a first memory cell array closest to the word line drive circuit, and the current flowing when the selected memory cell changes from a second resistance state to a first resistance state in which the selected memory cell has a resistance value less than a resistance value of the selected memory cell in the second resistance state, setting ON resistances of first to k-th selection circuits and causing first to k-th low resistance switching currents to be approximately equal to each other, by calculating, as a sum of voltage drops in the word lines in the respective blocks, a voltage drop VW(h) in the word lines between the word line drive circuit and an h-th (1≤h≤k) memory cell array, using at least a product of IO and RWL and a variable h, and by calculating an ON resistance R(h) of an h-th selection circuit that connects the write circuit and a memory cell selected in the h-th memory cell array, using at least IO, R(1), and VW(h), the first to k-th selection circuits respectively corresponding to first to k-th memory cell arrays, and the first to k-th low resistance switching currents respectively corresponding to the first to k-th memory cell arrays.

More specifically, k is 5, and ratios of reciprocal numbers of the ON resistances of the first to fifth selection circuits each are determined to be within a range of ±0.04 centering on a corresponding one of 0.81, 0.88, 0.94, 0.98, and 1.00.

With this, a selection circuit is designed which is included in a variable resistance nonvolatile memory device having a function to compensate voltage drops caused by wiring resistances of a word line.

Furthermore, in order to solve the conventional problems, a method for writing for a variable resistance nonvolatile memory device according to still another aspect of the present invention includes: selectively driving, by the first word line drive circuit, the word lines; and simultaneously writing, by the first write circuit and the second write circuit, to the first memory cell included in the first memory cell array and the second memory cell included in the second memory cell array, by simultaneously applying, by the first write circuit and the second write circuit, a write voltage to the first bit line and the second bit line, respectively.

With this, it is possible to perform, in the multi-bit simultaneous writing for increasing the writing speed, the writing with little variation caused by the positions of the memory cells.

Moreover, in order to solve the conventional problems, a 1T1R variable resistance nonvolatile memory device according to yet another aspect of the present invention includes: a plurality of bit lines; a plurality of word lines and a plurality of source lines that cross the bit lines; a plurality of memory cells at cross points of the bit lines and the source lines, the memory cells each including a variable resistance element and a selection element whose ON-OFF control is performed by each of the word lines, and reversibly changing at least between a first resistance state and a second resistance state; a first write circuit that applies a write voltage to a first bit line that is at least one of the bit lines, where, among the memory cells, memory cells connected to the first bit line are grouped together as a first memory cell array; a second write circuit that applies a write voltage to a second bit line that is at least one of the bit lines and is different from the first bit line, where, among the memory cells, memory cells connected to the second bit line are grouped together as a second memory cell array; a first selection circuit that connects or disconnects at least one of the first write circuit and the first bit line; a second selection circuit that connects or disconnects at least one of the second write circuit and the second bit line; a first source line drive circuit that drives the source lines; and a word line drive circuit that selectively drives the word lines, wherein the memory cells include a memory cell for data storage and a memory cell not for data storage, the first write circuit and the second write circuit simultaneously apply the write voltage to the first bit line and the second bit line, respectively, memory cells to which the first write circuit and the second write circuit simultaneously write include the memory cell for data storage and the memory cell not for data storage that are on a same word line, the first memory cell array is placed closer to the first source line drive circuit than the second memory cell array is, and a first ON resistance is greater than a second ON resistance, the first ON resistance being a resistance value when a first selection element that is the selection element included in the first memory cell array is ON, and the second ON resistance being a resistance value when a second selection element that is the selection element included in the second memory cell array is ON.

With this configuration, by adjusting ON resistances of selection circuits that connect bit lines and write circuits, it is possible to compensate a variation in potential resulting from voltage drops caused by wiring resistances of a source line, and keep a memory cell current constant without depending on positions in a memory cell array, at a time of writing.

Here, the memory cell position dependency is eliminated not by providing a special circuit or structure but by adjusting the characteristics of the bit line selection circuits. Thus, there is almost no limitation in terms of layout, design, and processing, and it is possible to perform the writing with little variation caused by the positions of the memory cells, in the mufti-bit simultaneous writing for increasing the writing speed.

Furthermore, the 1T1R variable resistance nonvolatile memory device may further include: a third write circuit that applies a write voltage to a third bit line that is at least one of the bit lines, where, among the memory cells, memory cells connected to the third bit line are grouped together as a third memory cell array; a fourth write circuit that applies a write voltage to a fourth bit line that is at least one of the bit lines, where, among the memory cells, memory cells connected to the fourth bit line are grouped together as a fourth memory cell array; a third selection circuit that connects or disconnects at least one of the third write circuit and the third bit line; a fourth selection circuit that connects or disconnects at least one of the fourth write circuit and the fourth bit line; and a second source line drive circuit that drives the source lines, the first memory cell array, the second memory cell array, the fourth memory cell array, and the third memory cell array may be placed in this order in a direction from the first source line drive circuit toward the second source line drive circuit, and a third ON resistance may be greater than a fourth ON resistance, the third ON resistance being a resistance value when a third selection element that is the selection element included in the third memory cell array is ON, and the fourth ON resistance being a resistance value when a fourth selection element that is the selection element included in the fourth memory cell array is ON.

With this, even when the source line drive circuits are provided at the both ends of the source line, a current at the time of writing is kept constant without depending on a distance from one of the source line drive circuits at the both ends. Thus, it is possible to reduce a variation in write operation even in a large-scale memory cell array having a long source line. In addition, a method for driving a source line from both ends of a memory cell array makes it possible to reduce a set width of a current drive capability of a selection circuit, and intend to increase layout efficiency in the memory cell array.

Moreover, the memory cells may include: memory cells that are connected to the first bit line and grouped together as a third memory cell array; and memory cells that are connected to the second bit line, connected to the source lines and the word lines in common with the third memory cell array, and grouped as a fourth memory cell array, and in the variable resistance nonvolatile memory device: the third memory cell array may be placed closer to the first source line drive circuit than the fourth memory cell array is; the first memory cell array may be placed closer to the first write circuit than the third memory cell array is; the second memory cell array may be placed closer to the second write circuit than the fourth memory cell array is; a third ON resistance may be greater than a fourth ON resistance, the third ON resistance being a resistance value when a third selection element that is the selection element included in the third memory cell array is ON, and the fourth ON resistance being a resistance value when a fourth selection element that is the selection element included in the fourth memory cell array is ON; the first ON resistance may be greater than the third ON resistance; and the second ON resistance may be greater than the fourth ON resistance.

With this, not only voltage drops caused by wiring resistances of a source line but also voltage drops caused by wiring resistances of a bit line are compensated. As a result, it is possible to reduce a variation in write operation without depending on two-dimensional positions of memory cells. To put it another way, it is possible to perform more accurate adjustment by also setting, to be greater in a bit line direction, a current drive capability of a selection element of a memory cell at a far end from a write circuit.

Furthermore, in order to solve the conventional problems, a method for writing for a 1T1R variable resistance nonvolatile memory device according to still yet another aspect of the present invention includes: selectively driving, by the first source line drive circuit, the source lines; selectively driving, by the word line drive circuit, among the word lines, word lines corresponding to the source lines driven in the selectively driving of the source lines; and simultaneously writing, by the first write circuit and the second write circuit, to the first memory cell included in the first memory cell array and the second memory cell included in the second memory cell array, by simultaneously applying, by the first write circuit and the second write circuit, a write voltage to the first bit line and the second bit line, respectively.

With this, it is possible to perform the writing with little variation caused by the positions of the memory cells, in the mufti-bit simultaneous writing for increasing the writing speed in the 1T1R variable resistance nonvolatile memory device.

The following describes variable resistance nonvolatile memory devices according to embodiments of the present invention with reference to the drawings. Each of the embodiments described below shows a general or specific example. The numerical values, shapes, materials, constituent elements, the arrangement and connection of the constituent elements, the processing order of steps, etc. shown in the following embodiments are mere examples, and therefore do not limit the scope of the present invention. Only the Claims limit the scope of the present invention. Therefore, among the structural elements in the following embodiments, structural elements not recited in any one of the independent claims are described as arbitrary structural elements, though not always required to solve the problem described in the present invention.

(Embodiment 1)

<<Application to Single-Layer Cross Point Structure>>

Figure 25:
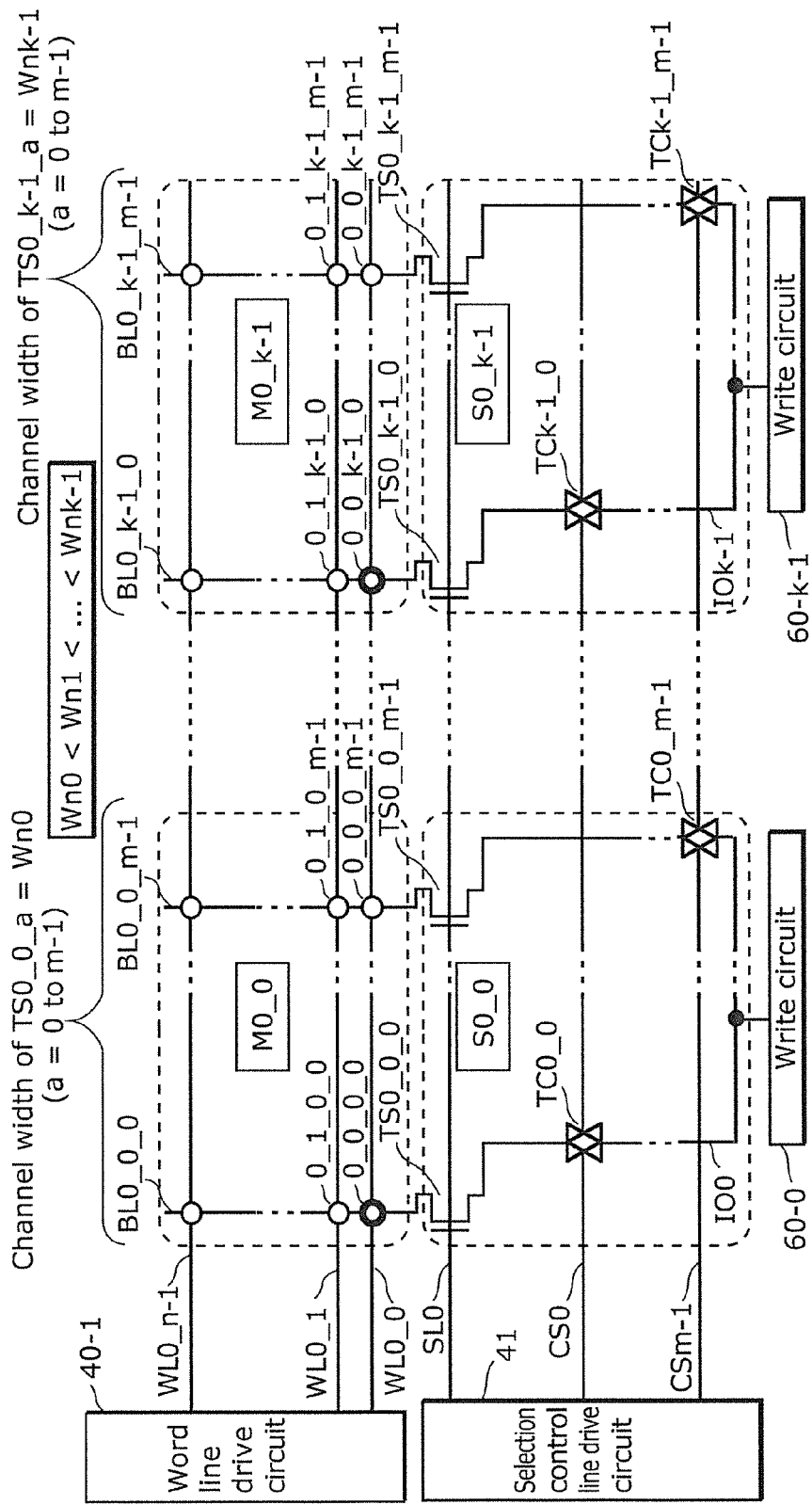
FIG. 25 is a block diagram of a cross point memory cell array according to Embodiment 1 of the present invention.

FIG. 25 shows a circuit configuration of a variable resistance nonvolatile memory device including a single-layer cross point memory cell array in Embodiment 1 of the present invention. It is to be noted that hereinafter the "variable resistance nonvolatile memory device" is also simply referred to a "memory cell array."

This memory cell array includes an n number of word lines WL0_0 to WL0_n−1 that are driven by a word line drive circuit 40-1, and a k×m number of bit lines BL0_0_0 to BL0_k−1_m−1 that cross the word lines in a contactless manner. The memory cell array is divided into a k number of blocks (memory cell array blocks M0_0 to M0_k−1) in a word line direction. In the multi-bit simultaneous writing, one bit line is selected for each of the memory cell array blocks M0_0 to M0_k−1, and k bits in total are simultaneously written. It is to be noted that memory cells on which simultaneous writing is performed include memory cells for data storage and memory cells not for data storage that are on the same word line.

The following describes a configuration of the memory cell array blocks M0_0 to M0_k−1, using the memory cell array block memory cell array block M0_0 as an example.

The memory cell array block M0_0 includes an n number of word lines WL0_0 to WL0_n−1 and an m number of bit lines BL0_0_0 to BL0_0_m−1. The memory cell array block M0_0 includes: memory cells 0_0_0_0 to 0_n−1_0_m−1 in each of which a variable resistance element 10 and a current steering element 20 shown in FIG. 21A are connected in series, and each of which is placed at a corresponding one of cross points of the word lines WL0_0 to WL0_n−1 and the bit lines BL0_0_0 to BL0_0_m−1; the variable resistance elements 10 each having one end connected to a corresponding one of the word lines; and the current steering elements 20 each having one end connected to a corresponding one of the bit lines.

Moreover, in the memory cell array block M0_0, the m bit lines BL0_0_0 to BL0_0_m−1 are connected to respective transfer gates TC0_0 to TC0_m−1 shown in FIG. 21B through NMOS transistors TS0_0_0 to TS0_0_m−1 that are first selection elements in a first selection circuit S0_0, according to a sub bit line selection control signal SL0 driven by a selection control line drive circuit 41. In addition, the m bit lines BL0_0_0 to BL0_0_m−1 are selectively connected to a data line IO0 through the transfer gates TC0_0 to TC0_m−1. It is to be noted that although the first selection circuit S0_0 includes a series connection of the NMOS transistors TS0_0_0 to TS0_0_m−1 as the first selection elements and the transfer gates TC0_0 to TC0_m−1 in this embodiment, since all of the NMOS transistors and the transfer gates function as switching elements, the transfer gates TC0 to TC0_m−1 are not always necessary in this embodiment. As will be described in other embodiments, when bit lines include two-dimensionally arranged sub bit lines and main bit lines that mutually connect the sub bit lines, the NMOS transistors TS0_0_0 to TS0_0_m−1, the first selection elements, switch connection/disconnection between the sub bit lines and the main bit lines, and the transfer gates TC0_0 to TC0_m−1 switch connection/disconnection between the main bit lines and write circuits. Thus, when the bit lines include the two-dimensionally arranged sub bit lines and main bit lines, there is a significance in that selection circuits each include series connection of switching elements of two types (an NMOS transistor and a transfer gate).

Furthermore, the other memory cell array blocks M0_1 to M0_k−1 are connected to the memory cell array block M0_0 through a common word line. The entire memory cell array includes a k number of data lines IO0 to IOk−1 as a bus width. A k number of write circuits 60-0 to 60-k−1 each corresponding to a different one of a k number of the memory cell array blocks M0_0 to M0_k−1 provide respective memory cells with a voltage necessary for resistance change through the data lines IO0 to IOk−1. With such a configuration, in the multi-bit simultaneous writing, the selection control line drive circuit 41 outputs the sub bit line selection control signal SL0 and main bit line selection control signals CS0 to CSm−1 to activate one bit line for each of the memory cell array blocks M0_0 to M0_k−1, thereby simultaneously writing k bits.

This embodiment has a feature that, regarding the NMOS transistors TS0_0_0 to TS0_k−1_m−1 that are exemplary selection elements, an ON resistance of a selection circuit (S0_0 to S0_k−1) belonging to each of blocks (M0_0 to M0_k−1) is set, for each block, to be lower as a distance from the word line drive circuit 40-1 increases so that a voltage drop caused by a wiring resistance of a word line is compensated according to the distance from the word line drive circuit 40-1, and a variation in a write current of a memory cell between corresponding ones of the blocks is reduced. Furthermore, a channel width of the selection element of each block is discretely modulated (i.e., an ON resistance is adjusted so that the ON resistance becomes smaller as the distance from the word line drive circuit 40-1 increases) as one of such methods. It goes without saying that, to further reduce the variation in the write current of the memory cells, the ON resistance of each selection element or transfer gate may be set to be lower in each block as the distance from the word line drive circuit 40-1 increases.

Here, in the cross point memory cell shown in FIG. 2, a stacked layer including (i) a first region comprising a first oxygen-deficient transition metal oxide having a composition expressed by $TaO_x$ ($0.8 \leq x \leq 1.9$), $HfO_x$ ($0.9 \leq x \leq 1.6$), or $MO_x$ and (ii) a second region comprising a second oxygen-deficient transition metal oxide having a composition expressed by $MO_y$ (where x<y) is applicable to the second variable resistance layer 12 in contact with the upper electrode 11 and the first variable resistance layer 13 in contact with the lower electrode 14 (see Patent Literature 4 (Japanese Patent No. 4545823), Patent Literature 5 (Japanese Patent No. 4469022), and Patent Literature 6 (Japanese Patent No. 4555397)).

As stated above, the variable resistance nonvolatile memory device in this embodiment includes, as characteristic structural elements, the bit lines BL0_0_0 to BL0_k−1_m−1, the word lines WL0_0 to WL0_n−1 that cross the bit lines BL0_0_0 to BL0_k−1_m−1, memory cells 0_0_0_0 to 0_n−1_k−1_m−1, a first write circuit (e.g., a write circuit 60-0), a second write circuit (e.g., a write circuit 60-k−1), a first selection circuit (e.g., a selection circuit S0_0), a second selection circuit (e.g., a selection circuit S0_k−1), and a first word line drive circuit (the word line drive circuit 40-1).

The memory cells 0_0_0_0 to 0_n−1_k−1_m−1 each include at least a variable resistance element 10 placed at a corresponding one of cross points of the bit lines BL0_0_0 to BL0_k−1_m−1 and the word lines WL0_0 to WL0_n−1, and reversibly change at least between a first resistance state (e.g., the low resistance state) and a second resistance state (e.g., the high resistance state).

The first write circuit (e.g., the write circuit 60-0) is a circuit that selectively applies a write voltage to a first bit line, where, among the memory cells, memory cells connected to the first bit (e.g., the bit lines BL0_0_0 to BL0_0_m−1) that is at least one of the bit lines are grouped together as a first memory cell array (the memory cell array block M0_0).

The second write circuit (e.g., the write circuit 60-k−1) is a circuit that selectively applies a write voltage to a second bit line, where, among the memory cells, memory cells connected to the second bit line (e.g., bit lines BL0_k−1_0 to BL0_k−1_m−1) that is at least one of the bit lines which is different from the first bit line are grouped together as a second memory cell array (a memory cell array block M0_k−1).

The first selection circuit (e.g., the selection circuit S0_0 including the NMOS transistors TS0_0_0 to TS0_0_m−1) is a circuit that connects or disconnects at least one of the first write circuit and the first bit line.

The second selection circuit (e.g., the selection circuit S0_k-1 including the NMOS transistors TS0_k-1_0 to TS0_k-1_m-1) is a circuit that connects or disconnects at least one of the second write circuit and the second bit line.

The first word line drive circuit (the word line drive circuit 40-1) is a circuit that selectively drives the word lines.

Here, the memory cells 0_0_0_0 to 0_n-1_k-1 include memory cells for data storage and memory cells not for data storage. m-1 The first write circuit and the second write circuit simultaneously apply the write voltage to the first bit line and the second bit line, respectively. At this time, memory cells on which simultaneous writing is performed by the first write circuit and the second write circuit include the memory cells for data storage and the memory cells not for data storage that are on the same word line.

Here, characteristic points are as follows: (1) the first memory cell array is placed closer to the first word line drive circuit than the second memory cell array is and (2) a first ON resistance is greater than a second ON resistance, the first ON resistance being a resistance value of the first selection circuit when the first selection circuit (e.g., the NMOS transistors TS0_0_0 to TS0_0_m-1) included in the selection circuit S0_0) connects the first write circuit and the first bit line, and the second ON resistance being a resistance value of the second selection circuit when the second selection circuit (e.g., the NMOS transistors TS0_k-1_0 to TS0_k-1_m-1 included in the selection circuit S0_k-1) connects the second write circuit and the second bit line. As an example of achieving the characteristic points, in this embodiment, channel widths of the transistors included in the first selection circuit is set to be smaller than those of the transistors included in the second selection circuit.

Figure 26:
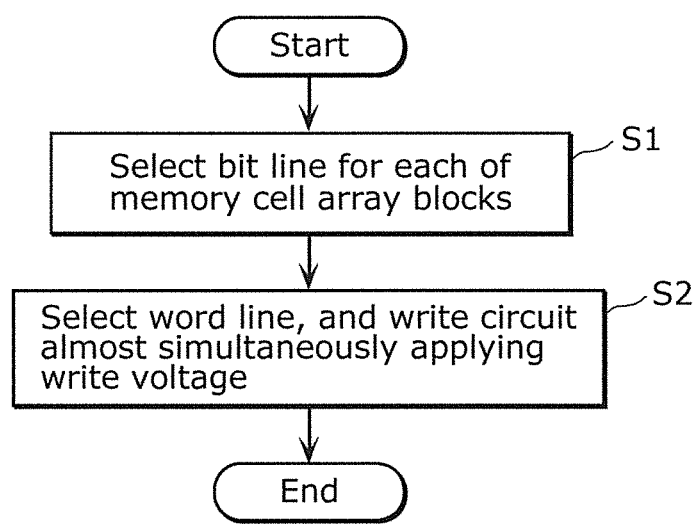
FIG. 26 is a flow chart showing a multi-bit simultaneous writing procedure in Embodiment 1 of the present invention.

The variable resistance nonvolatile memory device having such a configuration in this embodiment performs the following multi-bit simultaneous writing, as shown in a flow chart of FIG. 26. One sub bit line is selected for each of memory cell array blocks by the selection control line drive circuit 41 outputting a sub bit line selection control signal and a main bit line selection control signal (S1). Simultaneous writing is performed on the memory cells included in each of the memory cell arrays (the memory cell array blocks M0_0 to M0_k-1) by the first word line drive circuit (the word line drive circuit 40-1) selectively driving the word lines, and concurrently the write circuits (the write circuits 60-0 to 60-k-1) each simultaneously applying a write voltage to the selected bit line (e.g., the bit line BL0_0, . . . , or BL0_k-1_0) (S2).

[Equivalent Circuit Regarding Low Resistance Writing]

To describe an effect regarding stabilization of a memory cell current at a time of low resistance writing which is produced by a circuit configuration of the present invention, an equivalent circuit is first shown, and operating points at the time of the low resistance writing are examined based on the equivalent circuit.

Here, as an exemplary equivalent circuit of the memory cell array, k=9 (the number of blocks is 9), a selected word line is the word line WL0_0, and nine selected memory cells (nine memory cells each belonging to a corresponding one of nine blocks) arranged evenly on the selected word line are a circuit model in which the nine selected memory cells are gathered for every two memory cells according to a wiring resistance of the word line. Here, the word line is driven from the left end of the memory cell array.

Figure 27:
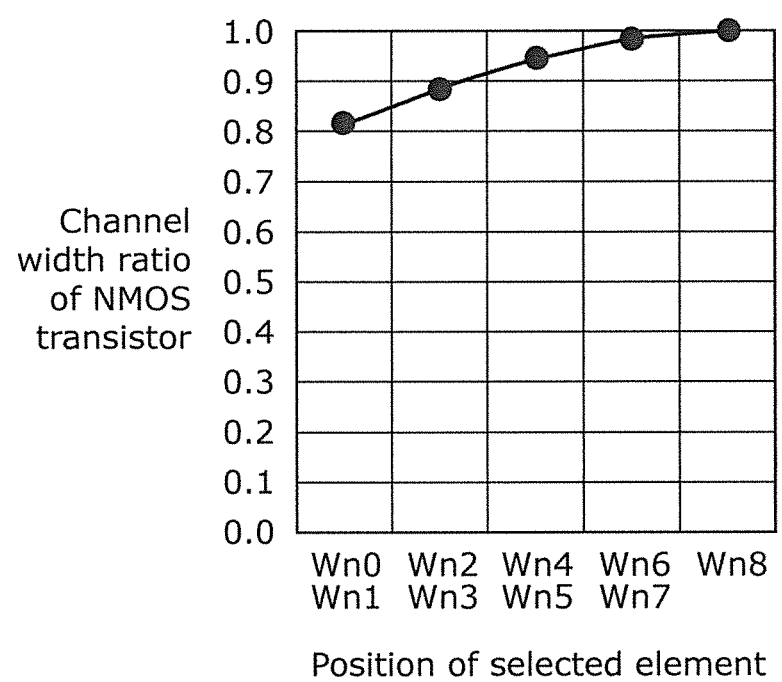
FIG. 27 is a graph showing a channel width ratio of a selection element in a cross point memory cell array according to Embodiment 1 of the present invention.

FIG. 27 shows a ratio of channel widths Wn0 to Wn8 of the respective NMOS transistors TS0_0_0 to TS0_8_0 (here, the nine NMOS transistors belonging to the respective nine blocks) as the first selection elements. As shown in the figure, it is discretely determined that an NMOS transistor belonging to a block nearer to the word line drive circuit 40-1 has a smaller channel width, and an NMOS transistor belonging to a block farther from the word line drive circuit 40-1 has a larger channel width.

Figure 28:
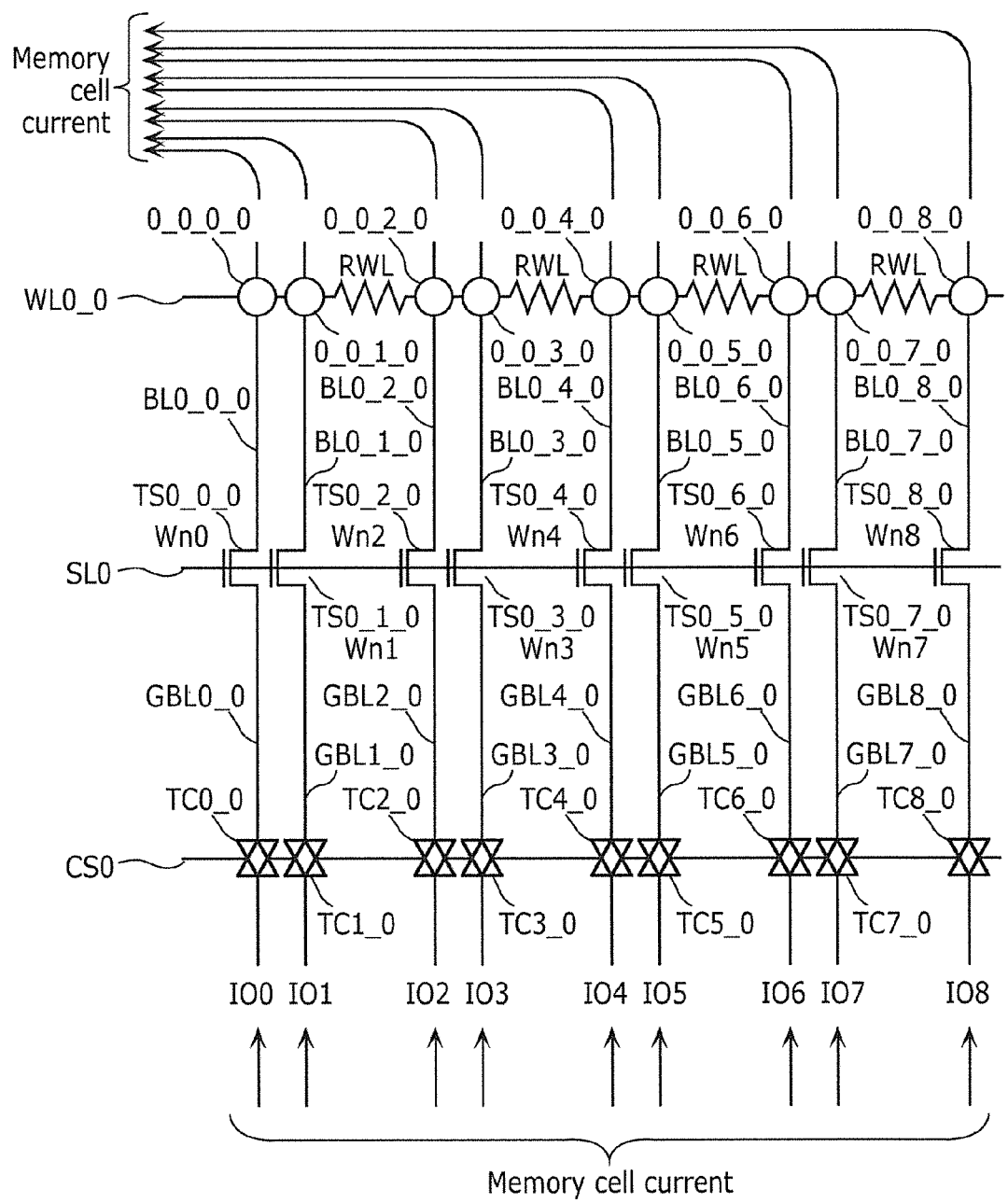
FIG. 28 is an equivalent circuit diagram of a cross point memory cell array according to Embodiment 1 of the present invention.

FIG. 28 is an equivalent circuit of the memory cell array shown in FIG. 25. At the time of the low resistance writing, a voltage VL (approximately 5 V) is applied to the data lines IO0 to IO8, and 0 V is applied to the word line WL0_0. Currents that flow through the memory cells flow into the nine selected memory cells through the transfer gates TC0_0 to TC8_0 and the NMOS transistors TS0_0_0 to TS0_8_0, converge in the one word line WL0_0, and flow into the word line drive circuit 40-1 at the left end along with voltage drops caused by wiring resistances.

At this time, the wiring resistance of the word line to the word line drive circuit 40-1 is high in the memory cell 0_0_8_0 near the right end of the word line far from the word line drive circuit 40-1, and an increase of a potential from 0 V becomes greatest since the voltage drops due to currents flowing through other memory cells are accumulated.

Figure 29:
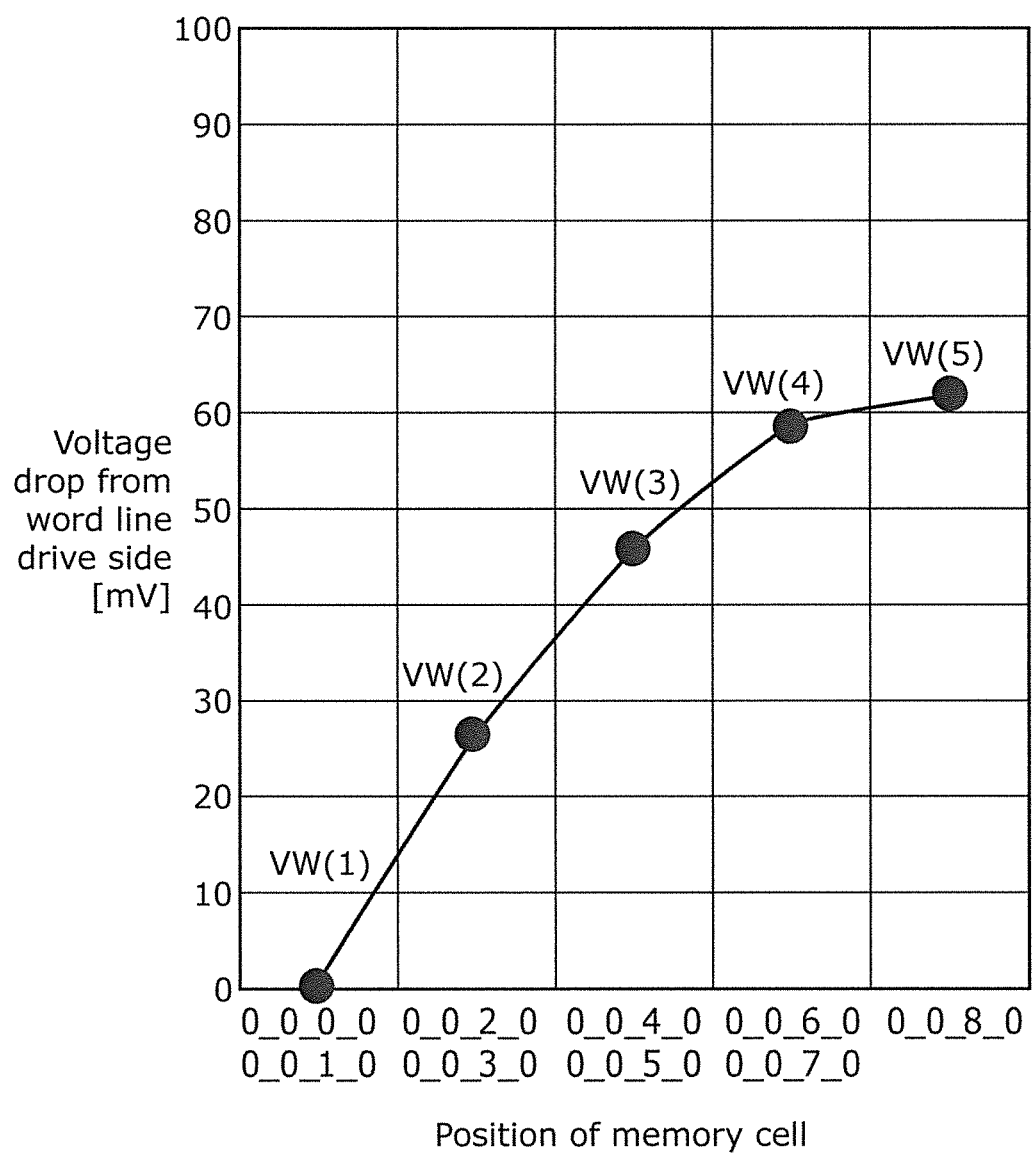
FIG. 29 is a graph showing a voltage drop in a selected word line in a cross point memory cell array according to Embodiment 1 of the present invention.

FIG. 29 shows memory cell position dependency in a drop voltage from a word line drive side in each memory cell. It is to be noted that in this graph, a wiring resistance RWL of a word line is 11.3Ω, and a current value to be passed through the memory cell is 140 μA. As shown in the graph, a potential of the word line increases as a distance from the word line drive circuit 40-1 increases. It is to be noted that the reason why a rate of increase of the potential of the word line slows down more at a farther end of the word line is that the number of memory cell currents superimposed is reduced more for the wiring resistance RWL at the farther end.

A current drive capability of each of the NMOS transistors TS0_0_0 to TS0_8_0 at respective positions is proportional to the channel width ratio determined in FIG. 27. It is to be noted that the ratio shown in the graph is an example based on the premise of a predetermined word line resistance and a predetermined memory cell current.

[Operating Points at Time of Low Resistance Writing]

Figure 30:
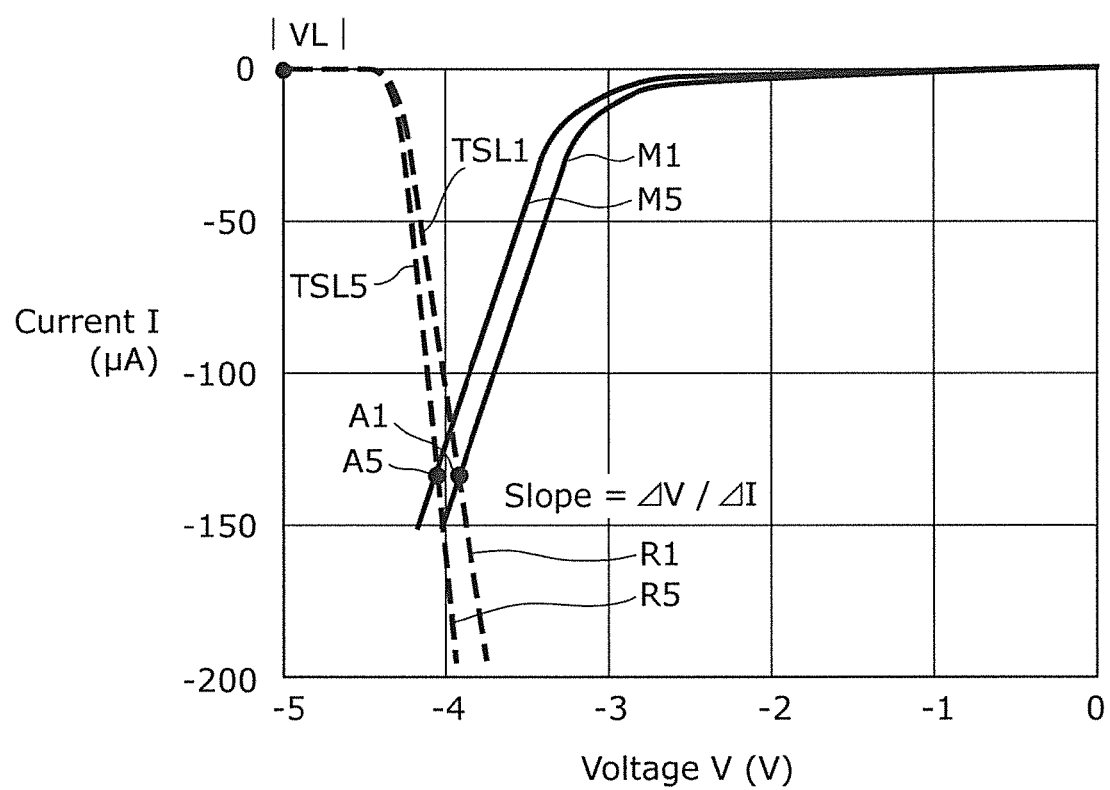
FIG. 30 is a graph showing operating points of a memory cell in a cross point memory cell array according to Embodiment 1 of the present invention.

FIG. 30 shows operating points of a memory cell at a representative position in Embodiment 1 of the present invention. This graph illustrates the left end and the right end of a memory cell array. It is to be noted that in comparison to the graph of the operating points in the low resistance writing and the high resistance writing shown in FIG. 22, the graph extracts and illustrates only the left quadrant regarding the low resistance writing. Moreover, only the upper curves showing a change from the high resistance state to the low resistance state via point C shown in FIG. 7 are extracted and illustrated for I-V characteristics M1 and M5 of the memory cell in FIG. 30.

(1) At the Left End of the Memory Cell Array

At the left end of the memory cell array, the I-V characteristic M1 of each of the memory cells 0_0_0_ and 0_0_1_0 and an I-V characteristic TSL1 of each of the NMOS transistors TS0_0_0 and TS0_1_0 are balanced at intersection point A1, and a current flowing through the memory cells becomes a memory cell current of −140 μA.

(2) At the right end of the memory cell array

At the right end of the memory cell array, in the memory cell 0_0_8_0, a potential of the word line WL0_0 increases to approximately 60 mV as shown in FIG. 29 because of a voltage drop caused by a wiring resistance to the right end of the word line WL0_0. For this reason, a low resistance writing applied voltage VL is reduced by as much as the increased voltage, and an I-V characteristic of the memory cell 0_0_8_0 is expressed as the characteristic M5 obtained by shifting the characteristic M1 to the left by 60 mV.

In contrast, as shown in FIG. 27, the channel width of the NMOS transistor TS0_8_0 is set to be approximately 1.25 times as high as those of the NMOS transistors TS0_0_0 and TS0_1_0, and thus the current drive capability of the NMOS transistor TS0_8_0 is enhanced, and the I-V characteristic of the same becomes a characteristic TSL5 steeper than the characteristic TSL1.

From the above, although point A1 where the characteristics M5 and TSL5 intersect becomes an operating point at the right end of the memory cell array, the increase of the potential of the word line is compensated by enhancement of the drive capability of the NMOS transistor, the memory cell current is 140 μA, and the same value as the value of the left end of the memory cell array is maintained.

Figure 31:
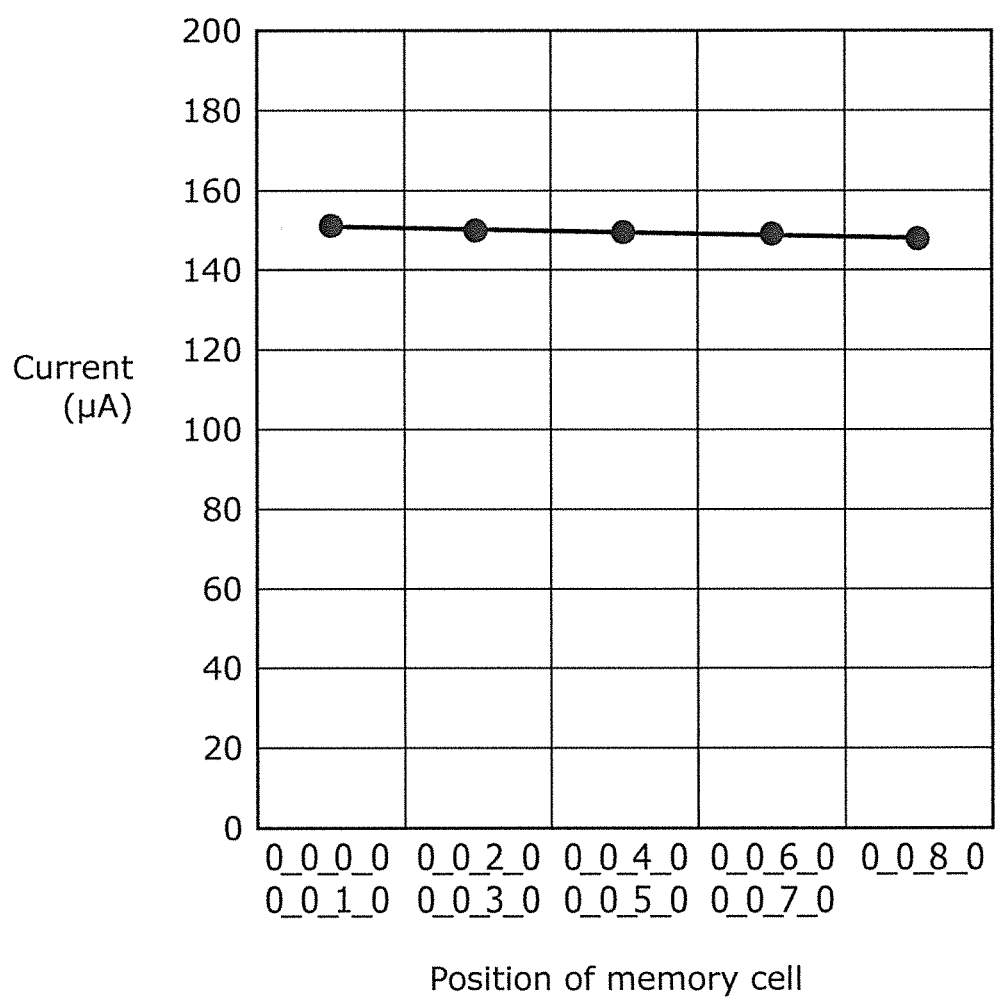
FIG. 31 is a graph showing a simulation result of memory cell position dependency of a memory cell current in a cross point memory cell array according to Embodiment 1 of the present invention.

FIG. 31 shows a result of obtaining, through simulations, an amount of a current flowing through each of the memory cells 0_0_0_0 to 0_0_8_0 when a low resistance writing voltage is being simultaneously applied to each of the memory cells 0_0_0_0 to 0_0_8_0. A channel width Wn of all the NMOS transistors TS0_0_0 to TS0_8_0 is verified as the ratio shown in FIG. 27.

As shown in the graph, the memory cell current is kept within a range from 148 μA to 151 μA (a range of a difference of approximately 2%), the variation in current at the time of the low resistance writing is reduced more than ever before, and a stable resistance change is achieved.

As above, in this embodiment, when a largest current flowing through a first memory cell in a first memory cell array (e.g., the memory cell array block M0_0) when the first memory cell changes from a second resistance state (the high resistance state) to a first resistance state (the low resistance state) is a first low resistance switching current, and a largest current flowing through a second memory cell in a second memory cell array (e.g., the memory cell array block M0_k−1) when the second memory cell changes from the second resistance state (the high resistance state) to the first resistance state (the low resistance state) is a second low resistance switching current, an ON resistance of the first selection circuit (e.g., the NMOS transistors TS0_0_0 to TS0_0_m−1 included in the selection circuit S0_0) is set to be higher than an ON resistance of the second selection circuit (e.g., the NMOS transistors TS0_k−1_0 to TS0_k−1_m−1 included in the selection circuit S0_k−1) so that the first low resistance switching current is substantially equal to the second low resistance switching current.

As described above, Embodiment 1 of the present invention makes it possible to reduce, using a circuit technique that has no limitation regarding the circuit block placement and is simpler, the variation in current at the time of writing which is caused by the wiring resistance of the word line and depends on the positions of the memory cells, a problem in enhancing parallel low resistance writing (i.e., performing the multi-bit simultaneous writing).

[On Resistance Adjustment for Selection Element Size]

The following describes a method for adjusting an ON resistance of the first selection element (the NMOS transistors TS0_0_0 to TS0_k−1_m−1 included in the first selection circuit in this embodiment).

A selected word line WL0_0 is divided into k−1 word lines by k memory cell array blocks obtained by dividing a memory cell array commonly connected to the word line by k in a direction orthogonal to the word line, and a wiring resistance of each of the k−1 word lines divided by the memory cell array blocks is RWL.

An ON resistance of the first selection element connected to a memory cell array block closest to the word line drive circuit 40-1 is R(1), and corresponds to an I-V characteristic slope of the characteristic TSL1 shown in FIG. 30.

Here, a memory cell current value when the low resistance writing is performed on a selected memory cell is IO.

Here, a potential of the word line in an h-th (1≤h≤k) memory cell from the word line drive circuit 40-1 is expressed as below.

$$VW(h)=IO \times RWL \times k \times (k-1)/2 - IO \times RWL \times (k+1-h) \times (k-h)/2$$

The last part of the above equation, (k+1−h)×(k−h)/2, indicates a cumulative number by which the memory cell current is superimposed for each of the k−1 word lines.

When an ON resistance of the h-th selection element connected to the h-th (1≤h≤k) memory cell when memory cell currents used in simultaneous low resistance writing are identical to each other is R(h), the following relationship is established using VW(h).

$$IO \times R(1) = VW(h) + R(h) \times IO$$

The following equation is obtained by changing the above equation.

$$R(h) = (IO \times R(1) - VW(h))/IO$$

With this equation, it is possible to calculate an appropriate ON resistance ratio.

For instance, when the calculation is performed with k=5, RWL 11.3 Ω, R(1)=667 Ω, and IO=500 μA (for two memory cells), reciprocal numbers of the ON resistance of the first selection element are 0.81, 0.88, 0.94, 0.98, and 1.00 from the near end of the word line drive circuit 40-1 in the memory cell array.

Here, it is assumed that a variation in wiring resistance is 10%, and a variation in ON resistance of a transistor is 10%, and a ratio between the reciprocal numbers is set to be within a range of ±0.04.

From above, when the channel widths of the NMOS transistors are discretely set, as an example, the respective channel width ratios are preferably set to be 0.81, 0.88, 0.94, 0.98, and 1.00 from the near end of the word line drive circuit 40-1 in the memory cell array.

Figure 32:
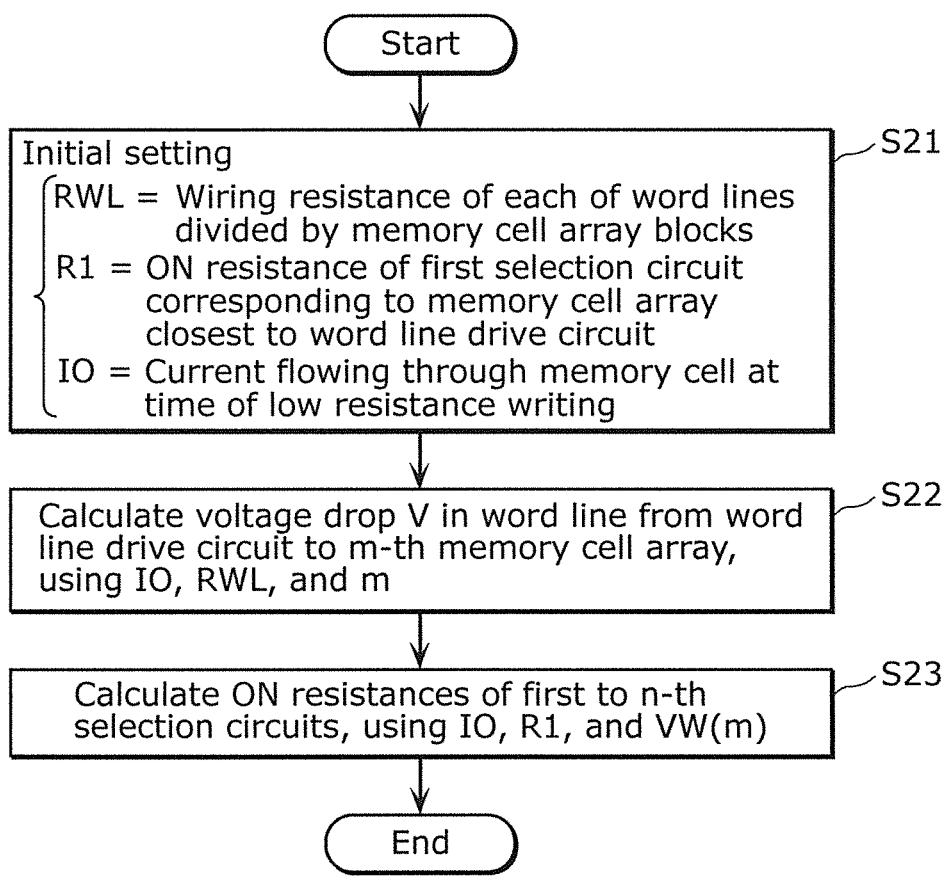
FIG. 32 is a flow chart showing a method for calculating an ON resistance of a selection circuit in Embodiment 1 of the present invention.

As stated above, in this embodiment, the ON resistance of the selection circuit in the variable resistance nonvolatile memory device is calculated by a procedure shown in a flow chart of FIG. 32. In the variable resistance nonvolatile memory device including the k memory cell array blocks commonly connected to the word lines and placed in order from the word line drive circuit, first, initial setting is performed in which the wiring resistance of each of the word lines in respective (k−1) blocks obtained by dividing the word lines by the memory cell array blocks is RWL, the ON resistance of the first selection circuit that connects the write circuit and a selected memory cell which is a memory cell selected in the first memory cell array block closest to the word line drive circuit is R(1), and the first low resistance switching current that is a current flowing through the selected memory cell when the selected memory cell changes from the second resistance state to the first resistance state having a resistance value less than that in the second resistance state is IO (S21). Then, a voltage drop VW(h) in the word lines between the word line drive circuit and the h-th (1≤h≤k) memory cell array block is calculated as a sum of voltage drops of the word lines in the respective blocks, using at least a product of IO and RWL and variable h (S22). Finally, by calculating the ON resistance R(h) of the h-th selection circuit that connects the write circuit and a memory cell selected in the h-th memory cell array block, using at least IO, R(1), and VW(h), the ON resistances of the first selection circuit to the k-th selection circuit respectively corresponding to the first memory cell array block to the k-th memory cell array block are set so that the low resistance switching currents of the first selection circuit to the k-th selection circuit respectively corresponding to the first memory cell array block to the k-th memory cell array block are substantially equal to each other (S23).

As an example, in the case of k=5, ratios of reciprocal numbers of the ON resistances of the first selection circuit to the fifth selection circuit each are determined to be within a range of ±0.04 centering on a corresponding one of 0.81, 0.88, 0.94, 0.98, and 1.00.

With this, the currents flowing (the first low resistance switching current to the k-th low resistance switching current) when the low resistance writing is performed on the memory cells belonging to the first memory cell array block to the k-th memory cell array block are substantially equal to each other, thereby achieving writing with little variation caused by the positions of the memory cells with respect to the word line drive circuit.

It is to be noted that although the example is provided where the ON resistances of the NMOS transistors TS0_0_0 to TS0_8_0 as the first selection elements are varied by changing the channel widths of the NMOS transistors TS0_0_0 to TS0_8_0, the ON resistances of other transistors may be varied by changing a parameter of the other transistors such as a channel length.

(Embodiment 2)

<<Application to Two-Layer Cross Point Structure>>

Figure 33:
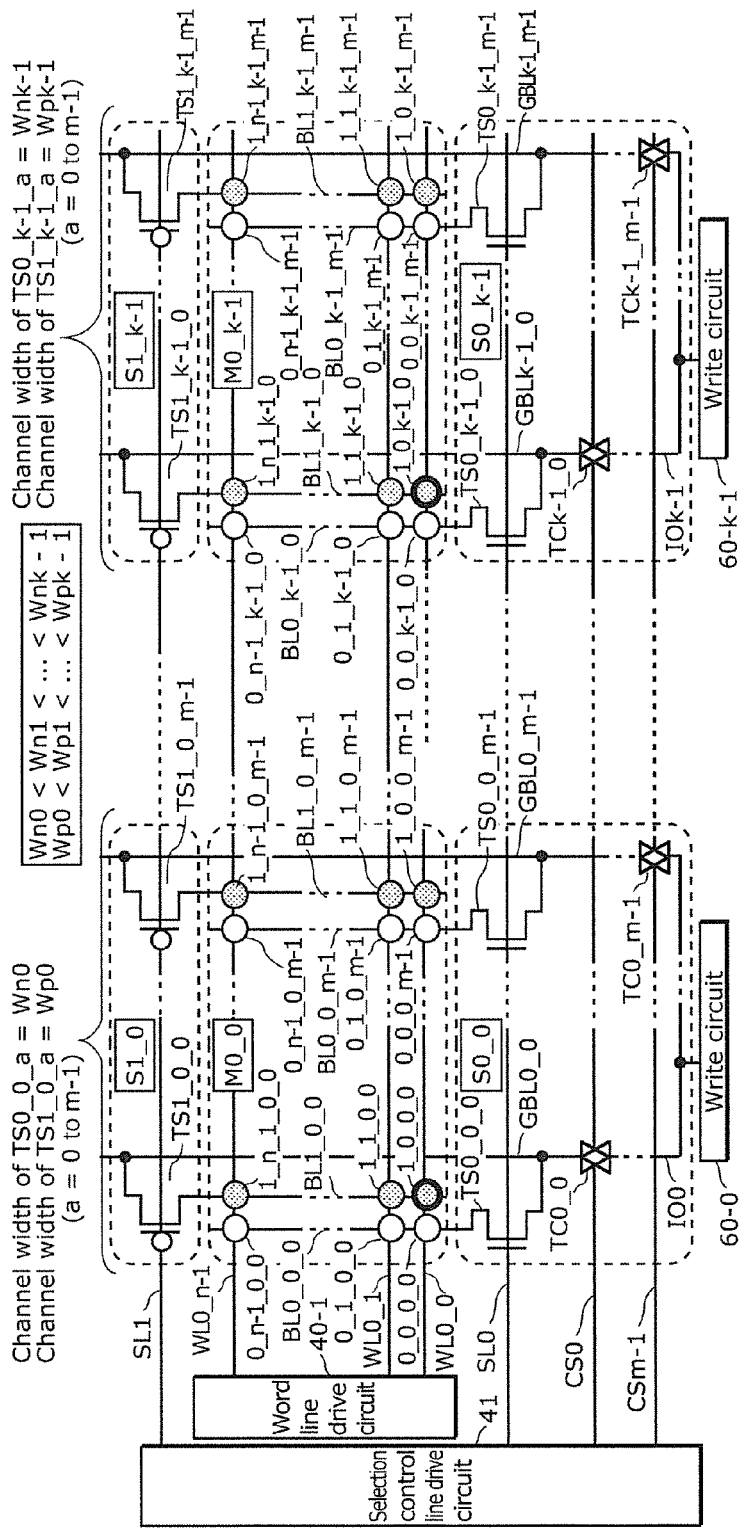
FIG. 33 is a block diagram of a cross point memory cell array according to Embodiment 2 of the present invention.

FIG. 33 shows a circuit configuration of a two-layer cross point memory cell array as Embodiment 2 of the present invention. In this memory cell array, memory cells 1_0_0_0 to 1_n−1_k−1_m−1 that share a word line and are in the second layer (an upper-layer memory cell array) are added to the memory cell array in Embodiment 1 shown in FIG. 25 (a lower-layer memory cell array).

The memory cell array includes an n number of word lines WL0_0 to WL0_n−1 that are driven by a word line drive circuit 40-1, and a k×m number of main bit lines GBL0_0 to GBLk−1_m−1 that cross the word lines in a contactless manner. The memory cell array is divided into a k number of blocks (memory cell array blocks M0_0 to M0_k−1) in a word line direction. In multi-bit simultaneous writing, one of the upper-layer memory cell array and the lower-layer memory cell array and one main bit line are selected for each of the memory cell array blocks M0_0 to M0_k−1, and k bits are simultaneously written. It is to be noted that memory cells on which simultaneous writing is performed include memory cells for data storage and memory cells not for data storage that are on the same word line.

The following describes a configuration of the memory cell array blocks M0_0 to M0_k−1, using the memory cell array block M0_0 as an example.

The memory cell array block M0_0 is connected to a first selection circuit S0_0 for the lower-layer memory cell array and a third selection circuit S1_0 for the upper-layer memory cell array. One of two sub bit lines (a lower-layer sub bit line BL0_0_0 and an upper-layer sub bit line BL1_0_0, a lower-layer sub bit line BL0_0_1 and an upper-layer sub bit line BL1_0_1, . . . , or a lower-layer sub bit line BL0_0_m−1 and an upper-layer sub bit line BL1_0_m−1) is selectively connected to an m number of main bit lines GBL0_0 to GBL0_m−1 through an NMOS transistor TS0_0_0 (the lower layer) as a first selection element or a PMOS transistor TS1_0_0 (the upper layer) as a third selection element, . . . , an NMOS transistor TS0_0_m−1 (the lower layer) or a PMOS transistor TS1_0_m−1 (the upper layer), according to a lower-layer sub bit line selection control signal SL0 or an upper-layer sub bit line selection control signal SL1 driven by a selection control line drive circuit 41. The main bit lines GBL0_0 to GBL0_m−1 are further selectively connected to a data line IO0 through the transfer gates TC0_0 to TC0_m−1 shown in FIG. 21B, according to main bit line selection control signals CS0 to CSm−1 driven by the selection control line drive circuit 41.

Moreover, the other memory cell array blocks M0_1 to M0_k−1 are connected to the memory cell array block M0_0 through a common word line. The entire memory cell array includes a k number of data lines IO0 to IOk−1 as a bus width. A k number of write circuits 60-0 to 60-k−1 each corresponding to a different one of the k memory cell array blocks M0_0 to M0_k−1 provide respective memory cells with a voltage necessary for resistance change through the data lines IO0 to IOk−1. With such a configuration, in the multi-bit simultaneous writing, the selection control line drive circuit 41 outputs the sub bit line selection control signals SL0 and SL1 and main bit line selection control signals CS0 to CSm−1 to activate one of the layers (the upper layer and the lower layer) of the memory cells and one main bit line for each of the memory cell array blocks M0_0 to M0_k−1, thereby simultaneously writing the k bits.

Figure 34:
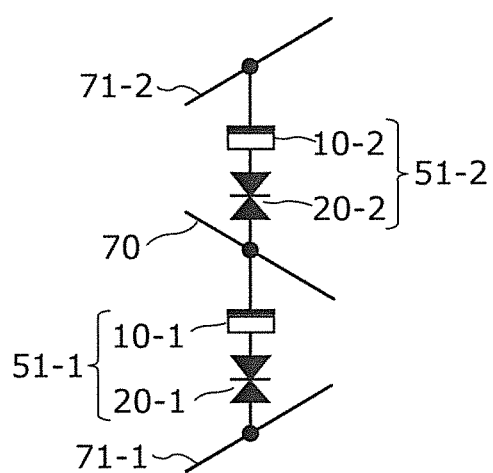
FIG. 34 is an equivalent circuit diagram of a memory cell used for a cross point memory cell array according to Embodiment 2 of the present invention.

FIG. 34 schematically shows a configuration of a two-layer cross point memory cell in this embodiment. In a lower-layer memory cell 51-1 in which a variable resistance element 10-1 and a current steering element 20-1 are connected in series, the variable resistance element 10-1 and the current steering element 20-1 are connected to a word line 70 and a subordinate sub bit line 71-1, respectively. On the other hand, in an upper-layer memory cell 51-2 in which a variable resistance element 10-2 and a current steering element 20-2 are connected in series, the variable resistance element 10-2 and the current steering element 20-2 are connected to a superordinate sub bit line 71-2 and the word line 70, respectively. The upper-layer memory cell 51-2 and the lower-layer memory cell 51-1 share the word line 70. Generally speaking, when the upper-layer memory cell and the lower-layer memory cell have the same direction in which the variable resistance elements are formed, it is more possible and preferable to reduce a variation in memory cell characteristics between the memory cell array layers than otherwise.

In FIG. 33, the memory cell array blocks M0_0 and M0_k−1 have an n number of common word lines WL0_0 to WL0_n−1, an m number of lower-layer sub bit lines BL0_0_0 to BL0_k−1_m−1, and an m number of upper-layer sub bit lines BL1_0_0 to BL1_k−1_m−1. The lower-layer sub bit lines BL0_0_0 to BL0_k−1_m−1 are respectively connected to lower-layer memory cells 0_0_0_0 to 0_n−1_k−1_m−1, and the upper-layer bit lines BL1_0_0 to BL1_k−1_m−1 are respectively connected to upper-layer memory cells 1_0_0_0 to 1_n−1_k−1_m−1. The memory cell array blocks M0_0 and M0_k−1 have a two-layer bit line configuration in which the lower-layer sub bit lines BL0_0_0 to BL0_k−1_m−1 and the upper-layer sub bit lines BL1_0_0 to BL1_k−1_m−1 are selectively connected to the main bit lines GBL0_0 to GBLk−1_m−1 according to the sub bit line selection control signal SL0 and the sub bit line selection control signal SL1, respectively.

When the low resistance writing is performed on the lower-layer memory cell 51-1 shown in FIG. 34, a positive voltage is applied to a lower electrode (the side of the sub bit line 71-1) of the variable resistance element 10-1 with reference to the upper electrode (the side of the word line 70) of the same. For this reason, the NMOS transistors are preferably used for the first selection elements TS0_0_0 to TS0_k−1_m−1 so that 0 V is applied to selected word lines WL0_0 to 0_n−1, a voltage VL is applied to k of selected sub bit lines BL0_0_0 to 0_k−1_m−1, and memory cell current control at the time of a low resistance writing operation is performed by a source follower (i.e., the variable resistance element 10-1 operates to increase a body bias effect).

In contrast, when the low resistance writing is performed on the upper-layer memory cell 51-2, a positive voltage VL is applied to the selected word lines WL0_0 to 0_n−1, and 0 V is applied to k of the selected sub bit lines BL1_0_0 to 1_k−1_m−1. For this reason, the PMOS transistors are preferably used for the third selection elements TS1_0_0 to TS1_k−1_m−1 so that the memory cell current control is performed by the source follower (i.e., the variable resistance element 10-1 operates to increase the body bias effect).

In other words, in this embodiment, in the memory cell array having the upper-layer memory cell array and the lower-layer memory cell array: a first selection circuit includes an NMOS transistor that is a first selection element; a third selection circuit includes a PMOS transistor that is a third selection element; a first current direction (i.e., a current direction at a time of low resistance writing) that is a direction of a current flowing through the first selection circuit when a memory cell changes from the second resistance state (the high resistance state) to the first resistance state (the low resistance state) is opposite to a second current direction (i.e., a current direction at a time of high resistance writing) that is a direction of a current flowing through the first selection circuit when the memory cell changes from the first resistance state (the low resistance state) to the second resistance state (the high resistance state); and the first selection circuit (the first selection elements TS0_0_0 to TS0_k−1_m−1) and the third selection circuit (the third selection elements TS1_0_0 to TS1_k−1_m−1) are connected to the memory cell in a positional relationship in which a body bias effect is greater in the first current direction (i.e., the current direction at the time of the low resistance writing) than in the second current direction (i.e., the current direction at the time of the high resistance writing).

Here, as an exemplary equivalent circuit of the memory cell array, for each of the upper-layer memory cell array and the lower-layer memory cell array, k=9 (the number of blocks is 9), a selected word line is the word line WL0_0, and nine selected memory cells (nine memory cells each belonging to a corresponding one of nine blocks) arranged evenly on the selected word line are a circuit model in which the nine selected memory cells are gathered for every two memory cells according to a wiring resistance of the word line. Here, the word line is driven from the left end of the memory cell array.

Figure 35:
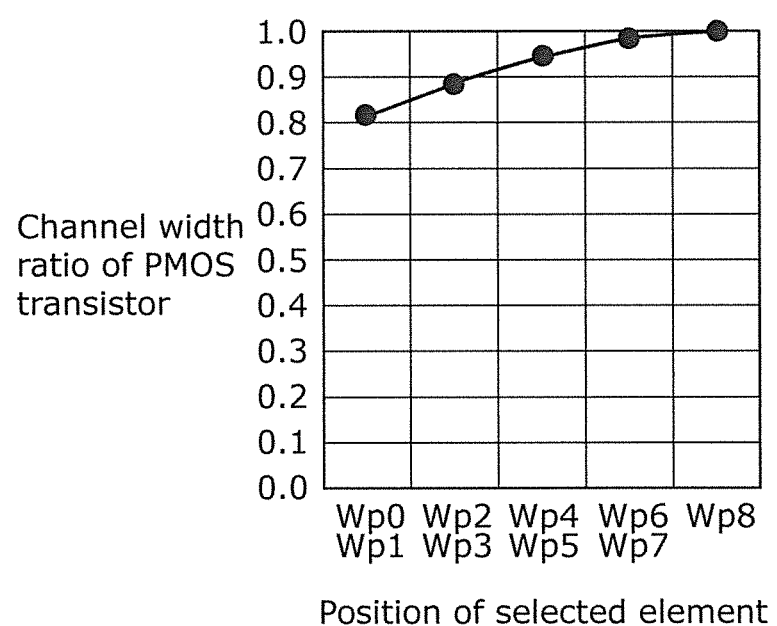
FIG. 35 is a graph showing a channel width ratio of a selection element in a cross point memory cell array according to Embodiment 2 of the present invention.

FIG. 27 shows the ratio of the channel widths Wn0 to Wn8 of the respective NMOS transistors TS0_0_0 to TS0_8_0 as the first selection elements in the selection circuit S0_0 for the lower-layer memory cell array. In addition, FIG. 35 shows ratios of channel widths Wp0 to Wp8 of PMOS transistors TS1_0_0 to TS1_8_0 as the third selection circuits in the selection circuit S1_0 for the upper-layer memory cell array. The first selection circuit and the third selection circuit in the same memory cell array block are preferably adjusted so that current drive capabilities of the first selection circuit and the third selection circuit when the low resistance writing is performed on the first selection circuit and the third selection circuit become equal to each other.

In comparison to Embodiment 1, this embodiment has a feature of the two-layer memory cell array, and a feature of distinctively using, for each layer, the NMOS transistor (the first selection element for the lower-layer memory cell array) and the PMOS transistor (the first selection element for the upper-layer memory cell array), regarding the first selection element for selectively connecting to the main bit line.

As stated above, in the variable resistance nonvolatile memory device in this embodiment, (1) a first sub bit line (e.g., the sub bit lines BL0_0_0 to BL0_0_m−1) and a second sub bit line (e.g., sub bit lines BL0_k−1_0 and BL0_k−1_m−1) among the sub bit lines are formed in the lower layer, and a third sub bit line (e.g., sub bit lines BL1_0_0 to BL1_0_m−1) including at least one of the sub bit lines, and a fourth sub bit line (e.g., sub bit lines BL1_k−1_0 to BL1_k−1_m−1) are formed in the upper layer and (2) the memory cells include the first memory cell array including memory cells connected to the first sub bit line and the third sub bit line, and the second memory cell array including memory cells connected to the second sub bit line and the fourth sub bit line.

The variable resistance nonvolatile memory device in this embodiment further includes (1) a first write circuit (e.g., the write circuit 60-0), the first selection element (e.g., the NMOS transistors TS0_0_0 to TS0_0_m−1) that connects at least one of a plurality of the first sub bit lines connected to the first write circuit, and the third selection element (e.g., PMOS transistors TS1_0_0 to TS1_0_m−1) that connects at least one of a plurality of the third sub bit lines, and (4) a second write circuit (e.g., a write circuit 60-k−1), a second selection element (e.g., the NMOS transistors TS0_k−1_0 to TS0_k−1_m−1) that connect at least one of a plurality of the second sub bit lines connected to the second write circuit, and the fourth selection element (e.g., PMOS transistors TS1_k−1_0 to TS1_k−1_m−1) that connects at least one of a plurality of the fourth sub bit lines.

Here, in a connection relationship of the memory cells, the memory cells are connected to the word lines and the sub bit lines in the lower-layer memory cell arrays of the first memory cell array and the second memory cell array so that the memory cells change to a higher resistance state when current flows into the bit lines through the memory cells from the word lines, and the memory cells are connected to the word lines and the sub bit lines in the upper-layer memory cell arrays of the first memory cell array and the second memory cell array so that the memory cells change to a higher resistance state when current flows into the word lines through the memory cells from the sub bit lines.

Here, characteristic points are as follows: (1) the first selection element and the second selection element each include the NMOS transistor, and the third selection element and the fourth selection element each include the PMOS transistor, (2) the first memory cell array is placed closer to the first word line drive circuit than the second memory cell array is, and the first ON resistance is greater than the second ON resistance, the first ON resistance being the resistance value of the first selection circuit when the first selection circuit connects the first write circuit and the first sub bit line, and the second ON resistance being the resistance value of the second selection circuit when the second selection circuit connects the second write circuit and the second sub bit line, and (3) the first memory cell array is placed closer to the first word line drive circuit than the second memory cell array is, and a third ON resistance is greater than a fourth ON resistance, the third ON resistance being a resistance value of the third selection element when the third selection element connects the first write circuit and the third sub bit line, and the fourth ON resistance being a resistance value of the fourth selection element when the fourth selection element connects the second write circuit and the fourth sub bit line.

[Equivalent Circuit Regarding Low Resistance Writing]

Figure 36:
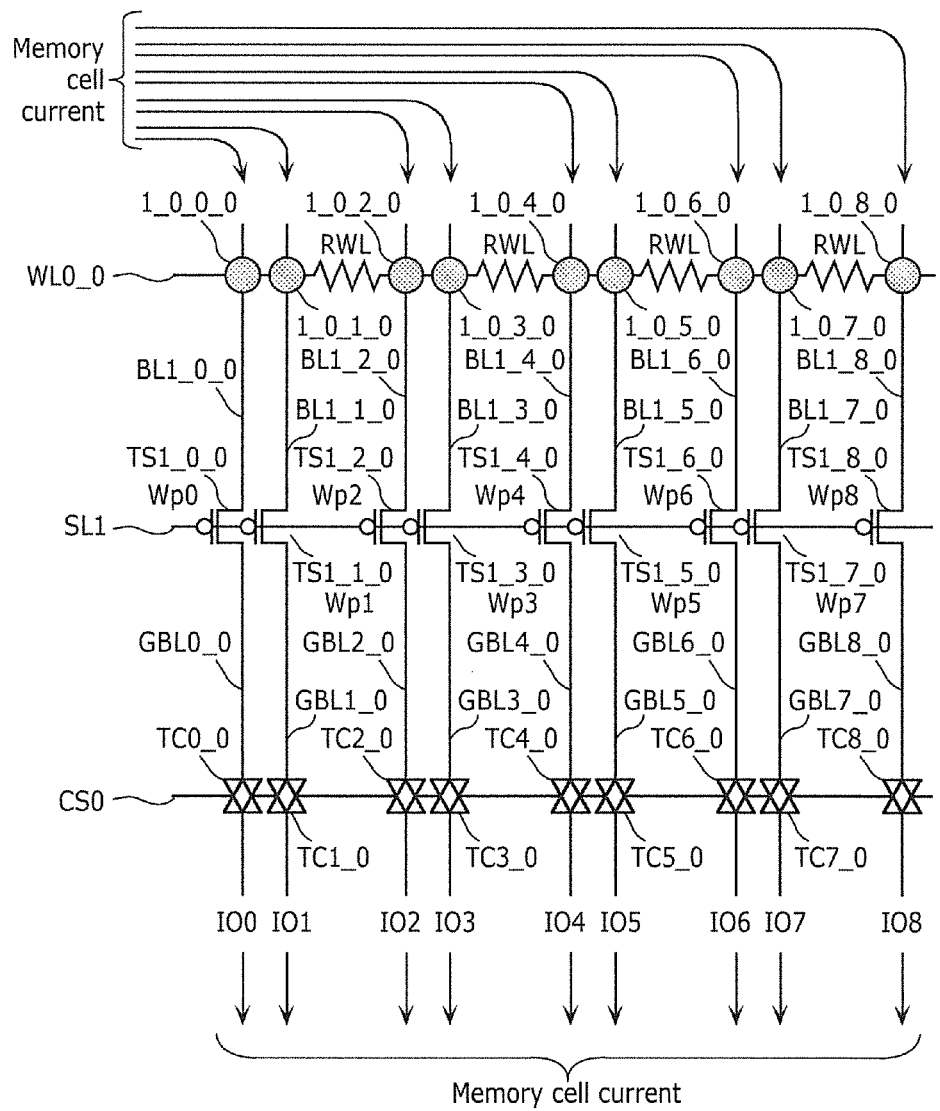
FIG. 36 is an equivalent circuit diagram of a cross point memory cell array according to Embodiment 2 of the present invention.

FIG. 36 shows an equivalent circuit of an upper-layer memory cell array that is the memory cell array which is shown in FIG. 33 and in which the third selection elements are the PMOS transistors.

Here, as an exemplary equivalent circuit of the memory cell array, k=9 (the number of blocks is 9), a selected word line is the word line WL0_0, and nine selected memory cells (nine memory cells each belonging to a corresponding one of nine blocks) arranged evenly on the selected word line are a circuit model in which the nine selected memory cells are gathered for every two memory cells according to the wiring resistance of the word line. Here, the word line is driven from the left side of the memory cell array.

At a time of the low resistance writing, 0 V is applied to the data lines IO0 to IO8, and a voltage VL (approximately 5 V) is applied to the word line WL0_0. Memory cell current for the nine memory cells is provided from the word line. After being divided and provided to each of the memory cells, the memory cell current flows to the main bit lines GBL0_0 to 8_0 through the PMOS transistors TS1_0_0 to TS1_8_0 connected to the respective memory cells, and further to the write circuits 60-0 to 60-k−1 through the transfer gates TC0_0 to TC8_0.

At this time, the wiring resistance of the word line to the word line drive circuit 40-1 is high in a memory cell 1_0_8_0 near the right end of the word line farthest from the word line drive circuit 40-1, and a decrease of a potential from the voltage VL becomes greatest since voltage drops due to currents flowing through other memory cells are accumulated.

In view of this, to compensate the voltage drop, as an example, the ON resistances of the selection elements can be adjusted by changing channel widths of the PMOS transistors as the selection elements. In other words, the decrease of the potential of the word line can be compensated by discretely determining that the ratios of the channel widths Wp0 to Wp8 of the respective PMOS transistors TS1_0_0 to TS1_8_0 as the third selection elements are smaller for blocks closer to the left end of the memory cell array near the word line drive circuit, that is, discretely determining that the ratios are larger for blocks closer to the right end of the memory cell. The current drive capabilities of the PMOS transistors at the respective positions are proportional to the ratios of the channel widths determined in the graph.

[Operating Points at Time of Low Resistance Writing]

Access to the low-layer memory cell in Embodiment 2 of the present invention is the same as in Embodiment 1, and thus a description thereof is omitted.

On the other hand, regarding access to the upper-layer memory cell, the difference from the lower-layer memory cell is that the selection elements are merely changed from the first selection elements of the NMOS transistors to the third selection elements of the PMOS transistors. For this reason, it is possible to match the ON resistances at the time of the low resistance writing between the PMOS transistors TS1_0_0 to TS1_8_0 that are the third selection elements and the NMOS transistors TS0_0_0 to TS0_8_0, by adjusting the size of the PMOS transistors TS1_0_0 to TS1_8_0, and it is also possible to cause the source follower to operate the PMOS transistors in the same manner as in the NMOS transistors that are the first selection elements in the lower-layer memory cells at the time of the low resistance writing. As a result, it is possible to perform the same operating point analysis as in FIG. 30. Thus, as with Embodiment 1 shown in FIG. 31, the memory cell current is kept within a range from 148 μA to 151 μA (the range of the difference of approximately 2%), the variation in current at the time of the low resistance writing is reduced more than ever before, and the stable resistance change is expected.

As stated above, Embodiment 2 of the present invention has shown, using the case of the two-layer memory cell array, that it is likely to reduce the variation in resistance state which is caused by the wiring resistance of the word line and depends on the positions of the memory cells, in the two-layer cross point configuration formed through the simple manufacturing processing in which the word line is shared by the upper-layer memory cell and the lower-memory cell and the variable resistance elements are formed in the same direction.

It is to be noted that, as with the two-layer case described in this embodiment, the characteristics in this embodiment can be applied to a three- or more-layer cross point configuration.

Figure 37:
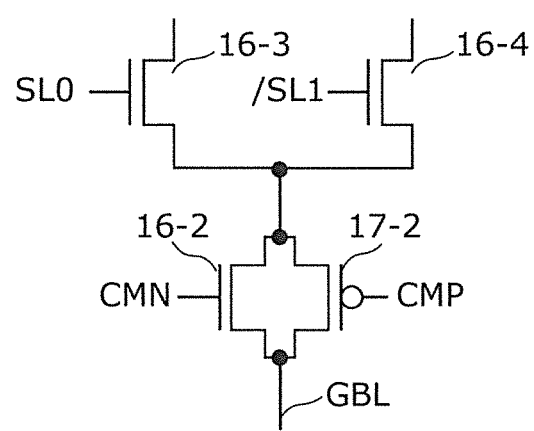
FIG. 37 is another circuit diagram of a selection circuit in a cross point memory cell array according to Embodiment 2 of the present invention.

FIG. 37 shows, as a variation of the selection circuit in the cross point memory cell array according to Embodiment 2 of the present invention shown in FIG. 33, a circuit having another configuration regarding a combination of NMOS transistors used as the first selection elements and a PMOS transistor used as the third selection element.

In this circuit, an NMOS transistor 16-3 that receives a selection signal SL0 is connected to a lower-layer sub bit line, and an NMOS transistor 16-4 that receives a selection signal/SL1 which is an inversion signal of the selection signal SL1 is connected to an upper-layer sub bit line.

In the case of accessing a lower-layer memory cell, the NMOS transistor 16-3 is activated, and the NMOS transistor 16-4 is deactivated. Moreover, an NMOS transistor 16-2 as a selection element for current steering is activated by applying a predetermined potential to a gate CMN of the NMOS transistor 16-2, and a PMOS transistor 17-2 is deactivated by applying a high voltage to a gate CMP of the PMOS transistor 17-2.

On the other hand, in the case of accessing an upper-layer memory cell, the NMOS transistor 16-3 is deactivated, and the NMOS transistor 16-4 is activated. Moreover, the PMOS transistor 17-2 as a selection element for current steering is activated by applying a predetermined potential to the gate CMP of the PMOS transistor 17-2, and the NMOS transistor 16-2 is deactivated by applying a low voltage to the gate CMN of the NMOS transistor 16-2. To put it another way, the circuit configuration separately includes selection elements (16-3 and 16-4) that select the upper-layer memory cell and the lower-layer memory cell, and current steering elements (16-2 and 17-2) that perform the current steering when the low resistance writing is performed on the upper-layer memory cell and the lower-layer memory cell.

In the cross point memory cell array according to Embodiment 2 of the present invention shown in FIG. 33, the selection elements for performing the current steering in the upper-layer bit line and the lower-layer bit line each are fixed to the NMOS transistor or the PMOS transistor. For this reason, the cross point memory cell array has the simple circuit and layout configuration. However, since transistors having one polarity type are not capable of performing the current steering on memory cell arrays in different layers which share bit lines and have different voltage application directions at the time of the low resistance writing, the circuit is incompatible with the three- or more-layer cross point configuration.

In contrast, although the variation shown in FIG. 37 complicates the configuration of the selection circuit (increases the number of transistors from two to four), the variation is compatible with the three- or more-layer cross point configuration using the NMOS transistors and the PMOS transistors for each sub bit line because the NMOS transistor and the PMOS transistor can be selected as the selection elements for the current steering in the three- or more-layer cross point configuration, according to a layer position of a memory cell array to be accessed.

It is to be noted that, to compensate, using the selection circuit according to the variation shown in FIG. 37, the voltage drop caused by the wiring resistance of the word line, the selection circuit may be configured as follows. As each of the first selection circuit and the second selection circuit, the selection circuit includes (1) a bit line selection switch element (here, the NMOS transistor 16-3 or 16-4) that applies a write voltage to a corresponding sub bit line, and (2) a current steering element that is connected in series with the bit line selection switch element and in which an N-type current steering element including the NMOS transistor 16-2 and a P-type current steering element including the PMOS transistor 17-2 are connected in parallel. The N-type current steering element and the P-type current steering element are selectively turned ON so that when one of the N-type current steering element and the P-type current steering element is ON, the other of N-type current steering element and the P-type current steering element is OFF. When a low resistance writing current is passed to the upper-layer memory cell and the lower-layer memory cell, the N-type current steering element and the P-type current steering element are connected to form a source follower connection. The cross point memory cell array is configured so that the ON resistance (the first ON resistance) of the first selection circuit closer to the word line drive circuit is greater than the ON resistance (the second ON resistance) of the second selection circuit farther from the word line drive circuit. With this, it is possible to compensate the voltage drop caused by the wiring resistance of the word line.

(Embodiment 3)

<<Application to Hierarchical Cross Point Structure and Driving of Word Line from Both Sides>>

Figure 38:
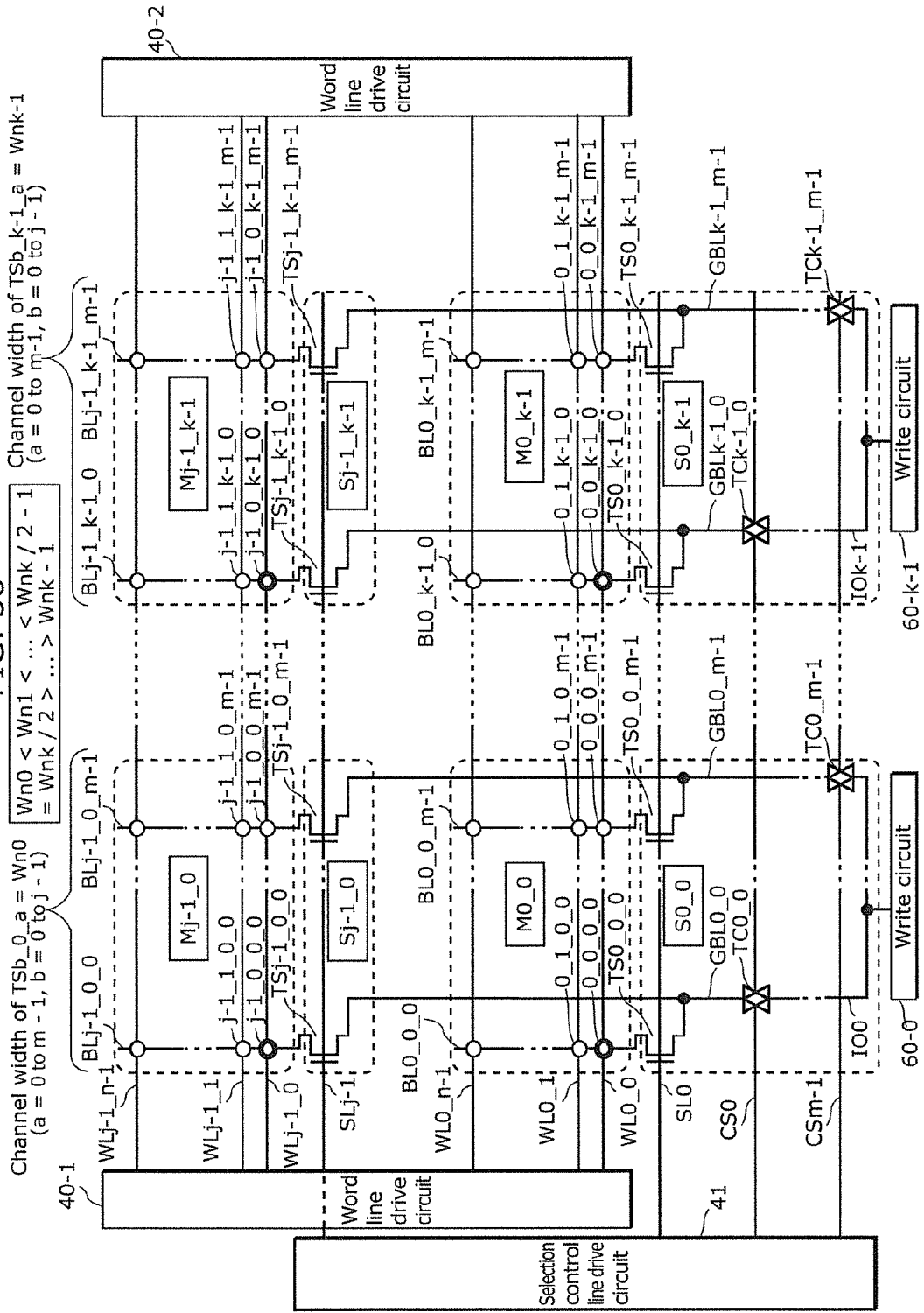
FIG. 38 is a block diagram of a cross point memory cell array according to Embodiment 3 of the present invention.

FIG. 38 shows, as Embodiment 3 of the present invention, a circuit configuration in which word lines are driven from both sides of a hierarchical cross point memory cell array having memory cell array blocks arranged in a bit line direction. The following describes a configuration of a hierarchical cross point memory cell array having a j number of layers.

The memory cell array in this embodiment includes a j×n number of word lines WL0_0 to WLj−1_n−1 that are driven from both sides of the memory cell array by word line drive circuits 40-1 and 40-2, and a j×k×m number of sub bit lines BL0_0_0 to BLj−1_k−1_m−1 that cross the word lines in a contactless manner. The memory cell array is divided into a j number of blocks in a direction in which the sub bit lines are arranged (a depth direction with respect to the figure, that is, a hierarchical direction), and a k number of blocks in a word line direction (a horizontal direction with respect to the figure). In the multi-bit simultaneous writing, one of the memory cell arrays in the j layers and one main bit line are selected for each of the k memory cell array blocks in the word line direction, and k bits are simultaneously written. It is to be noted that memory cells on which simultaneous writing is performed include memory cells for data storage and memory cells not for data storage that are on the same word line.

The following describes a configuration of the memory cell array blocks M0_0 to Mj−1_k−1, using the memory cell array block M0_0 as an example.

The memory cell array block M0_0 includes an n number of word lines WL0_0 to WL0_n−1 and an m number of sub bit lines BL0_0_0 to BL0_0_m−1. The memory cell array block M0_0 includes: the cross point memory cells 0_0_0_0 to 0_n−1_0_m−1 shown in FIG. 21A and each placed at a corresponding one of cross points of the word lines WL0_0 to WL0_n−1 and the sub bit lines BL0_0_0 to BL0_0_m−1; variable resistance elements 10 each having one end connected to a corresponding one of the word lines; and current steering elements 20 each having one end connected to a corresponding one of the sub bit lines. The sub bit lines BL0_0_0 to BL0_0_m−1 are connected to respective main bit lines GBL0_0 to GBL0_m−1 through NMOS transistors TS0_0_0 to TS0_0_m−1 as first selection elements in a selection circuit S0_0 according to a sub bit line selection control signal SL0 driven by the selection control line drive circuit 41.

The j memory cell array blocks M0_0 to Mj−1_0 arranged in the hierarchical direction each have a hierarchical bit line configuration in which the memory cell array blocks M0_0 to Mj−1_0 are selectively connected to the respective main bit lines GBL0_0 to GBL0_m−1 according to sub bit line selection control signals SL0 to SLj−1. The main bit lines GBL0_0 to GBL0_m−1 are further selectively connected to a data line IO0 through the respective transfer gates TC0_0 to TC0_m−1 shown in FIG. 21B.

Moreover, the other memory cell array blocks M0_1 to Mj−1_k−1 are respectively connected to the memory cell array blocks M0_0 to Mj−1_0 through a common word line. The entire memory cell array includes a k number of data lines IO0 to IOk−1 as a bus width. A k number of write circuits 60-0 to 60-k−1 each corresponding to a different one of the k memory cell array blocks arranged in the word line direction provide respective memory cells with a voltage necessary for resistance change through the data lines IO0 to IOk−1. With such a configuration, in the multi-bit simultaneous writing, the selection control line drive circuit 41 outputs the sub bit line selection control signals SL0 to SLj−1 and corresponding main bit line selection control signals CS0 to CSm−1 to activate one layer in the memory cell hierarchical structure and one of the main bit lines for each of the k memory cell array blocks in the word line direction, thereby simultaneously writing the k bits.

Here, as an exemplary equivalent circuit of the memory cell array, k=18 (the number of blocks is 18), a selected word line is the word line WL0_0, and 18 selected memory cells (18 memory cells each belonging to a corresponding one of 18 blocks) arranged evenly on the selected word line are a circuit model in which the 18 selected memory cells are gathered for every two memory cells according to a wiring resistance of the word line. Here, the word line is driven from both ends, that is, the left end and the right end, of the memory cell array.

Figure 39:
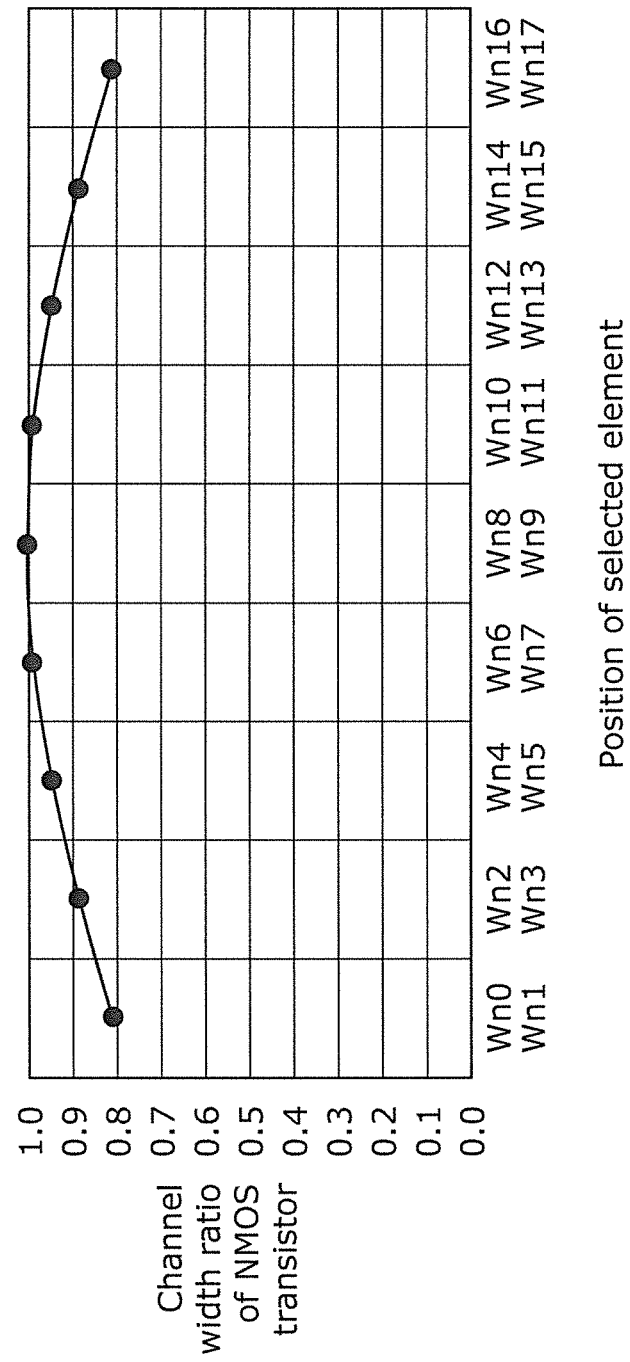
FIG. 39 is a graph showing a channel width ratio of a selection element in a cross point memory cell array according to Embodiment 3 of the present invention.

FIG. 39 shows exemplary optimum ratios of channel widths Wn0 to Wn17 of respective NMOS transistors TS0_0_0 to TS0_17_0 as first selection elements in selection circuits S0_0 to S0_k−1.

In comparison to Embodiment 1, this embodiment has a feature of the hierarchical bit line configuration in which the memory cell arrays are placed in the j layers in the direction in which the main bit lines are arranged, and the NMOS transistors that are the selection elements are capable of electrically separating the memory cell array blocks.

Moreover, in comparison to Embodiment 1, this embodiment has another feature that the word line drive circuits 40-1 and 40-2 are respectively placed at the both ends of the memory cell array, and the word lines are driven from the both sides. In other words, this configuration can be considered as a configuration in which the memory cell array in Embodiment 1 is mirror-reversed, and the mirror-reversed memory cell array is additionally placed to the right side of the memory cell array in Embodiment 1.

As described above, the variable resistance nonvolatile memory device in this embodiment includes (1) a first write circuit that applies a write voltage to a first sub bit line that is at least one of sub bit lines, where, among memory cells, memory cells connected to the first sub bit line are grouped together as a first memory cell array, (2) a second write circuit that applies a write voltage to a second sub bit line that is at least one of the sub bit lines, where, among the memory cells, memory cells connected to the second sub bit line are grouped together as a second memory cell array, (3) a third write circuit that applies a write voltage to a third sub bit line that is at least one of the sub bit lines, where, among the memory cells, memory cells connected to the third sub bit line are grouped together as a third memory cell array, (4) a fourth write that applies a write voltage to a fourth sub bit line that is at least one of the sub bit lines, where, among the memory cells, memory cells connected to the fourth sub bit line are grouped together as a fourth memory cell array, (5) a first selection circuit that connects or disconnects at least one of the first write circuit and the first sub bit line, (6) a second selection circuit that connects or disconnects at least one of the second write circuit and the second sub bit line, (7) a third selection circuit that connects or disconnects at least one of the third write circuit and the third sub bit line, (8) a fourth selection circuit that connects or disconnects at least one of the fourth write circuit and the fourth sub bit line, and (9) a first word line drive circuit (the word line drive circuit 40-1) and a second word line drive circuit (the word line drive circuit 40-2) that are placed at respective ends of each of word lines and drive the word lines from both sides.

Here, characteristic points are as follows: when the first, second, fourth, and third memory cell arrays are placed in this order in a direction from the first word line drive circuit (40-1) toward the second word line drive circuit (40-2), the first and second memory cell arrays are placed on a side of the first word line drive circuit with respect to the center of the entire memory cell array, and the third and fourth memory cell arrays are placed on a side of the second word line drive circuit with respect to the center of the entire memory cell array, a first ON resistance is greater than a second ON resistance, and a third ON resistance is greater than a fourth ON resistance, the first ON resistance being a resistance value of the first selection circuit close to the first word line drive circuit when the first selection circuit connects the first write circuit and the first sub bit line, the second ON resistance being a resistance value of the second selection circuit far from the first word line drive circuit when the second selection circuit connects the second write circuit and the second sub bit line, the third ON resistance being a resistance value of the third selection circuit close to the second word line drive circuit when the third selection circuit connects the third write circuit and the third sub bit line, and the fourth ON resistance being a resistance value of the fourth selection circuit far from the second word line drive circuit when the fourth selection circuit connects the fourth write circuit and the fourth sub bit line.

It is to be noted that, though not shown in FIG. 38, the selection circuits (S0_0 to Sj−1_k−1) each may include the current steering elements 16-2 and 17-2 shown in FIG. 37.

[Equivalent Circuit Regarding Low Resistance Writing]

Figure 40:
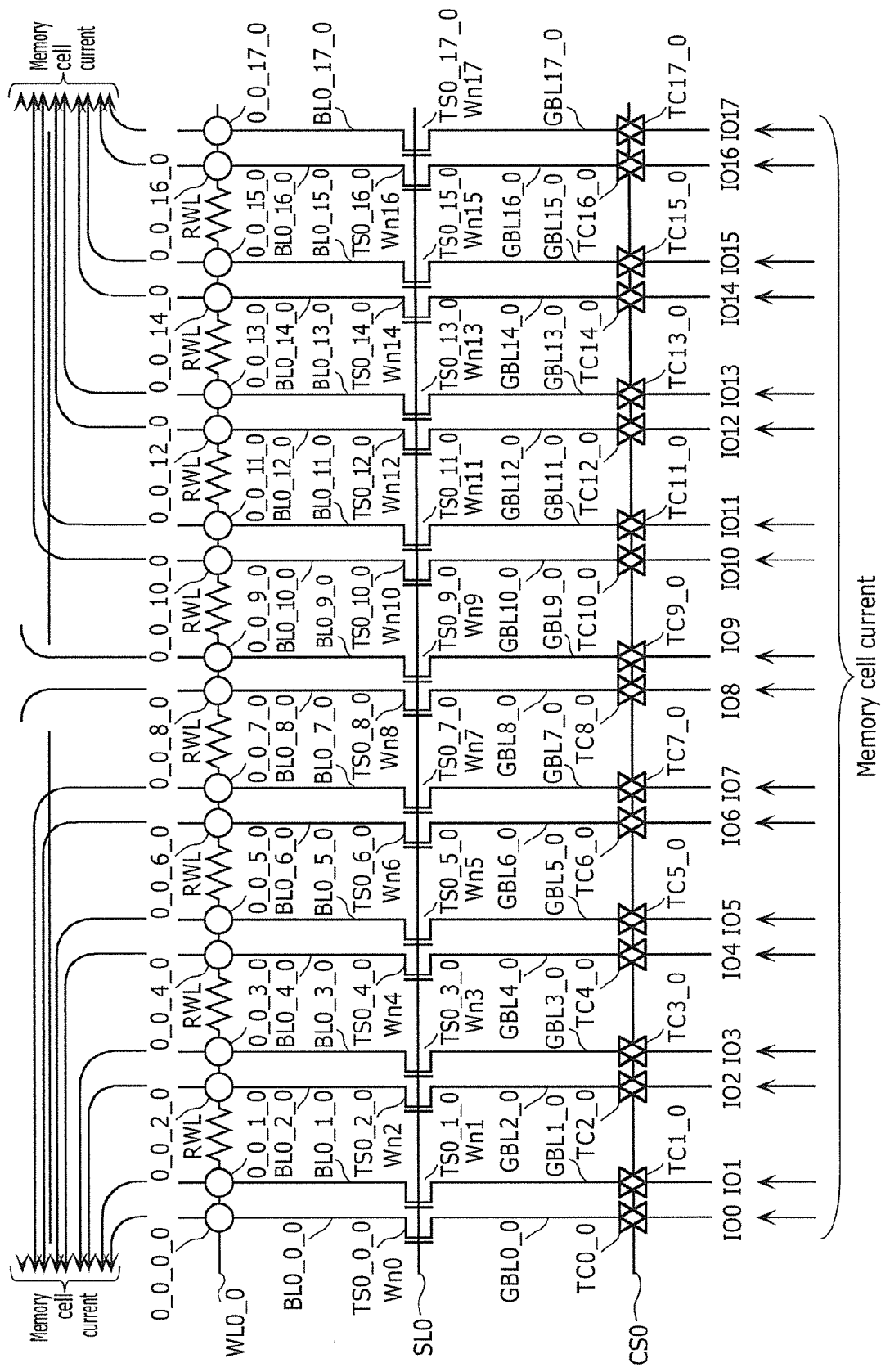
FIG. 40 is an equivalent circuit diagram of a cross point memory cell array according to Embodiment 3 of the present invention.

FIG. 40 is an equivalent circuit of the memory cell array shown in FIG. 38.

When the low resistance writing is performed on memory cells 0_0_0_0 to 0_0_17_0, a voltage VL (approximately 5 V) is applied to data lines IO0 to IO17, and 0 V is applied to word line WL0_0 from the word line drive circuits 40-1 and 40-2 at the ends. Low resistance writing currents flow into the respective 18 selected memory cells through transfer gates TC0_0 to TC17_0 and the NMOS transistors TS0_0_0 to TS0_17_0 that are the first selection elements, converge in the one word line WL0_0, and flow into the first word line drive circuit 40-1 and the second word line drive circuit 40-2 at the ends along with voltage drops caused by wiring resistances.

At this time, wiring resistances to the first word line drive circuit 40-1 and the second word line drive circuit 40-2 are high at positions far from the first word line drive circuit 40-1 and the second word line drive circuit 40-2, that is, in proximity to a node near the center of the word line to which the memory cells 0_0_8_0 and 0_0_9_0 are connected, and a decrease of a potential from 0 V at the node on the word line WL0_0 becomes greatest since the voltage drops in the word line WL0_0 due to currents flowing through other memory cells are accumulated.

Figure 41:
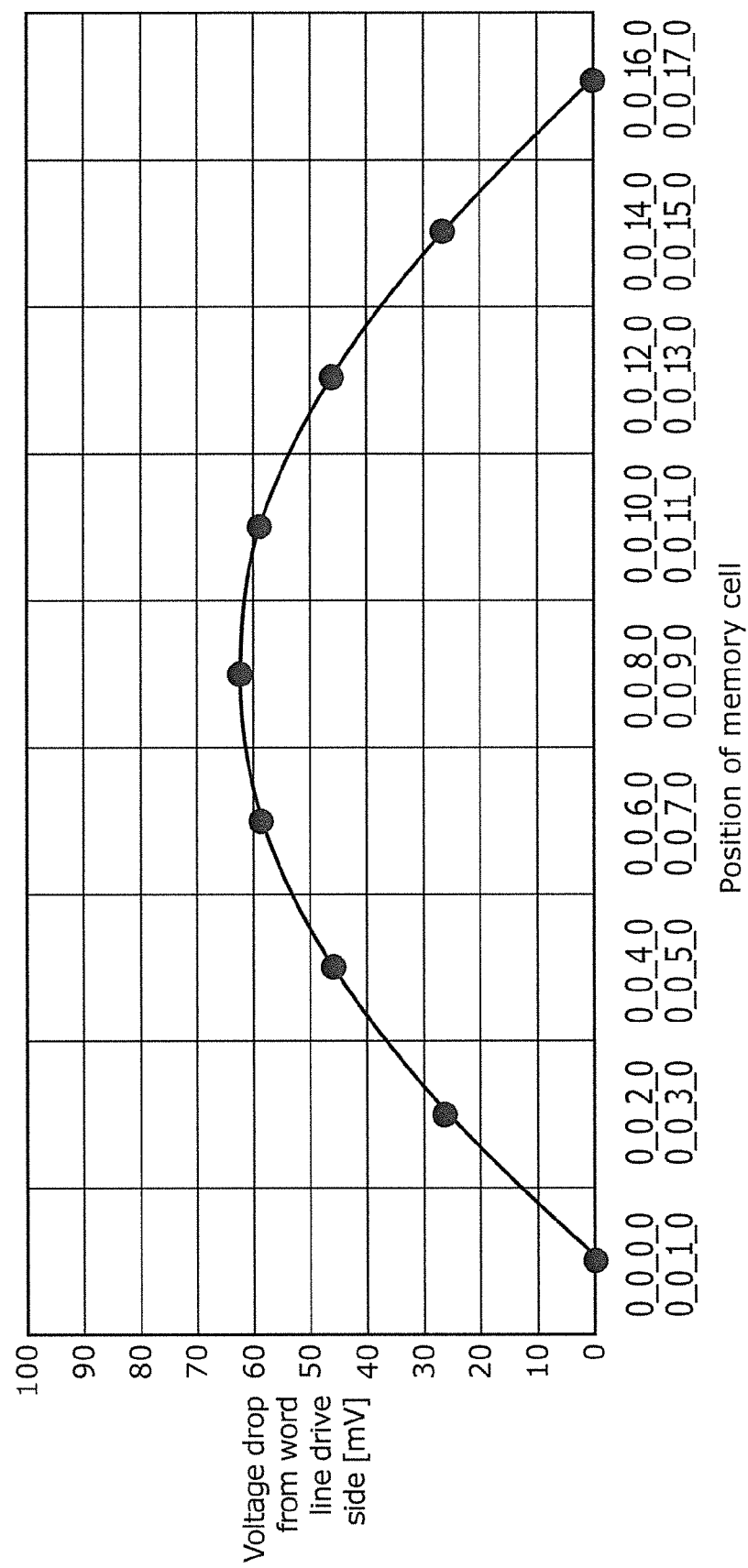
FIG. 41 is a graph showing a voltage drop in a selected word line in a cross point memory cell array according to Embodiment 3 of the present invention.

FIG. 41 shows memory cell position dependency of a potential in a word line in each memory cell. It is to be noted that in this graph, a wiring resistance RWL of the word line is 11.3 Ω, and a current value to be passed through the memory cell is 140 μA.

As shown in the graph, the potential in the word line increases as a position is farther from the first word line drive circuit 40-1 and the second word line drive circuit 40-2, that is, a position is closer to the center of the word line. The reason why a rate of increase of the potential in the word line becomes gentler as the position is closer to the center of the word line is that, as shown in FIG. 40, the number of superimposed memory cell currents becomes less for a wiring resistance at the position closer to the center of the word line.

In view of the above, to compensate the increase of the potential in the word line, for each of the blocks, an ON resistance of the selection circuit belonging to each block is set to be lower as a distance from the first word line drive circuit 40-1 and the second word line drive circuit 40-2 to the selection circuit increases, and a variation in write current for the memory cells between corresponding ones of the blocks is reduced. Moreover, as one of such methods, the channel widths Wn0 to Wn17 of the respective NMOS transistors TS0_0_0 to TS0_17_0 as the first selection elements are discretely determined to be smaller for blocks closer to one of the both ends of the memory cell array near the first word line drive circuit 40-1 and the second word line drive circuit 40-2, that is, to be larger for blocks closer to the center of the memory cell array. The current drive capabilities of the NMOS transistors at the respective positions are proportional to the ratios of the channel widths determined in the graph. It is to be noted that the ratio shown in FIG. 39 is an example based on the premise of a predetermined word line resistance and a predetermined memory cell current. It goes without saying that, to further reduce the variation in the write current of the memory cells, the ON resistance of each selection element or transfer gate may be set to be lower in each block as the distance from the word line drive circuit 40-1 and the second word line drive circuit 40-2 increases.

[Operating Points at Time of Low Resistance Writing]

The equivalent circuit of the memory cell array in Embodiment 3 of the present invention shown in FIG. 40 is obtained by mirror-reversing the equivalent circuit of the memory cell array in Embodiment 1 shown in FIG. 28, and additionally placing the mirror-reversed equivalent circuit to the right side of the equivalent circuit in Embodiment 1.

For this reason, operating points of the memory cells at the right and left ends of the word line WL0_0 in FIG. 40 can be considered as the operating point of the memory cell at the left end of the word line WL0_0 in FIG. 28, and the operating points of the memory cells at the center of the word line WL0_0 in FIG. 40 can be considered as the operating point of the memory cell at the right end of the word line in FIG. 28.

Figure 42:
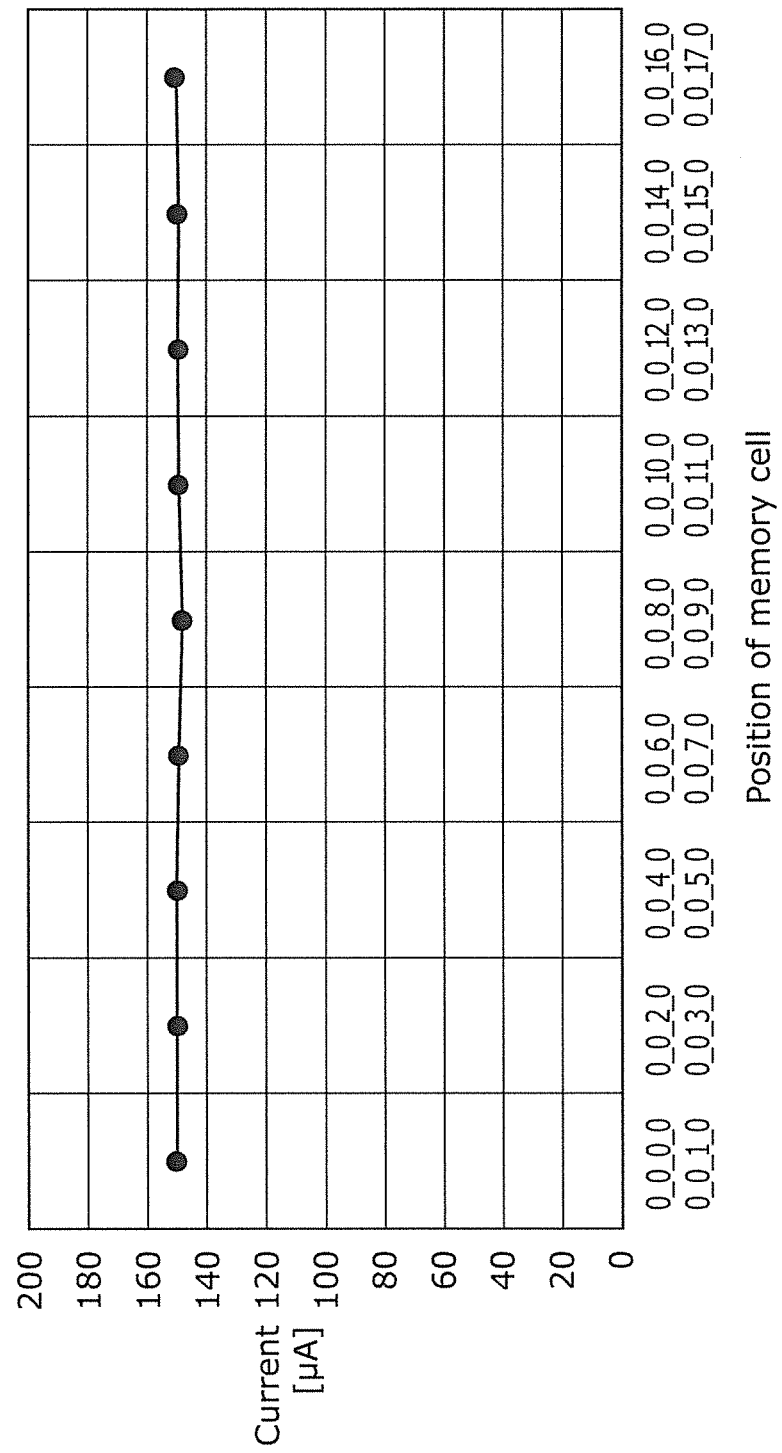
FIG. 42 is a graph showing a simulation result of memory cell position dependency of a memory cell current in a cross point memory cell array according to Embodiment 3 of the present invention.

FIG. 42 shows a result of obtaining, through simulations, an amount of a low resistant writing current flowing through each of the memory cells 0_0_0_0 to 0_0_17_0 when a low resistance writing voltage is being simultaneously applied to each of the memory cells 0_0_0_0 to 0_0_17_0. A channel width Wn of all the NMOS transistors is verified as the ratio shown in FIG. 39.

As shown in the graph, the memory cell current is kept within a range from 148 µA to 151 µA (a range of a difference of approximately 2%), the variation in current at the time of the low resistance writing is reduced more than ever before, and a stable resistance change is achieved.

As described above, the present invention can be applied to the memory cell array having the hierarchical bit line configuration in Embodiment 3 of the present invention.

In addition, by driving a word line from the both ends of a memory cell array, it is possible to achieve a configuration in which a gap (the maximum difference) in size ratio of NMOS transistors that are selection elements is small, and which has little dead space in terms of design, even for the memory cell array having a greater length of the word line in comparison to Embodiment 1.

When an area increase by hierarchization is reduced by placing sub bit line selection elements required for the hierarchical bit line configuration below a memory cell array, the configuration in this embodiment is useful in designing a more effective layout of a memory cell array.

(Embodiment 4)

<<Application to Hierarchical Cross Point Structure and Discrete Setting in Direction in which Main Bit Lines are Arranged>>

Figure 43:
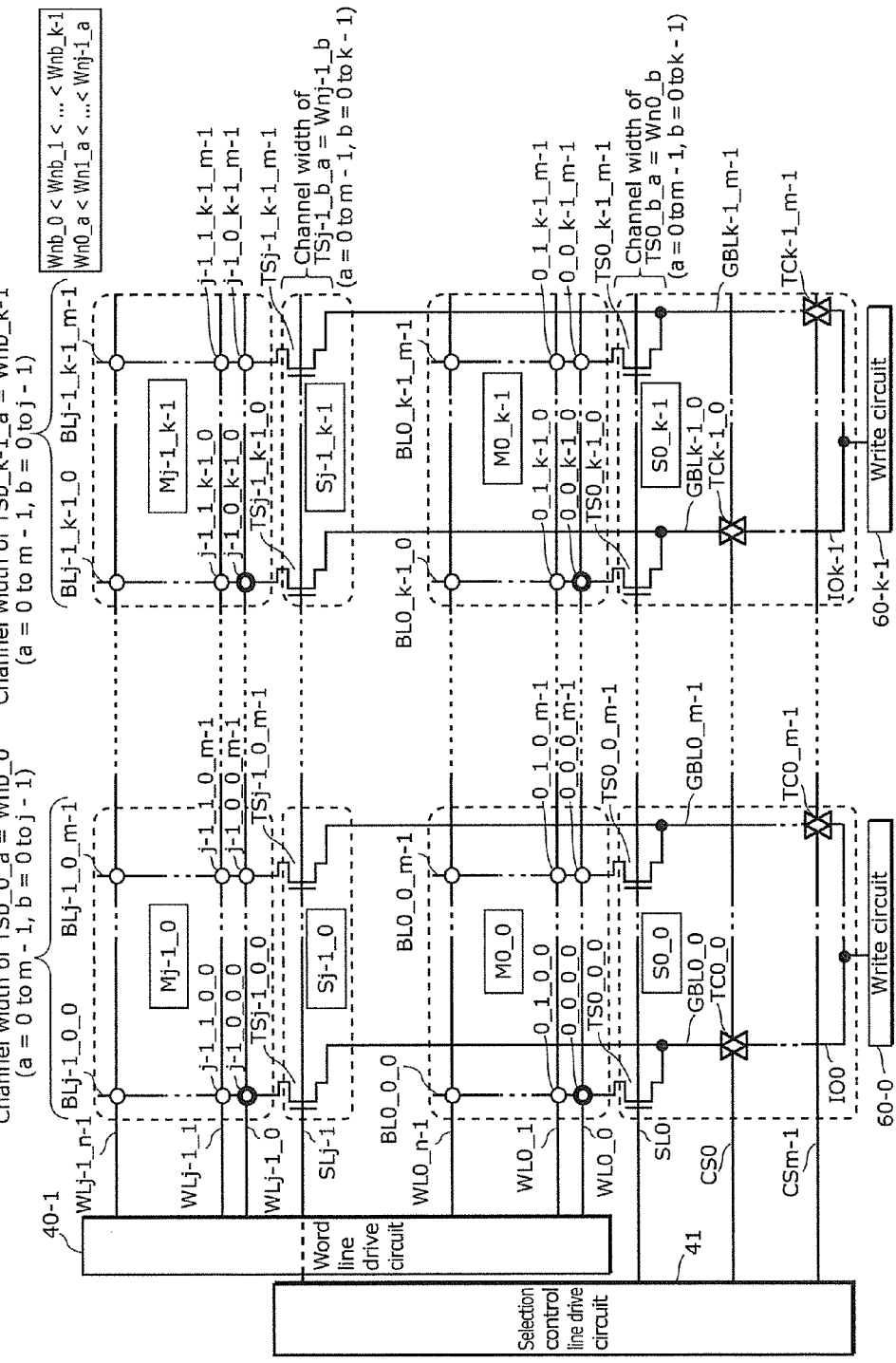
FIG. 43 is a block diagram of a cross point memory cell array according to Embodiment 4 of the present invention.

FIG. 43 shows a circuit configuration of a hierarchical cross point memory cell array as Embodiment 4 of the present invention. Although the configuration of the memory cell array in this embodiment is the same as in Embodiment 3, this embodiment differs from Embodiment 3 in that the ON resistance of the first selection element is determined in consideration of not only the wiring resistance of the word line but also a wiring resistance of a main bit line.

The memory cell array includes a j×n number of word lines WL0_0 to WLj−1_n−1 that are driven by a word line drive circuit 40-1, and a j×k×m number of sub bit lines BL0_0_0 to BLj−1_k−1_m−1 that cross the word lines in a contactless manner. The memory cell array is divided into a j number of blocks in a direction in which the sub bit lines are arranged (a depth direction with respect to the figure, that is, a hierarchical direction), and a k number of blocks in a word line direction (a horizontal direction with respect to the figure). In the multi-bit simultaneous writing, one of the memory cell arrays in the j layers and one main bit line are selected for each of the k memory cell array blocks in the word line direction, and k bits are simultaneously written. It is to be noted that memory cells on which simultaneous writing is performed include memory cells for data storage and memory cells not for data storage that are on the same word line.

The following describes a configuration of the memory cell array blocks M0_0 to Mj−1_k−1, using the memory cell array block M0_0 as an example.

The memory cell array block M0_0 includes an n number of word lines WL0_0 to WL0_n−1 and an m number of sub bit lines BL0_0_0 to BL0_0_m−1. The memory cell array block M0_0 includes: the cross point memory cells 0_0_0_0 to 0_n−1_0_m−1 shown in FIG. 21A and each placed at a corresponding one of cross points of the word lines WL0_0 to WL0_n−1 and the sub bit lines BL0_0_0 to BL0_0_m−1; variable resistance elements 10 each having one end connected to a corresponding one of the word lines; and current steering elements 20 each having one end connected to a corresponding one of the sub bit lines. The sub bit lines BL0_0_0 to BL0_0_m−1 are connected to respective main bit lines GBL0_0 to GBL0_m−1 through NMOS transistors TS0_0_0 to TS0_0_m−1 as first selection elements in a selection circuit S0_0 according to a sub bit line selection control signal SL0 driven by the selection control line drive circuit 41.

The j memory cell array blocks M0_0 to Mj−1_0 arranged in the hierarchical direction each have a hierarchical bit line configuration in which the memory cell array blocks M0_0 to Mj−1_0 are selectively connected to the respective main bit lines GBL0_0 to GBL0_m−1 according to sub bit line selection control signals SL0 to SLj−1. The main bit lines GBL0_0 to GBL0_m−1 are further selectively connected to a data line IO0 through the transfer gates TC0_0 to TC0_m−1 shown in FIG. 21B.

Moreover, the other memory cell array blocks M0_1 to Mj−1_k−1 are respectively connected to the memory cell array blocks M0_0 to Mj−1_0 through a common word line. The entire memory cell array includes a k number of data lines IO0 to IOk−1 as a bus width. A k number of write circuits 60-0 to 60-k−1 each corresponding to a different one of the k memory cell array blocks arranged in the word line direction provide respective memory cells with a voltage necessary for resistance change through the data lines IO0 to IOk−1. With such a configuration, in the multi-bit simultaneous writing, the selection control line drive circuit 41 outputs the sub bit line selection control signals SL0 to SLj−1 and main bit line selection control signals CS0 to CSm−1 to activate one layer in the memory cell hierarchical structure and one of the main bit lines for each of the k memory cell array blocks in the word line direction, thereby simultaneously writing the k bits.

Here, as an exemplary equivalent circuit of the memory cell array, k=9 (the number of blocks is 9), a selected word line is the word line WL0_0 or WL7_0, and nine selected memory cells (nine memory cells each belonging to a corresponding one of nine blocks) arranged evenly on the selected word line are a circuit model in which the nine selected memory cells are gathered for every two memory cells according to a wiring resistance of the word line. Here, the word line is driven from the left end of the memory cell array.

Here, ratios of channel widths Wn0_0 to Wn7_8 of respective NMOS transistors S0_0_0 to TS7_8_0 as first selection elements in selection circuits S0_0 to Sj−1_k−1 are defined as follows.

Wnb_0 (the channel width of an NMOS transistor closest to a word line drive circuit)<Wnb_1<...<Wnb_8 (the channel width of an NMOS transistor farthest from the word line drive circuit) and Wn0_a (the channel width of an NMOS transistor closest to a write circuit)<Wn1_a<...<Wn7_a (the channel width of an NMOS transistor farthest from the write circuit) (where, a=0 to 8, b=0 to 7)

This embodiment has a feature of discretely adjusting, for each of the blocks, the channel widths of the NMOS transistors TS0_0_0 to TSj−1_k−1_m−1 according to distances of the main bit lines from the write circuits 60-0 to 60-k−1 (i.e., in consideration of wiring resistances of the main bit lines), in addition to the feature of Embodiment 1.

As described above, in the variable resistance nonvolatile memory device in this embodiment, (1) sub bit lines include a first sub bit line (e.g., the bit lines BL0_0_0 to BL0_0_m−1) including at least one of the sub bit lines, a second sub bit line (e.g., bit lines BL0_k−1_0 to BL0_k−1_m−1), a third sub bit line (e.g., bit lines BLj−1_0_0 to BLj−1_0_m−1), and a fourth sub bit line (e.g., bit lines BLj−1_k−1_0 to BLj−1_k−1_m−1), and (2) memory cells include a first memory cell array (e.g., the memory cell array block M0_0) that is a group of memory cells connected to the first sub bit line, a second memory cell array (e.g., the memory cell array block M0_k−1) that is a group of memory cells connected to the second sub bit line, a third memory cell array (e.g., a memory cell array block Mj−1_0), and a fourth memory cell array (e.g., a memory cell array block Mj−1_k−1) that is a group of memory cells connected to the fourth sub bit line.

The variable resistance nonvolatile memory device in this embodiment further includes (3) a first selection circuit (e.g., the NMOS transistors TS0_0_0 to TS0_0_m−1) that connects at least one of a first write circuit and the first sub bit line, a third selection circuit (e.g., NMOS transistors TSj−1_0_0 to TSj−1_0_m−1) that connects at least one of the first write circuit and the third sub bit line, a second selection circuit (e.g., the NMOS transistors TS0_k−1_0 to TS0_k−1_m−1) that connects at least one of a second write circuit and the second sub bit line, and a fourth selection circuit (e.g., NMOS transistors TSj−1_k−1_0 to TSj−1_k−1_m−1) that connects at least one of the second write circuit and the fourth sub bit line.

Here, when (4) the first memory cell array and the third memory cell array are placed closer to a first word line drive circuit (the word line drive circuit 40-1) than the second memory cell array and the fourth memory cell array are, and (5) the first memory cell array is placed closer to the first write circuit (e.g., the write circuit 60-0) than the third memory cell array is, and the second memory cell array is placed closer to the second write circuit (e.g., the write circuit 60-k−1) than the fourth memory cell array is, (6) a first ON resistance is greater than a second ON resistance, and a third ON resistance is greater than a fourth ON resistance, the first ON resistance being a resistance value of the first selection circuit when the first selection circuit connects the first write circuit and the first sub bit line, the second ON resistance being a resistance value of the second selection circuit when the second selection circuit connects the second write circuit and the second sub bit line, the third ON resistance being a resistance value of the third selection circuit when the third selection circuit connects the first write circuit and the third sub bit line, and the fourth ON resistance being a resistance value of the fourth selection circuit when the fourth selection circuit connects the second write circuit and the fourth sub bit line. Moreover, (7) the first ON resistance is greater than the third ON resistance, and the second ON resistance is greater than the fourth ON resistance, the first ON resistance being the resistance value of the first selection circuit when the first selection circuit connects the first write circuit and the first sub bit line, the second ON resistance being the resistance value of the second selection circuit when the second selection circuit connects the second write circuit and the second sub bit line, the third ON resistance being the resistance value of the third selection circuit when the third selection circuit connects the first write circuit and the third sub bit line, and the fourth ON resistance being the resistance value of the fourth selection circuit when the fourth selection circuit connects the second write circuit and the fourth sub bit line.

Here, characteristic points are as follows: (1) the third ON resistance is less than the first ON resistance and (2) the fourth ON resistance is less than the second ON resistance, in addition to the characteristic points of Embodiment 1. Stated differently, voltage drops caused by the wiring resistances of the main bit lines are compensated.

[Equivalent Circuit Regarding Low Resistance Writing]

Figure 44A:
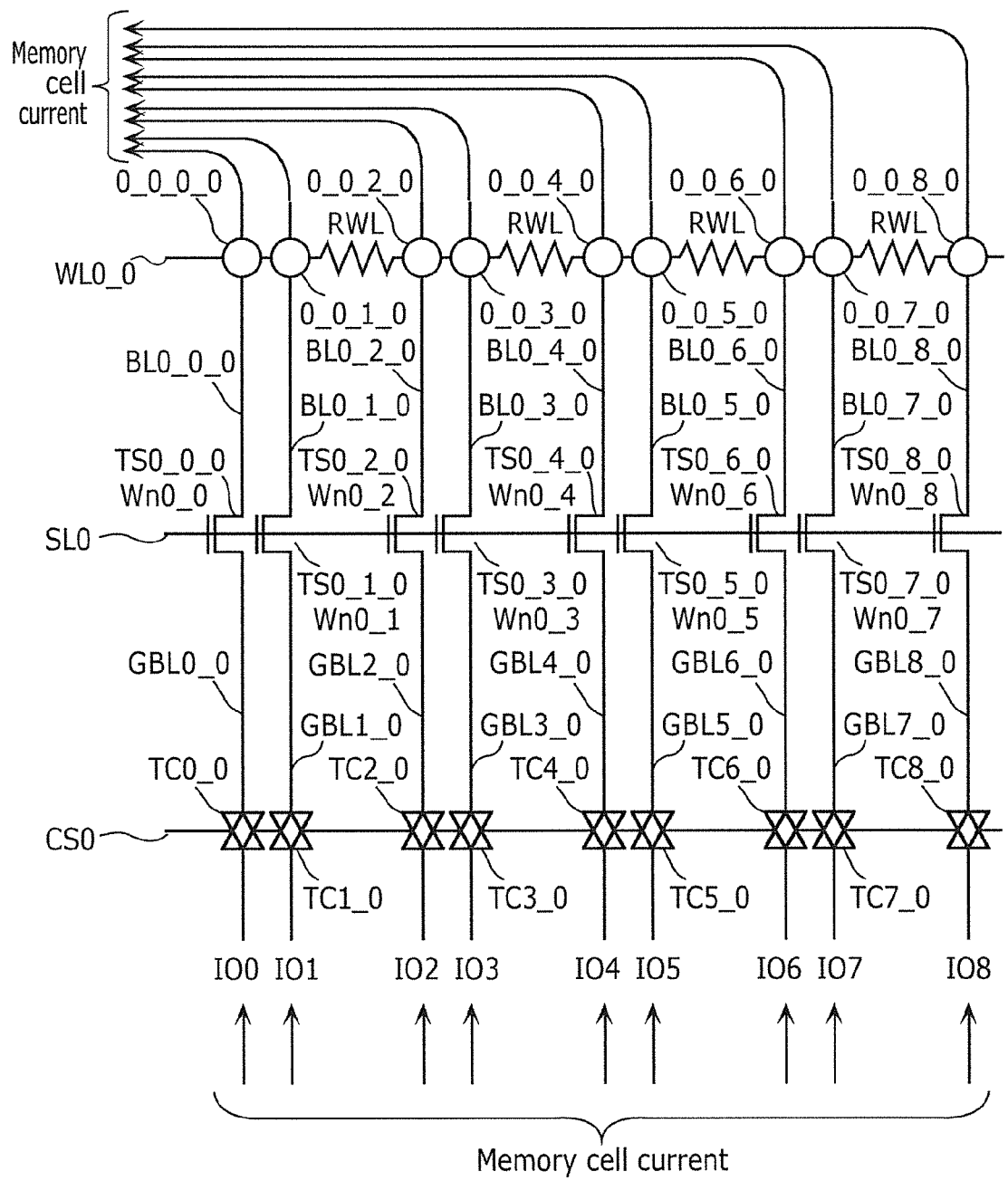
FIG. 44A is an equivalent circuit diagram of a memory cell array located at a near end with respect to a write circuit, in a cross point memory cell array according to Embodiment 4 of the present invention.
Figure 44B:
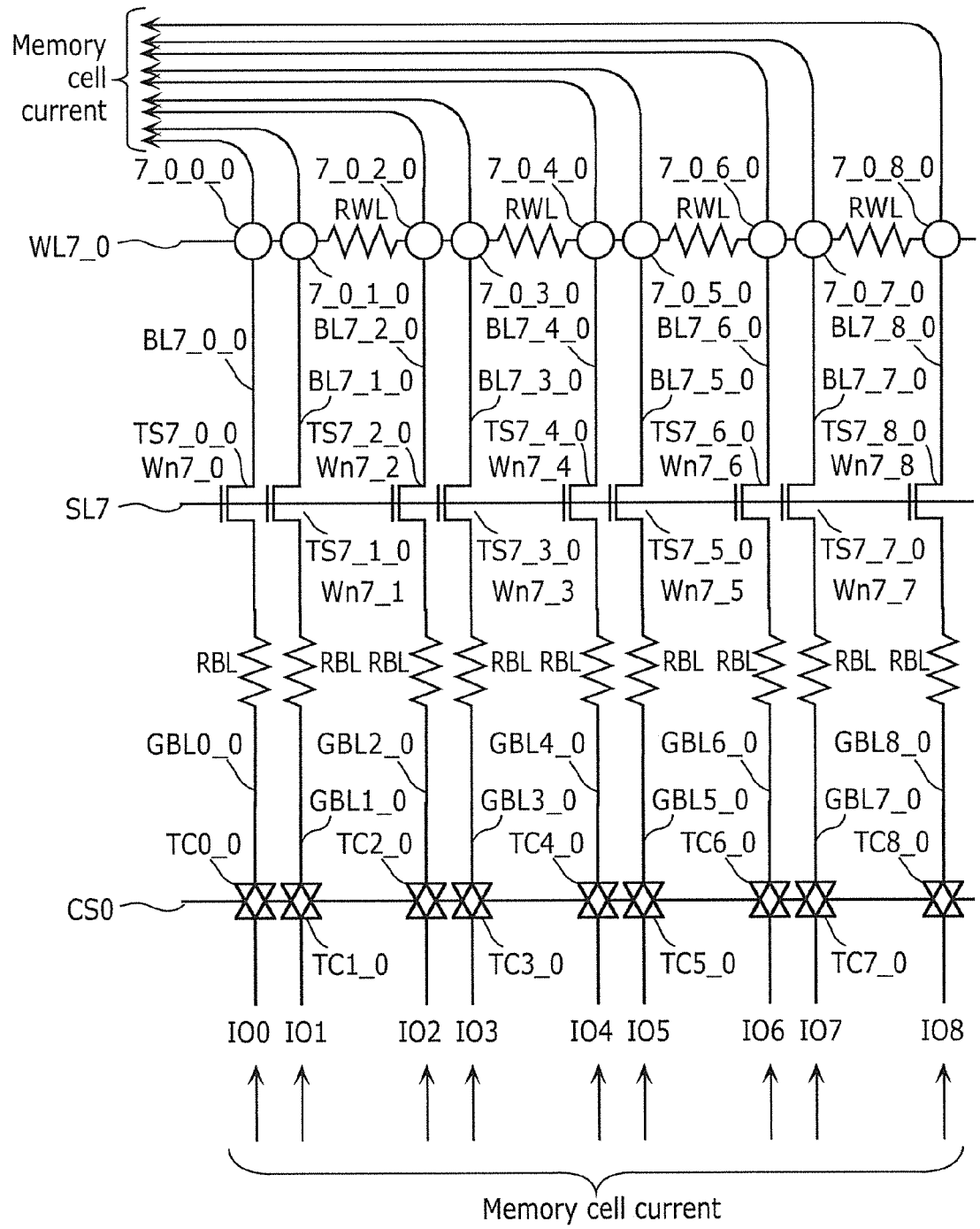
FIG. 44B is an equivalent circuit diagram of a memory cell array located at a far end with respect to a write circuit, in a cross point memory cell array according to Embodiment 4 of the present invention.

FIG. 44A shows an equivalent circuit at a time of low resistance writing regarding first-layer memory cell array blocks M0_0 to M0_8 closest to the write circuits 60-0 to 60-k−1 in the memory cell array shown in FIG. 43. FIG. 44B shows an equivalent circuit at a time of low resistance writing regarding eighth-layer memory cell array blocks M7_0 to M7_8 farthest from the write circuits 60-0 to 60-k−1.

In the both circuits, at the time of the low resistance writing, a voltage VL (approximately 5 V) is applied to the data lines IO0 to IO8, and, for instance, 0 V is applied to the selected word line WL0_0 or WL7_0. Currents that flow through memory cells flow into the nine selected memory cells through the transfer gates TC0_0 to TC8_0 and the NMOS transistors TS0_0_0 to TS0_8_0 or TS7_0_0 to TS7_8_0, converge in the one word line WL0_0 or WL7_0, and flow into the word line drive circuit along with voltage drops caused by wiring resistances.

At this time, the wiring resistance of the word line to the word line drive circuit 40-1 is high in the memory cell 0_0_8_0 near the right end of the word line far from the word line drive circuit 40-1, and an increase of a potential from 0 V becomes greatest since the voltage drops due to currents flowing through other memory cells are accumulated.

At the same time, the wiring resistances RBL of the main bit lines GBL0_0 to GBL8_0 to the transfer gates TC0_0 to TC8_0 are high in memory cells 7_0_0_0 to 7_0_8_0 selectively connected to the main bit lines near the upper ends of the main bit lines farthest from write circuits 60-0 to 60-8.

In view of the above, to compensate the increase of the potential in the word line and a decrease of potentials in the data lines (the main bit lines), the channel widths Wn0_0 to Wn7_8 of the respective NMOS transistors TS0_0_0 to TS7_8_0 as the first selection elements are discretely determined to be smaller for blocks closer to the left end of the memory cell array near the word line drive circuit 40-1, that is, to be larger for blocks closer to the right end of the memory cell array, and discretely determined to be smaller for blocks closer to the bottom end of the memory cell array near the write circuits 60-0 to 60-8, that is, to be larger for blocks closer to the upper end of the memory cell array. The current drive capabilities of the NMOS transistors at the respective positions are proportional to the determined ratios of the channel widths.

[Operating Points at Time of Low Resistance Writing]

The equivalent circuits of the memory cell arrays in Embodiment 4 of the present invention shown in FIG. 44A and FIG. 44B function to reduce the voltage VL (approximately 5 V) applied to the data lines IO0 to IO8 by a total sum of a voltage in the voltage drop caused by the wiring resistance of the word line shown in the equivalent circuit diagram of the memory cell array in Embodiment 1 shown in FIG. 28, and a voltage in the voltage drop caused by the wiring resistances of the main bit lines.

For this reason, in this embodiment, the I-V characteristic M1 of the memory cell array block M0_0 near the word line drive circuit 40-1 and the write circuits 60-0 to 60-8 is shifted to the left by the total sum of the voltages at the operating point in Embodiment 1 shown in FIG. 30, to be the I-V characteristic M5.

Here, the ratios of the channel widths Wn0_0 to Wn7_8 of the respective NMOS transistors TS0_0_0 to TS7_8_0 are determined so that the channel widths each become a channel width corresponding to a slope of an I-V characteristic TSL5 that crosses the characteristic M5 at point A1 having the same current value as point A1 where the I-V characteristic TSL1 of the selection element and the I-V characteristic M1 intersect.

As above, Embodiment 4 of the present invention makes possible the adjustment of the ON resistances of the selection elements for compensating the voltage drop caused by the wiring resistances not only of the word line but also of the main bit lines, and to more accurately reduce the variation in resistance state of the memory cells that is caused by the wiring resistances of the word line and the main bit lines and depends on their positions in the memory cell array.

(Embodiment 5)

<<Application to 1T1R Structure>>

FIG. 45 shows a circuit configuration of a 1T1R memory cell array as Embodiment 5 of the present invention.

This memory cell array includes an n number of source lines XL0 to XLn−1 that are driven from the left end of the memory cell array by a source line drive circuit 42-1, an n number of word lines WL0 to WLn−1 that are driven by a word line drive circuit 40, and a k×m number of bit lines BL0_0 to BLk−1_m−1 that cross the word lines and the source lines in a contactless manner. The memory cell array is divided into a k number of blocks in a word line direction.

The word lines WL0 to WLn−1 each are connected to a corresponding one of gate terminals of NMOS transistors TS0_0_0 to TSn−1_k−1_m−1 as selection elements. The bit lines BL0_0 to BLk−1_m−1 each are selectively connected to a corresponding one of lower electrodes of variable resistance elements 0_0_0 to n−1_k−1_m−1 through the NMOS transistors. Upper electrodes of the variable resistance elements are connected to the source lines XL0 to XLn−1, respectively.

Moreover, the m bit lines BL0_0 to BLk−1_m−1 each are selectively connected to a corresponding one of data lines IO0 to IOk−1 through the transfer gates TC0_0 to TCk−1_m−1 shown in FIG. 21B. A k number of write circuits 60-0 to 60-k-1 each corresponding to a different one of the k memory cell array blocks provide respective memory cells with a voltage necessary for resistance change through the data lines IO0 to IOk−1. With such a configuration, in the multi-bit simultaneous writing, the word line drive circuit 40 drives the word lines WL0 to WLn−1 as well as a selection control line drive circuit 41 outputs main bit line selection control signals CS0 to CSm−1 to activate, for each of the k memory cell array blocks, one memory cell and one bit line, thereby simultaneously writing k bits. It is to be noted that memory cells on which simultaneous writing is performed include memory cells for data storage and memory cells not for data storage that are on the same word line.

Here, as an exemplary equivalent circuit of the memory cell array, k=9 (the number of blocks is 9), a selected word line is the word line WL0, a selected source line is the source line XL0, and nine selected memory cells (nine selected memory cells each belonging to a corresponding one of nine memory cell array blocks) connected to the selected source line are a circuit model in which the nine selected memory cells are gathered for every two memory cells according to a wiring resistance of the source line. The source line is driven from the left end of the memory cell array.

Here, as an example, ratios of channel widths Wn0 to Wn8 of the respective NMOS transistors TS0_0_0 to TS0_8_0 as selection elements of the respective memory cells are defined as follows: Wn0, Wn1<Wn2, Wn3<Wn4, Wn5<Wn6, Wn7<Wn8. Here, NMOS transistors as an m number of selection elements in respective memory cell array blocks have the same channel width.

Moreover, in stead of adjusting an ON resistance of a selection element, the ON resistance of the selection circuit (the transfer gates TC0_0 to TCk−1_m−1) may be adjusted, for each block, to be lower as the selection circuit is farther from the source line drive circuit.

This embodiment has a feature of applying Embodiment 1 describing the cross point structure to the 1T1R memory cell array.

As described above, a variable resistance nonvolatile memory device in this embodiment includes, as characteristic structural elements, the bit lines BL0_0 to BLk−1_m−1, the word lines WL0 to WLn−1 and the source lines XL0 to XLn−1 that cross the bit lines BL0_0 to BLk−1_m−1, memory cells 0_0_0_0 to n−1_k−1_m−1, a first write circuit (e.g., the write circuit 60-0), a second write circuit (e.g., the write circuit 60-k-1), a first selection circuit (e.g., the transfer gates TC0_0 to TC0_m−1), a second selection circuit (e.g., transfer gates TCk−1_0 to TCk−1_m−1), a first source line drive circuit (the source line drive circuit 42-1), and a word line drive circuit (the word line drive circuit 40).

The memory cells are placed at cross points of the bit lines and the source lines. The memory cells each include a corresponding one of variable resistance elements 0_0_0 to n−1_k−1_m−1 and a corresponding one of selection elements TS0_0_0 to TSn−1_k−1_m−1 whose ON-OFF control performed by the respective word lines, and reversibly change at least between a first resistance state (e.g., the low resistance state) and a second resistance state (e.g., the high resistance state).

The first write circuit (e.g., the write circuit 60-0) is a circuit that applies a write voltage to a first bit line (e.g., bit lines BL0_0 to BL0_m−1) that is at least one of the bit lines, where, among the memory cells, memory cells connected to the first bit line are grouped together as a first memory cell array.

The second write circuit (e.g., the write circuit 60-k-1) is a circuit that applies a write voltage to a second bit line (e.g., bit lines BLk−1_0 to BLk−1_m−1) that is at least one of the bit lines, where, among the memory cells, memory cells connected to the second bit line are grouped together as a second memory cell array.

The first selection circuit (e.g., the transfer gates TC0_0 to TC0_m−1) is a circuit that connects or disconnects at least one of the first write circuit and the first bit line.

The second selection circuit (e.g., the transfer gates TCk−1_0 to TCk−1_m−1) is a circuit that connects or disconnects at least one of the second write circuit and the second bit line.

The first source line drive circuit (the source line drive circuit 42-1) is a circuit that drives the source lines.

The word line drive circuit (the word line drive circuit 40) is a circuit that selectively drives the word lines.

Here, the memory cells include memory cells for data storage and memory cells not for data storage. The first write circuit and the second write circuit simultaneously apply the write voltage to the first bit line and the second bit line, respectively. At this time, memory cells on which simultaneous writing is performed by the first write circuit and the second write circuit include the memory cells for data storage and the memory cells not for data storage that are on the same word line.

Here, characteristic points are as follows: (1) the first memory cell array is placed closer to the first source line drive circuit than the second memory cell array is, and (2) a first ON resistance is greater than a second ON resistance, the first ON resistance being a resistance value when the first selection element (e.g., NMOS transistors TS0_0_0 to TSn−1_0_m−1) that is a selection element included in the first memory cell array is ON, and the second ON resistance being a resistance value when the second selection element (e.g., NMOS transistors TS0_k−1_0 to TSn−1_k−1_m−1) that is a selection element included in the second memory cell array is ON.

Figure 46:
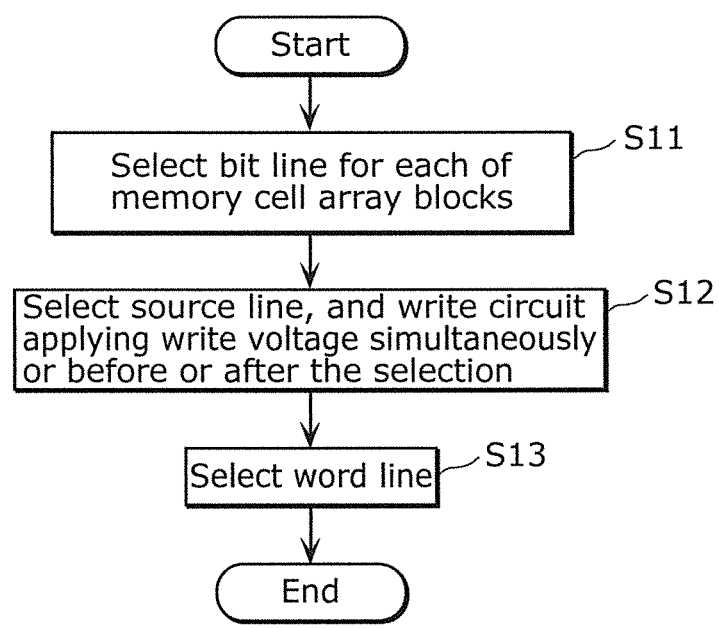
FIG. 46 is a flow chart showing a multi-bit simultaneous writing procedure in Embodiment 5 of the present invention.

The variable resistance nonvolatile memory device having such a configuration in this embodiment performs the following multi-bit simultaneous writing, as shown in a flow chart of FIG. 46. One bit line is selected for each memory cell array by the selection control line drive circuit 41 outputting a main bit line selection control signal (S11). The first source line drive circuit (the source line drive circuit 42-1) selectively drives source lines, while write circuits (the write circuits 60-0 to 60-k-1) simultaneously apply a write voltage to the respective selected bit lines (e.g., the bit lines BL0_0, ..., BLk-1_0) (S12). Simultaneous writing is performed on the memory cells included in each memory cell array by the word line drive circuit (the word line drive circuit 40) selectively driving, among word lines, word lines corresponding to the source lines driven by the first source line drive circuit (the source line drive circuit 42-1) (S13).

[Equivalent Circuit Regarding Low Resistance Writing]

Figure 47:
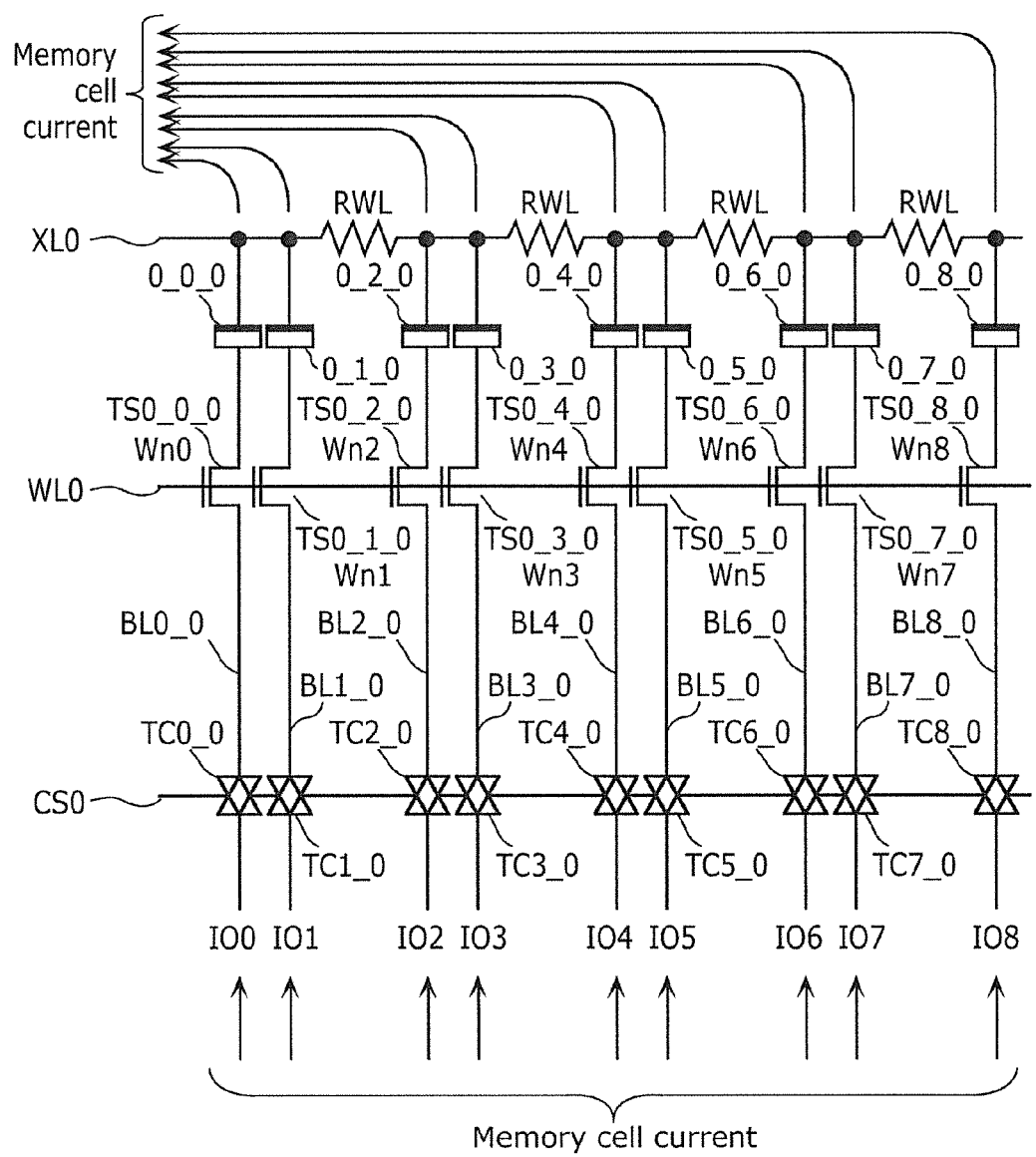
FIG. 47 is an equivalent circuit diagram of a 1T1R memory cell array according to Embodiment 5 of the present invention.

FIG. 47 is an equivalent circuit of the memory cell array shown in FIG. 45.

At the time of the low resistance writing, a voltage VL is applied to the data lines IO0 to IO8, and 0 V is applied to the source line XL0. Currents flowing through the variable resistance elements 0_0_0 to 0_8_0 flow into nine variable resistance elements through the transfer gates TC0_0 to TC8_0 and the NMOS transistors TS0_0_0 to TS0_8_0, converge in the one source line XL0, and flow into the source line drive circuit 42-1 at the left end along with voltage drops caused by wiring resistances.

At this time, a wiring resistance to the source line drive circuit 42-1 is high in the memory cell 0_8_0 near the right end of the source line far from the source line drive circuit 42-1, and an increase of a potential from 0 V becomes greatest since the voltage drops due to currents flowing through other memory cells are accumulated.

In view of this, to compensate the increase of the potential in the source line, ratios of the channel widths Wn0 to Wn8 of the respective NMOS transistors TS0_0_0 to TS0_8_0 as the selection elements are discretely determined to be smaller for blocks closer to the left end of the memory cell array near the source line drive circuit 42-1, that is, to be larger for blocks closer to the right end of the memory cell array. The current drive capabilities of the NMOS transistors at the respective positions are proportional to the ratios of the channel widths.

[Operating Points at Time of Low Resistance Writing]

Figure 48:
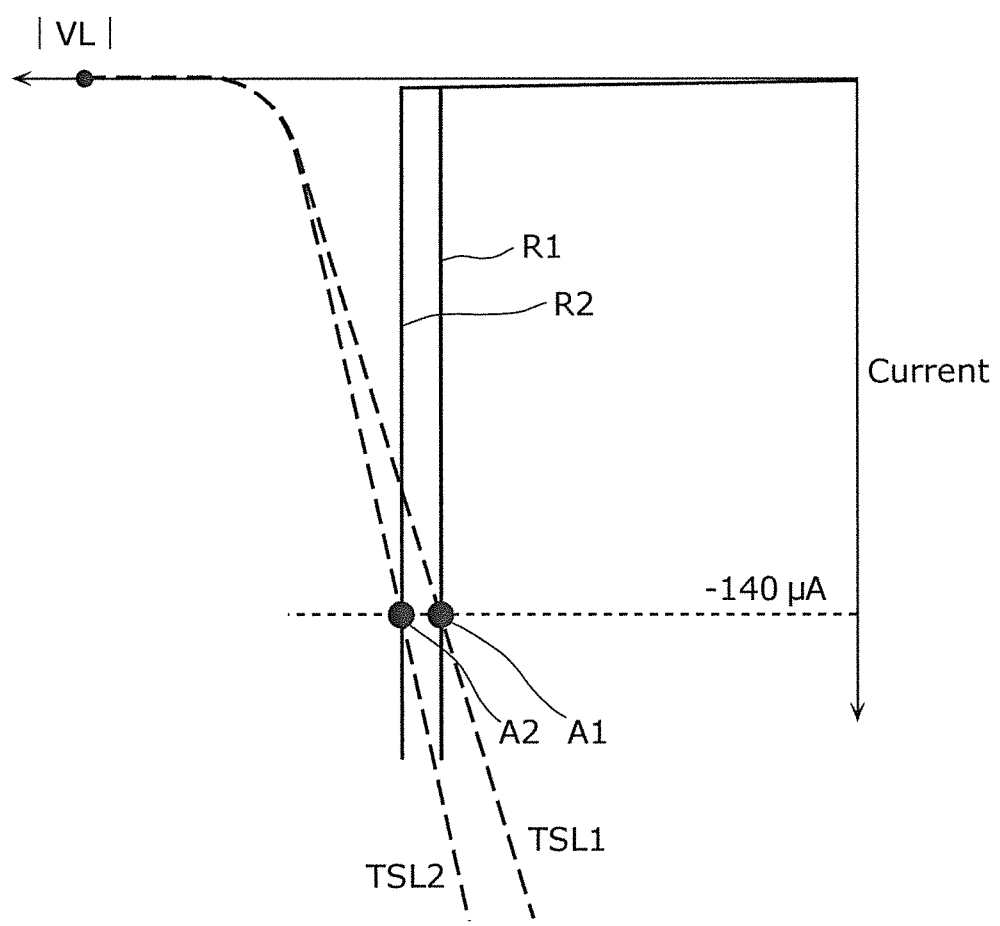
FIG. 48 is a graph showing operating points of a memory cell in a 1T1R memory cell array according to Embodiment 5 of the present invention.

FIG. 48 shows operating points of a memory cell at a representative position in Embodiment 5 of the present invention. This graph illustrates the left end and the right end of a memory cell array. It is to be noted that in comparison to the graph of the operating points in the low resistance writing and the high resistance writing of the variable resistance element shown in FIG. 8, the graph extracts and illustrates only the left quadrant regarding the low resistance writing. Moreover, only the upper portion of characteristic lines showing a change from the high resistance state to the low resistance state via point A0 shown in FIG. 8 are extracted and illustrated for I-V characteristics R1 and R2 of the variable resistance element in FIG. 48.

(1) At the left end of the memory cell array

At the left end of the memory cell array, an I-V characteristic R1 of each of the memory cells 0_0_0 and 0_0_1 and an I-V characteristic TSL1 of each of the NMOS transistors TS0_0_0 and TS0_1_0 are balanced at intersection point A1, and a current flowing through the memory cells becomes a memory cell current of approximately 140 µA.

(2) At the right end of the memory cell array

At the right end of the memory cell array, in the memory cell 0_8_0, a potential in the source line XL0_0 increases due to a voltage drop caused by a wiring resistance of the source line. For this reason, an I-V characteristic of the memory cell 0_8_0 is expressed in FIG. 48 as the I-V characteristic R2 obtained by shifting the I-V characteristic to the left by the voltage drop with respect to the I-V characteristic R1.

In contrast, the channel width of the NMOS transistor TS0_8_0 is set to be larger than those of the NMOS transistors TS0_0_0 and TS0_1_0, and thus the I-V characteristic becomes a characteristic TSL2 that is steeper.

Although point A2 where the I-V characteristic R2 and the I-V characteristic TSL2 intersect becomes an operating point at the right end of the memory cell array, the increase of the potential in the source line is compensated by enhancement of the drive capability of the NMOS transistor, and it is possible to adjust the memory cell current so that the memory cell current has the same values at the both ends of the memory cell array, as shown in the graph.

As described above, Embodiment 5 of the present invention makes it possible to reduce, for the 1T1R memory cell array, the variation in resistance state that is caused by the wiring resistance of the source line and depends on the positions of the memory cells, by adjusting the current drive capability of the NMOS transistor that is the selection element directly connected to the variable resistance element, based on the position in the memory cell array (the distance from the source line drive circuit 42-1).

(Embodiment 6)

<<Application to Driving of Source Line from Both Sides in 1T1R Structure>>

Figure 49:
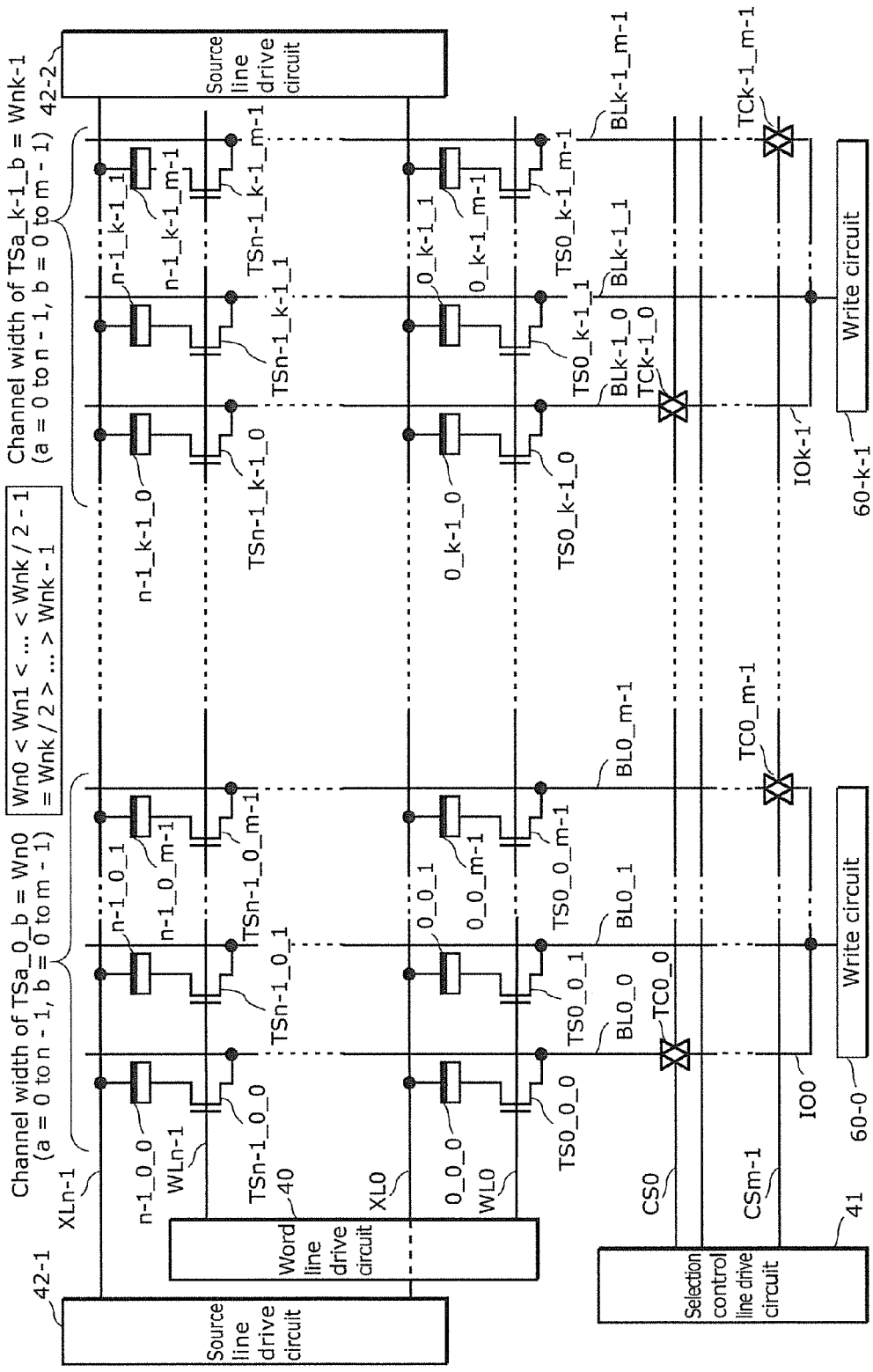
FIG. 49 is a block diagram of a 1T1R memory cell array according to Embodiment 6 of the present invention.

FIG. 49 shows a circuit configuration of a 1T1R memory cell array in which a word line is driven from both sides of the memory cell array, as Embodiment 6 of the present invention.

This memory cell array includes an n number of source lines XL0 to XLn-1 that are driven from the both sides of the memory cell array by source line drive circuits 42-1 and 42-2, an n number of word lines WL0 to WLn-1 that are driven by a word line drive circuit 40, and a k×m number of bit lines BL0_0 to BLk-1_m-1 that cross the word lines and the source lines in a contactless manner. The memory cell array is divided into a k number of blocks in a word line direction.

The word lines WL0 to WLn-1 are connected to gate terminals of NMOS transistors TS0_0_0 to TSn-1_k-1_m-1 as selection elements, and the bit lines BL0_0 to BLk-1_m-1 are selectively connected to lower electrodes of variable resistance elements 0_0_0 to n-1_k-1_m-1 through the NMOS transistors. Upper electrodes of the variable resistance elements are connected to the source lines XL0 to XLn-1.

Moreover, the m bit lines BL0_0 to BLk-1_m-1 each are selectively connected to a corresponding one of data lines IO0 to IOk-1 through the transfer gates TC0_0 to TCk-1_m-1 as the second selection elements shown in FIG. 21B. A k number of write circuits 60-0 to 60-k-1 each corresponding to a different one of the k memory cell array blocks provide respective memory cells with a voltage necessary for resistance change through the data lines IO0 to IOk-1. With such a configuration, in the multi-bit simultaneous writing, the word line drive circuit 40 drives the word lines WL0 to WLn-1 as well as a selection control line drive circuit 41 outputs main bit line selection control signals CS0 to CSm-1 to activate, for each of the k memory cell array blocks, one memory cell and one bit line, thereby simultaneously writing k bits. It is to be noted that memory cells on which simultaneous writing is performed include memory cells for data storage and memory cells not for data storage that are on the same word line.

Here, as an exemplary equivalent circuit of the memory cell array, k=18 (the number of blocks is 18) a selected word line is the word line WL0, a selected source line is the source line XL0, and 18 selected memory cells (18 selected memory cells each belonging to a corresponding one of 18 memory cell array blocks) connected to the selected source line are a circuit model in which the 18 selected memory cells are gathered for every two memory cells according to a wiring resistance of the source line. The source line is driven from the both sides of the memory cell array.

Here, ratios of channel widths Wn0 to Wn17 of respective NMOS transistors TS0_0_0 to TS0_17_0 as first selection elements are defined as, for instance, Wn0, Wn1, Wn16, Wn17<Wn2, Wn3, Wn14, Wn15<Wn4, Wn5, Wn12, Wn13<Wn6, Wn7, Wn10, Wn11<Wn8, Wn9.

In comparison to Embodiment 5 describing the 1T1R structure, this embodiment has a feature of placing the source line drive circuits 42-1 and 42-2 at the both ends of the memory cell array, and driving the source line from the both sides. In other words, this configuration can be considered as a configuration in which the memory cell array in Embodiment 5 is mirror-reversed, and the mirror-reversed memory cell array is additionally placed to the right side of the memory cell array in Embodiment 5.

As described above, the variable resistance nonvolatile memory device in this embodiment includes (1) a first write circuit that applies a write voltage to a first bit line that is at least one of bit lines, where, among memory cells, memory cells connected to the first bit line are grouped together as a first memory cell array, a second write circuit that applies a write voltage to a second bit line that is at least one of the bit lines, where, among the memory cells, memory cells are grouped together as a second memory cell, a third write circuit that applies a write voltage to a third bit line that is at least one of the bit lines, where, among the memory cells, memory cells connected to the third bit line are grouped together as a third memory cell array, a fourth write circuit that applies a write voltage to a fourth bit line that is at least one of the bit lines, where, among the memory cells, memory cells connected to the fourth bit line are groups as a fourth memory cell array, (2) a first selection circuit that connects or disconnects at least one of the first write circuit and the first bit line, a second selection circuit that connects or disconnects at least one of the second write circuit and the second bit line, a third selection circuit that connects or disconnects at least one of the third write circuit and the third bit line, a fourth selection circuit that connects or disconnects at least one of the fourth write circuit and the fourth bit line, and (3) a first source line drive circuit (e.g., the source line drive circuit 42-1) and a second source line drive circuit (e.g., the source line drive circuit 42-2) that drive source lines. Here, the first source line drive circuit and the second source line drive circuit are placed on a corresponding one of both sides of the same source lines.

Here, a characteristic point is as follows: when the first memory cell array, the second memory cell array, the fourth memory cell array, and the third memory cell array are placed in this order in a direction from the first source line drive circuit (e.g., the source line drive circuit 42-1) toward the second source line drive circuit (e.g., the source line drive circuit 42-2), a first ON resistance is greater than a second ON resistance, and a third ON resistance is greater than a fourth ON resistance, the first ON resistance being a resistance value when a first selection element that is a selection element included in the first memory cell array near the first source line drive circuit is ON, the second ON resistance being a resistance value when a second selection element that is a selection element included in the second memory cell array far from the first source line drive circuit is ON, the third ON resistance being a resistance value when a third selection element that is a selection element included in the third memory cell array near the second source line drive circuit is ON, and the fourth ON resistance being a resistance value when a fourth selection element that is a selection element included in the fourth memory cell array far from the second source line drive circuit in ON.

[Equivalent Circuit Regarding Low Resistance Writing]

As Embodiment 3 of the present invention has described the exemplary cross point structure, the equivalent circuit in which the source line is driven from the both sides and which is described in Embodiment 6 is combined with an equivalent circuit obtained by mirror-reversing the equivalent circuit in which the driving is performed from the one side in Embodiment 5.

At this time, wiring resistances to the source line drive circuits 42-1 and 42-2 are high in the memory cells 0_8_0 and 0_9_0 at positions far from the source line drive circuits 42-1 and 42-2, that is, near the center of the source line, and an increase of a potential from 0 V becomes greatest since the voltage drops due to currents flowing through other memory cells are accumulated.

In view of this, to compensate the increase of the potential in the source line, the ratios of the channel widths Wn0 to Wn17 of the respective NMOS transistors TS0_0_0 to TS0_17_0 as the first selection elements are discretely determined to be smaller for blocks closer to one of the both ends of the memory cell array near a corresponding one of the source line drive circuits 42-1 and 42-2, that is, to be larger for blocks closer to the center of the memory cell array. The current drive capabilities of the NMOS transistors at the respective positions are proportional to the ratios of the channel widths.

[Operating Points at Time of Low Resistance Writing]

In the memory cell array in Embodiment 6 of the present invention, operating points of the memory cells at the right and left ends of the source line XL0 can be considered as the operating point of the memory cell at the left end of the source line XL0 in FIG. 48, and operating points of the memory cells at the center of the source line XL0 can be considered as the operating point of the memory cell at the right end of the source line in FIG. 48.

Thus, as with Embodiment 5 of the present invention, the memory cell current is kept within a predetermined range, the variation in current at the time of the low resistance writing is reduced more than ever before, and the stable resistance change is expected.

In addition, by driving the source line from the both ends of the memory cell array, it is possible to achieve a configuration in which a gap (the maximum difference) in size ratio of the NMOS transistors that are the selection elements is small, and which has little dead space, even for the memory cell array having a greater length of the source line in comparison to Embodiment 5.

(Embodiment 7)

<<Application to 1T1R Structure and Discrete Setting in Direction in Which Bit Lines are Arranged>>

Figure 50:
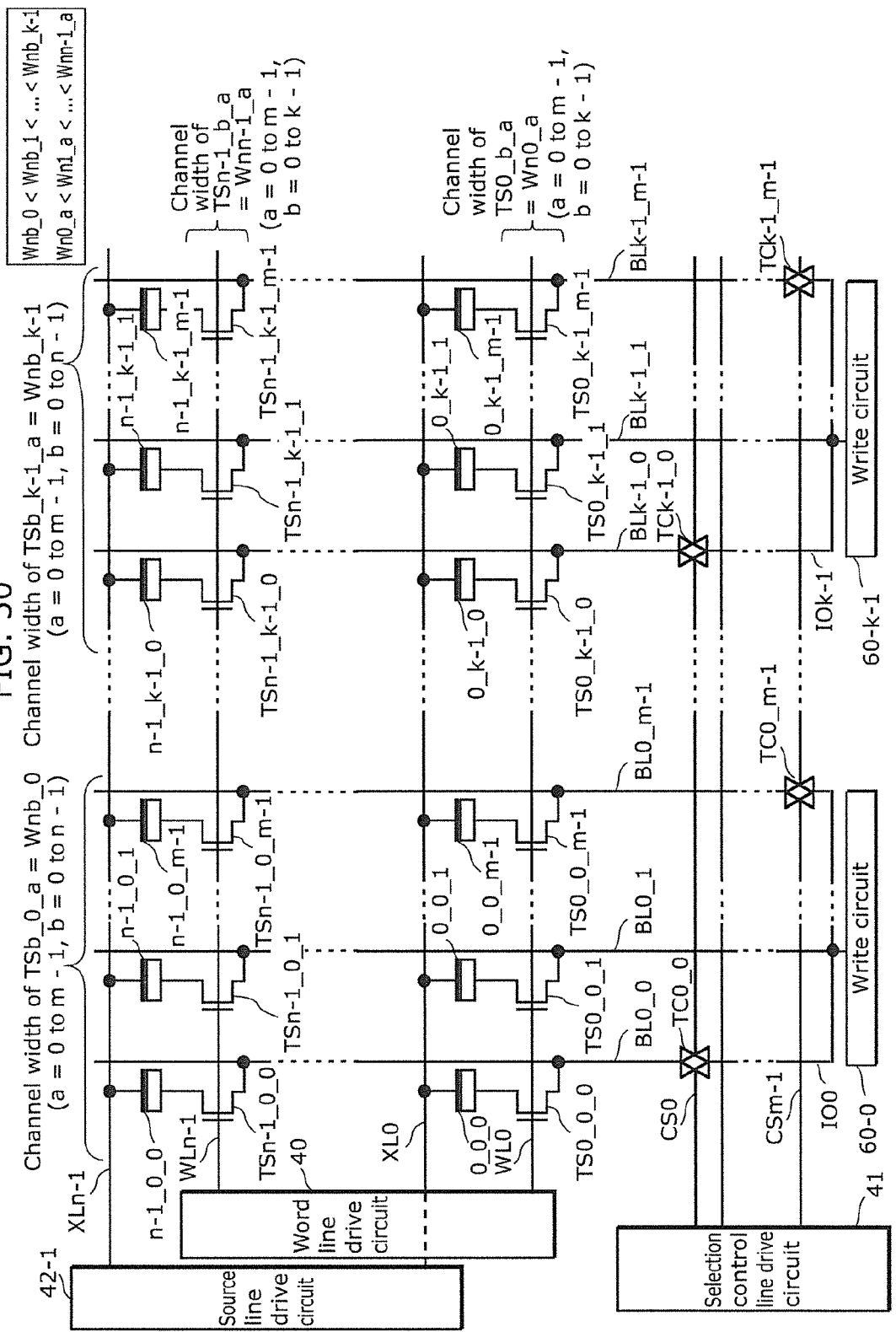
FIG. 50 is a block diagram of a 1T1R memory cell array according to Embodiment 7 of the present invention.

FIG. 50 shows a circuit configuration of a 1T1R memory cell array as Embodiment 7 of the present invention.

This memory cell array includes an n number of source lines XL0 to XLn−1 that are driven by a source line drive circuit 42-1, an n number of word lines WL0 to WLn−1 that are driven by a word line drive circuit 40, and a k×m number of bit lines BL0_0 to BLk−1_m−1 that cross the word lines and the source lines in a contactless manner. The memory cell array is divided into a k number of blocks in a word line direction.

The word lines WL0 to WLn−1 each are connected to a corresponding one of gate terminals of NMOS transistors TS0_0_0 to TSn−1_k−1_m−1 as selection elements. The bit lines BL0_0 to BLk−1_m−1 each are selectively connected to a corresponding one of lower electrodes of variable resistance elements 0_0_0 to n−1_k−1_m−1 through the NMOS transistors. Upper electrodes of the variable resistance elements are connected to the source lines XL0 to XLn−1.

Moreover, the m bit lines BL0_0 to BLk−1_m−1 each are selectively connected to a corresponding one of data lines IO0 to IOk−1 through the transfer gates TC0_0 to TCk−1_m−1 as the second selection elements shown in FIG. 21B. A k number of write circuits 60-0 to 60-k−1 each corresponding to a different one of the k memory cell array blocks (memory cell arrays) provide respective memory cells with a voltage necessary for resistance change through the data lines IO0 to IOk−1. With such a configuration, in the multi-bit simultaneous writing, the word line drive circuit 40 drives the word lines WL0 to WLn−1 as well as a selection control line drive circuit 41 outputs main bit line selection control signals CS0 to CSm−1 to activate, for each of the k memory cell array blocks, one memory cell and one bit line, thereby simultaneously writing k bits. It is to be noted that memory cells on which simultaneous writing is performed include memory cells for data storage and memory cells not for data storage that are on the same word line.

Here, as an exemplary equivalent circuit of the memory cell array, k=9 (the number of blocks is 9), a selected word line is the word line WL0 or WL7, a selected source line is the source line XL0 or XL7, and nine selected memory cells (nine memory cells each belonging to a corresponding one of nine blocks) arranged evenly on the selected source line are a circuit model in which the nine selected memory cells are gathered for every two memory cells according to a wiring resistance of the source line. The source line is driven from the left end of the memory cell array.

Here, ratios of channel widths Wn0_0 to Wn7_9 of respective NMOS transistors S0_0_0 to TS7_8_0 as first selection elements are defined as follows.

Wnb_0<Wnb_1< . . . <Wnb_8 and Wn0_a<Wn1_a< . . . <Wn7_a (where a=0 to 8, b=0 to 7)

This embodiment has a feature of discretely modulating the channel widths of the NMOS transistors TS0_0_0 to TSn−1_k−1_m−1 in the respective memory cell array blocks depending on distances from the write circuits 60-0 to 60-k−1, in addition to the feature of Embodiment 5.

As described above, in the variable resistance nonvolatile memory device in this embodiment, (1) bit lines include: a first bit line included in a first memory cell array and connected to a first write circuit; and a second bit line included in a second memory cell array and connected to a second write circuit, and (2) memory cells include: memory cells that are connected to the first bit line and grouped together as the first memory cell array and a third memory cell array; and memory cells that are connected to the second bit line and grouped together as the second memory cell array and a fourth memory cell array.

Here, (3) the first memory cell array and the third memory cell array are placed closer to a first source line drive circuit (the source line drive circuit 42-1) than the second memory cell array and the fourth memory cell array are, (4) the first memory cell array is placed closer to the first write circuit than the third memory cell array is, and the second memory cell array is placed closer to the second write circuit than the fourth memory cell array is, (5) a first ON resistance and a third ON resistance are greater than a second ON resistance and a fourth ON resistance, respectively, the first ON resistance being a resistance value when a first selection element that is a selection element included in the first memory cell array is ON, the second ON resistance being a resistance value when a second selection element that is a selection element included in the second memory cell array is ON, the third ON resistance being a resistance value when a third selection element that is a selection element included in the third memory cell array is ON, and the fourth ON resistance being a resistance value when a fourth selection element that is a selection element included in the fourth memory cell array is ON, and (6) the first ON resistance and the second ON resistance are greater than the third ON resistance and the fourth ON resistance, respectively.

Here, characteristic points are as follows: (1) the ON resistance of the first selection element close to the first write circuit is greater than that of the third selection element far from the first write circuit, and (2) the ON resistance of the second selection element close to the second write circuit is greater than that of the fourth selection element far from the second write circuit, in addition to the characteristic points of Embodiment 5. Stated differently, voltage drops caused by the wiring resistances of the bit lines are compensated.

[Equivalent Circuit Regarding Low Resistance Writing]

Figure 51A:
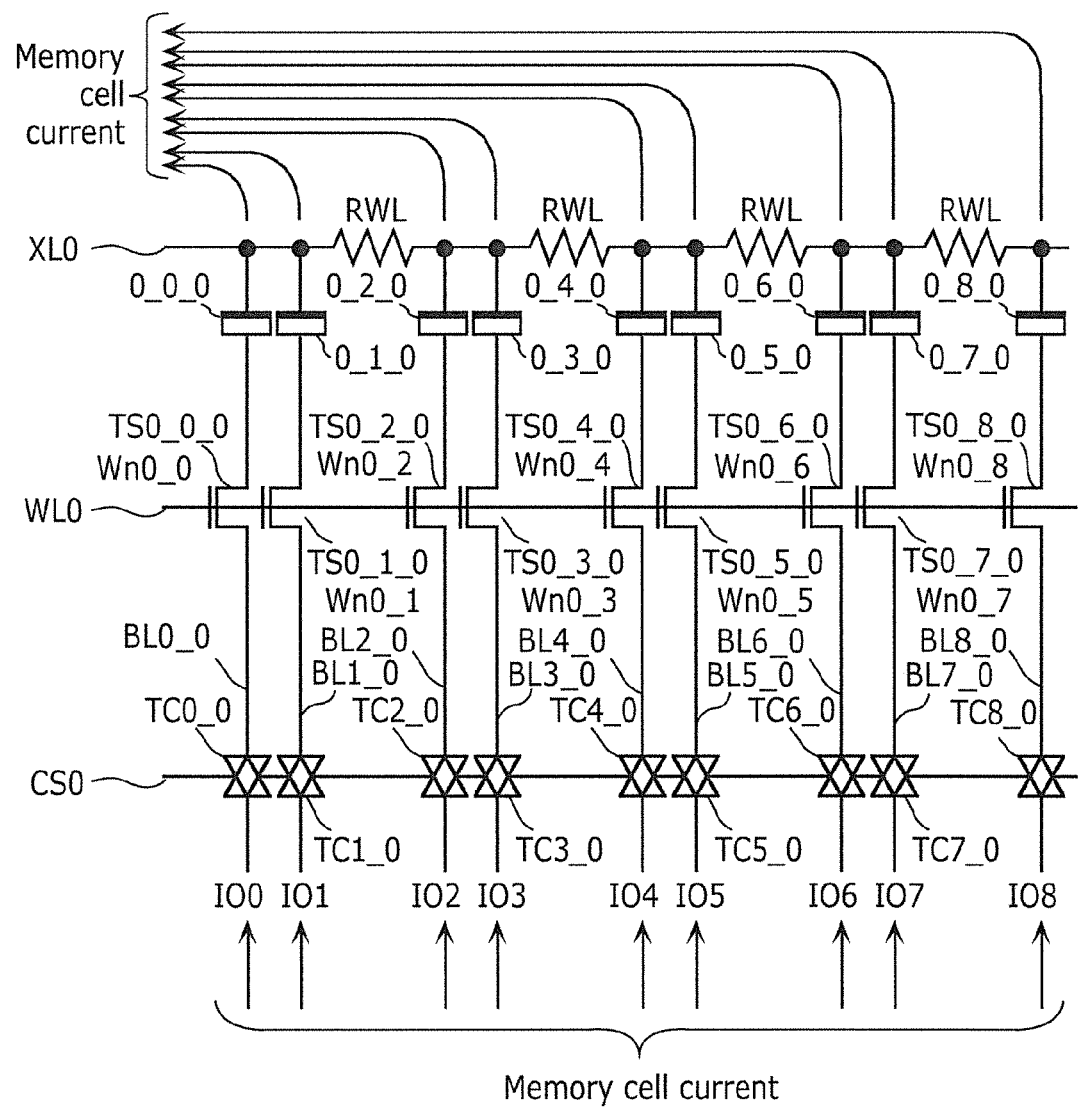
FIG. 51A is an equivalent circuit diagram of a memory cell array located at a near end with respect to a write circuit, in a 1T1R memory cell array according to Embodiment 7 of the present invention.
Figure 51B:
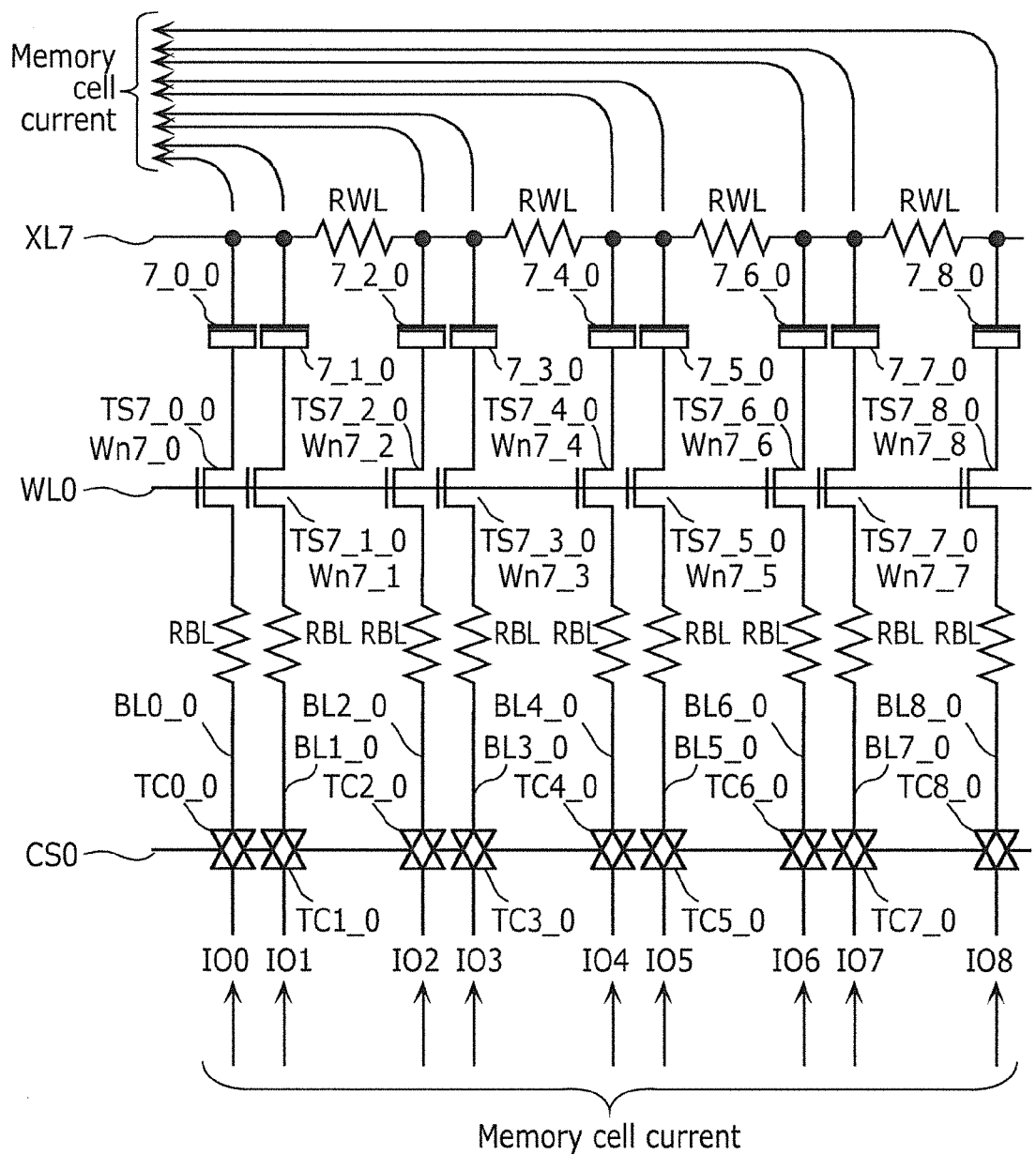
FIG. 51B is an equivalent circuit diagram of a memory cell array located at a far end with respect to a write circuit, in a 1T1R memory cell array according to Embodiment 7 of the present invention.

FIG. 51A shows an equivalent circuit at a time of low resistance writing regarding variable resistance elements 0_0_0 to 0_8_0 closest to the write circuits 60-0 to 60-k−1 in the memory cell array shown in FIG. 50. FIG. 51B shows an equivalent circuit at a time of low resistance writing regarding variable resistance elements 7_0_0 to 7_8_0 farthest from the write circuits 60-0 to 60-k−1.

In the both circuits, at the time of the low resistance writing, a voltage VL is applied to the data lines IO0 to IO8, and 0 V is applied to the selected source line XL0 or XL7. Currents that flow through variable resistance elements flow into the nine selected memory cells through the transfer gates TC0_0 to TC8_0 and the NMOS transistors TS0_0_0 to TS0_8_0 or TS7_0_0 to TS7_8_0, converge in the one source line XL0 or XL7, and flow into the source line drive circuits at the both ends along with voltage drops caused by wiring resistances.

At this time, a wiring resistance of the source line to the source line drive circuit 42-1 is high in the memory cell 0_8_0 or 7_8_0 near the right end of the source line far from the source line drive circuit 42-1, and an increase of a potential from 0 V becomes greatest since the voltage drops due to currents flowing through other memory cells are accumulated.

Simultaneously, wiring resistances RBL of the bit lines BL0_0 to BL8_0 to the transfer gates TC0_0 to TC8_0 are high in the variable resistance elements 7_0_0 to 7_8_0 selectively connected near the upper end of the bit line farthest from the write circuits 60-0 to 60-8, and a decrease of a potential from the data line applied voltage VL is greatest.

In view of the above, to compensate the increase of the potential in the source line and the decrease of the potential in the data line (the bit line), the channel widths Wn0_0 to Wn7_8 of the respective NMOS transistors TS0_0_0 to TS7_8_0 as the first selection elements are discretely determined to be smaller for blocks closer to the left end of the memory cell array near the source line drive circuit, that is, to be larger for blocks closer to the right end of the memory cell array. In addition, the channel widths Wn0_0 to Wn7_8 are discretely determined to be smaller for variable resistance elements closer to the bottom end of the memory cell array near the write circuits 60-0 to 60-k−1, that is, to be larger for variable resistance elements closer to the upper end of the memory cell array. The current drive capabilities of the NMOS transistors at the respective positions are proportional to the determined ratios of the channel widths.

[Operating Points at Time of Low Resistance Writing]

The equivalent circuits of the memory cell arrays in Embodiment 7 of the present invention shown in FIG. 51A and FIG. 51B function to reduce the voltage VL applied to the data lines IO0 to IO8 by a total sum of a voltage in the voltage drop caused by the wiring resistance of the source line shown in the equivalent circuit diagram of the memory cell array in Embodiment 5 shown in FIG. 48, and a voltage in the voltage drop caused by the wiring resistances of the bit lines.

For this reason, in this embodiment, an I-V characteristic R1 of the variable resistance element 0_0_0 near the source line drive circuit 42-1 and the write circuits 60-0 to 60-k−1 is shifted to the left by the total sum of the voltages at the operating point in Embodiment 5 shown in FIG. 48, to be the I-V characteristic R2.

Here, the ratios of the channel widths Wn0_0 to Wn7_8 of the respective NMOS transistors TS0_0_0 to TS7_8_0 are determined so that the channel widths each become a channel width corresponding to a slope of an I-V characteristic TSL2 that crosses the I-V characteristic R2 at point A2 having the same current value as point A1 where the I-V characteristic TSL1 of the selection element and an I-V characteristic R1 intersect.

In this manner, Embodiment 7 of the present invention makes possible the adjustment of the ON resistances of the first selection elements for compensating the voltage drop caused by the wiring resistances of the bit lines, and makes it possible to more accurately reduce the variation in resistance state of the memory cells that is caused by the wiring resistances of the source line and the bit lines and depends on their positions in the memory cell array.

It is to be noted that although the memory cell configuration in which the variable resistance elements connected in series are connected to the source line, and the NMOS transistors are connected to the bit line in Embodiments 5 to 7, the present invention is also effective for a memory cell configuration in which variable resistance elements are connected to a bit line, and NMOS transistors are connected to a source line.

It is to be noted that the same effect can be expected by adjusting only the channel lengths or both the channel widths and the channel lengths other than the channel widths as described when the current drive capabilities of the NMOS transistors and the PMOS transistors that are the selection elements are discretely set to the predetermined ratios in all the above-described embodiments.

Although the variable resistance nonvolatile memory device in the present invention, the method for calculating an ON resistance of a selection circuit thereof, and the method for writing thereby have thus far been described based on Embodiments 1 to 7, the present invention is not limited to these embodiments. Those skilled in the art will readily appreciate that various modifications may be made in each of the embodiments may be realized by arbitrarily combining the structural elements and characteristic parts of the embodiment without materially departing from the novel teachings and advantages of the present invention. Accordingly, all such modifications are included within the scope of the present invention.

For example, although the variable resistance element is used as a memory element included in a memory cell in the embodiments, the present invention can be applied to a variable resistance nonvolatile memory device having a memory cell including a variable resistance memory element of any kind. Here, examples of a representative variable resistance memory element include MRAM (Magnetic Random Access Memory), PRAM (Phase Change Random Access Memory), ReRAM (Resistive Random Access Memory), SPRAM (Spin Transfer Torque Random Access Memory), and CBRAM (Conductive Bridge Random Access Memory).

Moreover, although the variable resistance nonvolatile memory device in the embodiments has the function to simultaneously write the k bits, the variable resistance nonvolatile memory device in the present invention does not always need to simultaneously write the k bits, and may simultaneously write the number of bits (e.g., one bit) less than k.

INDUSTRIAL APPLICABILITY

The present invention is useful as a cross point or 1T1R variable resistance nonvolatile memory device, and especially as a nonvolatile memory device that (i) reduces a variation in memory cell current at a time of low resistance writing between selected memory cells on which simultaneous writing is performed, in a circuit that simultaneously writes, during a write operation, into selected memory cells connected to one selected word line or a source line, (ii) achieves the stabilization of a low resistance state characteristic with a circuit that is simpler and has a small area, a layout configuration, and simple processing, and (iii) has low costs and a stable memory cell write characteristic.

REFERENCE SIGNS LIST

1 Cross point memory cell array
10 Variable resistance element
11 Upper electrode (Third electrode)
12 Second variable resistance layer
13 First variable resistance layer
14 Lower electrode
15 Selection transistor
16-1, 16-2, 16-3, 16-4 NMOS transistor
17-1, 17-2 PMOS transistor
18 Logic inverter gate
20 Current steering element
21 Upper electrode (Second electrode)
22 Current steering layer
23 Lower electrode (First electrode)
31 to 33, 36, 37 Via
34, 35 Contact
40, 40-1, 40-2 Word line drive circuit
41 Selection control line drive circuit
42-1, 42-2 Source line drive circuit
51 Cross point memory cell
52, 52a, 52b Word line
53, 53a, 53b, 53c Bit line
55 1T1R memory cell
60-0 to 60-k−1 Write circuit
70 Upper wire (word line or source line)
71 Lower wire (bit line)
71a Upper-layer wire (bit line)
73 Lower wire
74, 75 Wire layer
76 Polysilicon wire (word line)
M0_0 to Mj−1_k−1 Memory cell array blocks
S0_0 to Sj−1_k−1 Selection circuits
0_0_0_0 to j−1_n−1_k−1_m−1 Memory cells of cross point memory cell array
0_0_0 to n−1_k−1_m−1 Variable resistance elements of 1T1R memory cell array
TS0_0_0 to TSj−1_k−1_m−1, TS0_0_0 to TSn−1_k−1_m−1 First selection elements (NMOS transistors)

TC0_0 to TCk−1_m−1 Second selection elements (transfer gates)
BL0_0_0 to BLj−1_k−1_m−1 Sub bit lines
GBL0_0 to GBLk−1_m−1 Main bit lines
WL0_0 to WLj−1_n−1 Word lines
SL0 to SLj−1, SL0_0 to SLj−1_0, SL0_1 to SLj−1_1 Sub bit line selection control lines (sub bit line selection control signals)
XL0 to XLn−1 Source line
CS0 to CSm−1 Main bit line selection control lines (main bit line selection control signals)
IO0 to IOk−1 Data lines
Wn, Wn0 to Wnk−1 Channel widths of NMOS selection elements
Wp, Wp0 to Wpk−1 Channel widths of PMOS selection elements

The invention claimed is:

1. A variable resistance nonvolatile memory device comprising:
a plurality of bit lines;
a plurality of word lines that cross the bit lines;
a plurality of memory cells at cross points of the bit lines and the word lines, the memory cells each including at least a variable resistance element and reversibly changing at least between a first resistance state and a second resistance state;
a first write circuit that applies a write voltage to a first bit line that is at least one of the bit lines, where, among the memory cells, memory cells connected to the first bit line are grouped together as a first memory cell array;
a second write circuit that applies a write voltage to a second bit line that is at least one of the bit lines and is different from the first bit line, where, among the memory cells, memory cells connected to the second bit line are grouped together as a second memory cell array;
a first selection circuit that connects or disconnects at least one of the first write circuit and the first bit line;
a second selection circuit that connects or disconnects at least one of the second write circuit and the second bit line; and
a first word line drive circuit that selectively drives the word lines,
wherein the memory cells include a memory cell for data storage and a memory cell not for data storage,
the first write circuit and the second write circuit simultaneously apply the write voltage to the first bit line and the second bit line, respectively,
memory cells to which the first write circuit and the second write circuit simultaneously write include the memory cell for data storage and the memory cell not for data storage that are on a same word line,
the first memory cell array is placed closer to the first word line drive circuit than the second memory cell array is, and
a first ON resistance is greater than a second ON resistance, the first ON resistance being a resistance value of the first selection circuit when the first selection circuit connects the first write circuit and the first bit line, and the second ON resistance being a resistance value of the second selection circuit when the second selection circuit connects the second write circuit and the second bit line.

2. The variable resistance nonvolatile memory device according to claim 1,
wherein resistance values of the memory cells in the first resistance state are less than resistance values of the memory cells in the second resistance state, and
where a maximum current that flows through a first memory cell in the first memory cell array when the first memory cell changes from the second resistance state to the first resistance state has a first low resistance switching current, and a maximum current that flows through a second memory cell in the second memory cell array when the second memory cell changes from the second resistance state to the first resistance state has a second low resistance switching current, the first ON resistance is set to be greater than the second ON resistance to cause the first low resistance switching current to be approximately equal to the second low resistance switching current.

3. The variable resistance nonvolatile memory device according to claim 2,
wherein the first selection circuit and the second selection circuit each include an NMOS transistor or a PMOS transistor,
a first current direction is opposite to a second current direction, the first current direction being a direction of a current that flows through the first selection circuit and the second selection circuit when the memory cells change from the second resistance state to the first resistance state, and the second current direction being a direction of a current that flows through the first selection circuit and the second selection circuit when the memory cells change from the first resistance state to the second resistance state, and
the first selection circuit and the second selection circuit each are connected to corresponding ones of the memory cells in a positional relationship that enhances a body bias effect more in the first current direction than in the second current direction.

4. The variable resistance nonvolatile memory device according to claim 1,
wherein a channel width of a transistor included in the first selection circuit is smaller than a channel width of a transistor included in the second selection circuit.

5. The variable resistance nonvolatile memory device according to claim 1,
wherein the first bit line and the second bit line are provided in a same layer,
the bit lines include a third bit line and a fourth bit line each of which is at least a different one of the bit lines and provided in a layer different from the layer in which the first bit line and the second bit line are provided,
the memory cells include: memory cells that are connected to the third bit line and grouped together as a third memory cell array; and memory cells that are connected to the fourth bit line and grouped as a fourth memory cell array,
the variable resistance nonvolatile memory device further comprises:
a third selection circuit that connects at least one of the first write circuit and the third bit line; and
a fourth selection circuit that connects at least one of the second write circuit and the fourth bit line,
the memory cells are connected to the word lines and the bit lines in the first memory cell array and the second memory cell array to cause the memory cells to change to a higher resistance state when currents flow from the word lines to the bit lines through the memory cells, and the memory cells are connected to the word lines and the bit lines in the third memory cell array and the fourth memory cell array to cause the memory cells to change to a higher resistance state when currents flow from the bit lines to the word lines through the memory cells, the first selection circuit and the second selection circuit each include an NMOS transistor, and the third selection circuit and the fourth selection circuit each include a PMOS transistor, the third memory cell array is placed closer to the first word line drive circuit than the fourth memory cell array is, and a third ON resistance is greater than a fourth ON resistance, the third ON resistance being a resistance value of the third selection circuit when the third selection circuit connects the first write circuit and the third bit line, and the fourth ON resistance being a resistance value of the fourth selection circuit when the fourth selection circuit connects the second write circuit and the fourth bit line.

6. The variable resistance nonvolatile memory device according to claim 1, wherein the bit lines include a third bit line and a fourth bit line each of which is at least a different one of the bit lines, the memory cells include: memory cells that are connected to the third bit line and grouped together as a third memory cell array; and memory cells that are connected to the fourth bit line and grouped as a fourth memory cell array, the variable resistance nonvolatile memory device further comprises:

a third selection circuit that connects at least one of the first write circuit and the third bit line; and a fourth selection circuit that connects at least one of the second write circuit and the fourth bit line, the third memory cell array is placed closer to the first word line drive circuit than the fourth memory cell array is, the first memory cell array is placed closer to the first write circuit than the third memory cell array is, the second memory cell array is placed closer to the second write circuit than the fourth memory cell array is, a third ON resistance is greater than a fourth ON resistance, the third ON resistance being a resistance value of the third selection circuit when the third selection circuit connects the first write circuit and the third bit line, and the fourth ON resistance being a resistance value of the fourth selection circuit when the fourth selection circuit connects the second write circuit and the fourth bit line, the third ON resistance is less than the first ON resistance, and the fourth ON resistance is less than the second ON resistance.

7. The variable resistance nonvolatile memory device according to claim 1, further comprising:

a third write circuit that applies a write voltage to a third bit line that is at least one of the bit lines, where, among the memory cells, memory cells connected to the third bit line are grouped together as a third memory cell array;

a fourth write circuit that applies a write voltage to a fourth bit line that is at least one of the bit lines, where, among the memory cells, memory cells connected to the fourth bit line are grouped together as a fourth memory cell array;

a third selection circuit that connects or disconnects at least one of the third write circuit and the third bit line;

a fourth selection circuit that connects or disconnects at least one of the fourth write circuit and the fourth bit line; and a second word line drive circuit that selectively drives the word lines, the first memory cell array, the second memory cell array, the fourth memory cell array, and the third memory cell array are placed in this order in a direction from the first word line drive circuit toward the second word line drive circuit, and a third ON resistance is greater than a fourth ON resistance, the third ON resistance being a resistance value of the third selection circuit when the third selection circuit connects the third write circuit and the third bit line, and the fourth ON resistance being a resistance value of the fourth selection circuit when the fourth selection circuit connects the fourth write circuit and the fourth bit line.

8. The variable resistance nonvolatile memory device according to claim 1, wherein the first selection circuit and the second selection circuit each include:

a bit line selection switch element that applies a write voltage to a corresponding bit line; and a current steering element that is connected in series with the bit line selection switch element and in which an N-type current steering element including an NMOS transistor and a P-type current steering element including a PMOS transistor are connected in parallel, one of the N-type current steering element and the P-type current steering element is selectively turned ON when the other of the N-type current steering element and the P-type current steering element is turned OFF, and an ON resistance of one of the N-type current steering element and the P-type current steering element included in the first selection circuit is greater than an ON resistance of one of the N-type current steering element and the P-type current steering element included in the second selection circuit, the ones of the N-type current steering elements and the P-type current steering elements being ON.

9. The variable resistance nonvolatile memory device according to claim 1, wherein the memory cells each include the variable resistance element and a current steering element that are connected in series, the current steering element having nonlinear current-voltage characteristics.

10. A method for calculating an ON resistance of a selection circuit in a variable resistance nonvolatile memory device, the method comprising, where, in the variable resistance nonvolatile memory device having a k number of memory cell arrays commonly connected to a plurality of word lines and placed in order from a word line drive circuit, a wiring resistance of each of word lines in respective (k−1) blocks obtained by dividing the word lines by the k memory cell arrays is RWL, an ON resistance of a first selection circuit is R(1), and a current that flows through the selected memory cell has a first low resistance switching current IO, the first selection circuit connecting a write circuit and a selected memory cell that is a memory cell selected in a first memory cell array closest to the word line drive circuit, and the current flowing when the selected memory cell changes from a second resistance state to a first resistance state in which the selected memory cell has a resistance value less than a resistance value of the selected memory cell in the second resistance state, setting ON resistances of first to k-th selection circuits and causing first to k-th low resistance switching currents to be approximately equal to each other, by calculating, as a sum of voltage drops in the word lines in the respective blocks, a voltage drop VW(h) in the word lines between the word line drive circuit and an h-th (1≤h≤k) memory cell array, using at least a product of IO and RWL and a variable h, and by calculating an ON resistance R(h) of an h-th selection circuit that connects the write circuit and a memory cell selected in the h-th memory cell array, using at least IO, R(1), and VW(h), the first to k-th selection circuits respectively corresponding to first to k-th memory cell arrays, and the first to k-th low resistance switching currents respectively corresponding to the first to k-th memory cell arrays.

11. The method for calculating an ON resistance of a selection circuit in a variable resistance nonvolatile memory device according to claim 10, wherein k is 5, and ratios of reciprocal numbers of the ON resistances of the first to fifth selection circuits each are determined to be within a range of ±0.04 centering on a corresponding one of 0.81, 0.88, 0.94, 0.98, and 1.00.

12. A method for writing for the variable resistance nonvolatile memory device according to claim 1, the method comprising:

selectively driving, by the first word line drive circuit, the word lines; and simultaneously writing, by the first write circuit and the second write circuit, to the first memory cell included in the first memory cell array and the second memory cell included in the second memory cell array, by simultaneously applying, by the first write circuit and the second write circuit, a write voltage to the first bit line and the second bit line, respectively.

13. A variable resistance nonvolatile memory device comprising:

a plurality of bit lines;

a plurality of word lines and a plurality of source lines that cross the bit lines;

a plurality of memory cells at cross points of the bit lines and the source lines, the memory cells each including a variable resistance element and a selection element whose ON-OFF control is performed by each of the word lines, and reversibly changing at least between a first resistance state and a second resistance state;

a first write circuit that applies a write voltage to a first bit line that is at least one of the bit lines, where, among the memory cells, memory cells connected to the first bit line are grouped together as a first memory cell array;

a second write circuit that applies a write voltage to a second bit line that is at least one of the bit lines and is different from the first bit line, where, among the memory cells, memory cells connected to the second bit line are grouped together as a second memory cell array;

a first selection circuit that connects or disconnects at least one of the first write circuit and the first bit line;

a second selection circuit that connects or disconnects at least one of the second write circuit and the second bit line;

a first source line drive circuit that drives the source lines; and a word line drive circuit that selectively drives the word lines, wherein the memory cells include a memory cell for data storage and a memory cell not for data storage, the first write circuit and the second write circuit simultaneously apply the write voltage to the first bit line and the second bit line, respectively, memory cells to which the first write circuit and the second write circuit simultaneously write include the memory cell for data storage and the memory cell not for data storage that are on a same word line, the first memory cell array is placed closer to the first source line drive circuit than the second memory cell array is, and a first ON resistance is greater than a second ON resistance, the first ON resistance being a resistance value when a first selection element that is the selection element included in the first memory cell array is ON, and the second ON resistance being a resistance value when a second selection element that is the selection element included in the second memory cell array is ON.

14. The variable resistance nonvolatile memory device according to claim 13, further comprising:

a third write circuit that applies a write voltage to a third bit line that is at least one of the bit lines, where, among the memory cells, memory cells connected to the third bit line are grouped together as a third memory cell array;

a fourth write circuit that applies a write voltage to a fourth bit line that is at least one of the bit lines, where, among the memory cells, memory cells connected to the fourth bit line are grouped together as a fourth memory cell array;

a third selection circuit that connects or disconnects at least one of the third write circuit and the third bit line;

a fourth selection circuit that connects or disconnects at least one of the fourth write circuit and the fourth bit line; and a second source line drive circuit that drives the source lines, the first memory cell array, the second memory cell array, the fourth memory cell array, and the third memory cell array are placed in this order in a direction from the first source line drive circuit toward the second source line drive circuit, and a third ON resistance is greater than a fourth ON resistance, the third ON resistance being a resistance value when a third selection element that is the selection element included in the third memory cell array is ON, and the fourth ON resistance being a resistance value when a fourth selection element that is the selection element included in the fourth memory cell array is ON.

15. The variable resistance nonvolatile memory device according to claim 13, wherein the memory cells include: memory cells that are connected to the first bit line and grouped together as a third memory cell array; and memory cells that are connected to the second bit line, connected to the source lines and the word lines in common with the third memory cell array, and grouped as a fourth memory cell array, and in the variable resistance nonvolatile memory device:

the third memory cell array is placed closer to the first source line drive circuit than the fourth memory cell array is;

the first memory cell array is placed closer to the first write circuit than the third memory cell array is;

the second memory cell array is placed closer to the second write circuit than the fourth memory cell array is;

a third ON resistance is greater than a fourth ON resistance, the third ON resistance being a resistance value when a third selection element that is the selection element included in the third memory cell array is ON, and the fourth ON resistance being a resistance value when a fourth selection element that is the selection element included in the fourth memory cell array is ON;

the first ON resistance is greater than the third ON resistance; and the second ON resistance is greater than the fourth ON resistance.

16. A method for writing for the variable resistance non-volatile memory device according to claim 13, the method comprising:

selectively driving, by the first source line drive circuit, the source lines;

selectively driving, by the word line drive circuit, among the word lines, word lines corresponding to the source lines driven in the selectively driving of the source lines; and simultaneously writing, by the first write circuit and the second write circuit, to the first memory cell included in the first memory cell array and the second memory cell included in the second memory cell array, by simultaneously applying, by the first write circuit and the second write circuit, a write voltage to the first bit line and the second bit line, respectively.

* * * * *